US012269977B2

(12) United States Patent
Banin et al.

(10) Patent No.: US 12,269,977 B2
(45) Date of Patent: Apr. 8, 2025

(54) COLLOIDAL SEMICONDUCTOR NANOSTRUCTURES

(71) Applicant: YISSUM RESEARCH DEVELOPMENT COMPANY OF THE HEBREW UNIVERSITY OF JERUSALEM LTD, Jerusalem (IL)

(72) Inventors: Uri Banin, Mevasseret Zion (IL); Jiabin Cui, Jerusalem (IL); Yossi Panfil, Jerusalem (IL); Nir Waiskopf, Jerusalem (IL); Meirav Oded, Rehovot (IL)

(73) Assignee: Yissum Research Development Company of the Hebrew University of Jerusalem Ltd. (IL)

( * ) Notice: Subject to any disclaimer, the term of this patent is extended or adjusted under 35 U.S.C. 154(b) by 545 days.

(21) Appl. No.: 17/421,650

(22) PCT Filed: Jan. 14, 2020

(86) PCT No.: PCT/IL2020/050055
§ 371 (c)(1),
(2) Date: Jul. 8, 2021

(87) PCT Pub. No.: WO2020/148753
PCT Pub. Date: Jul. 23, 2020

(65) Prior Publication Data
US 2022/0089940 A1    Mar. 24, 2022

Related U.S. Application Data

(60) Provisional application No. 62/793,415, filed on Jan. 17, 2019.

(51) Int. Cl.
C09K 11/02    (2006.01)
B82Y 20/00    (2011.01)
(Continued)

(52) U.S. Cl.
CPC .......... *C09K 11/025* (2013.01); *C09K 11/08* (2013.01); *C09K 11/0811* (2013.01);
(Continued)

(58) Field of Classification Search
None
See application file for complete search history.

(56) References Cited

U.S. PATENT DOCUMENTS 7,767,260 B2    8/2010 Peng et al.
9,040,158 B2    5/2015 Sun et al.
(Continued)

FOREIGN PATENT DOCUMENTS

KR    2017018153 A    *    2/2017    ............. C09K 11/02

OTHER PUBLICATIONS

English text machine translation of Choi et al. (KR-2017018153-A), description and claims, accessed online from Espacenet, PDF pp. 1-26. (Year: 2017).*
(Continued)

*Primary Examiner* — Katie L. Hammer
(74) *Attorney, Agent, or Firm* — McAndrews, Held & Malloy, Ltd.

(57) ABSTRACT

The technology subject of the present application concerns a novel class of fused nanocrystal molecules having unique electronic properties. The application further contemplates methods for their preparation and methods of their use.

14 Claims, 29 Drawing Sheets

(51) Int. Cl.

| | | |
|---|---|---|
| | *B82Y 30/00* | (2011.01) |
| | *B82Y 40/00* | (2011.01) |
| | *C09K 11/08* | (2006.01) |
| | *C09K 11/56* | (2006.01) |
| | *C09K 11/62* | (2006.01) |
| | *C09K 11/88* | (2006.01) |
| | *H01B 1/00* | (2006.01) |
| | *H01L 31/0352* | (2006.01) |
| | *H01L 33/50* | (2010.01) |

(52) U.S. Cl.
CPC ............ *C09K 11/565* (2013.01); *C09K 11/62* (2013.01); *C09K 11/88* (2013.01); *C09K 11/883* (2013.01); *H01B 1/00* (2013.01); *B82Y 20/00* (2013.01); *B82Y 30/00* (2013.01); *B82Y 40/00* (2013.01); *H01L 31/035218* (2013.01); *H01L 33/502* (2013.01)

(56) References Cited

U.S. PATENT DOCUMENTS

| | | | |
|---|---|---|---|
| 9,123,638 | B2 | 9/2015 | Shim et al. |
| 9,577,125 | B2 | 2/2017 | Oron et al. |
| 2005/0126628 | A1* | 6/2005 | Scher .................... H01L 29/127 136/263 |
| 2007/0132052 | A1 | 6/2007 | Sargent et al. |
| 2012/0132891 | A1 | 5/2012 | Pease, III et al. |
| 2014/0326949 | A1 | 11/2014 | Xu et al. |
| 2015/0008393 | A1 | 1/2015 | Mangum et al. |

OTHER PUBLICATIONS

Manfred Bayer et al., Coupling and Entangling of Quantum States in Quantum Dot Molecules, Science, 2001, vol. 291, Issue 5503, pp. 451-45; 3 pages.

Uri Banin et al., Heavy-Metal-Free Fluorescent ZnTe/ZnSe Nanodumbbells, ACS Nano, 2017, vol. 11, Issue 7, pp. 7312-7320; 13 pages.

Bihu LV et al., Photon Antibunching in a Cluster of Giant CdSe/Cds Nanocrystals, Nature Communications, Apr. 18, 2018, vol. 9: 1536; 4 pages.

Zvicka Deutsch et al., Luminescence Upconversion in Colloidal Double Quantum Dots, Nature Nanotechnology, Aug. 4, 2013, vol. 8, No. 9, pp. 649 653; 3 pages.

Barbara K. Hughes et al., Synthesis and Spectroscopy of PbSe Fused Quantum-Dot Dimers, Journal of the American Chemical Society, Mar. 12, 2014, vol. 136, No. 12, pp. 4670-4679; 5 pages.

Yongxing Hu et al., A Generic Approach for the Synthesis of Dimer Nanoclusters and Asymmetric Nanoassemblies, Journal of the American Chemical Society, Feb. 13, 2013, vol. 135, No. 6, pp. 2213-2221; 5 pages.

\* cited by examiner

Figure 3A  Figure 3B  Figure 3C
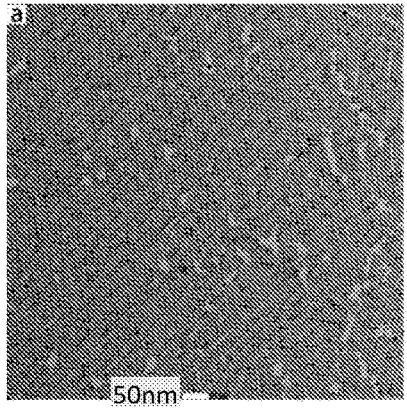 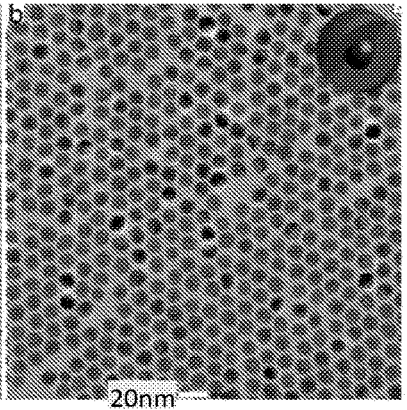 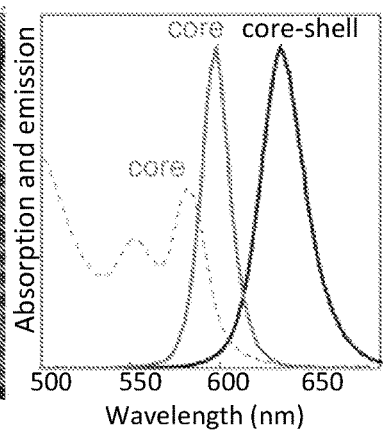
Figure 3D  Figure 3E  Figure 3F
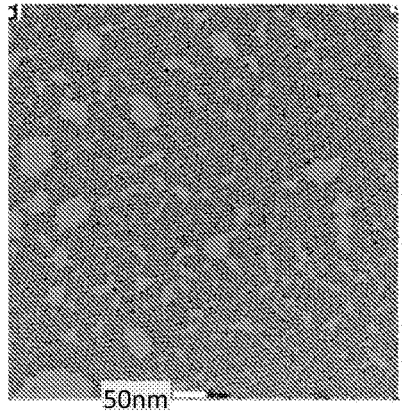 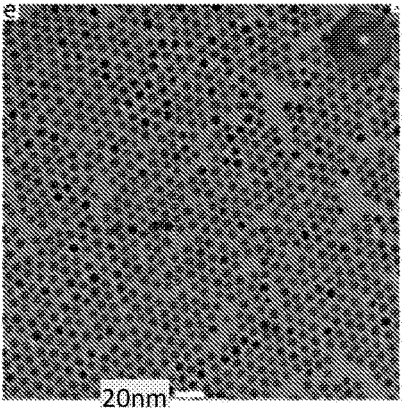 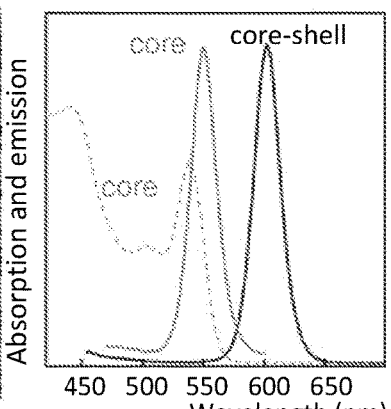
Figure 3G  Figure 3H  Figure 3I
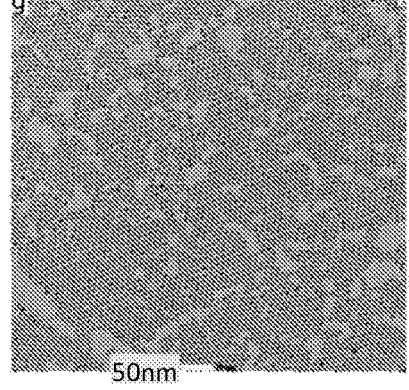 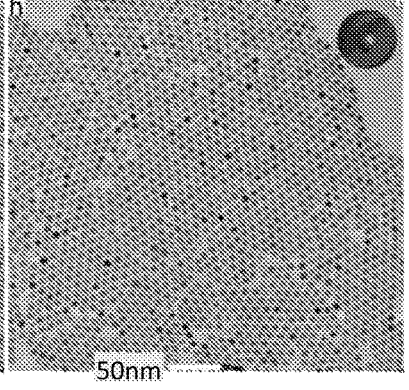 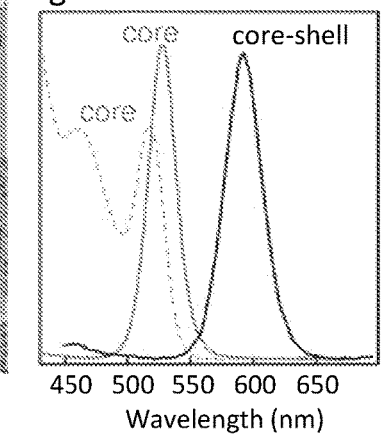

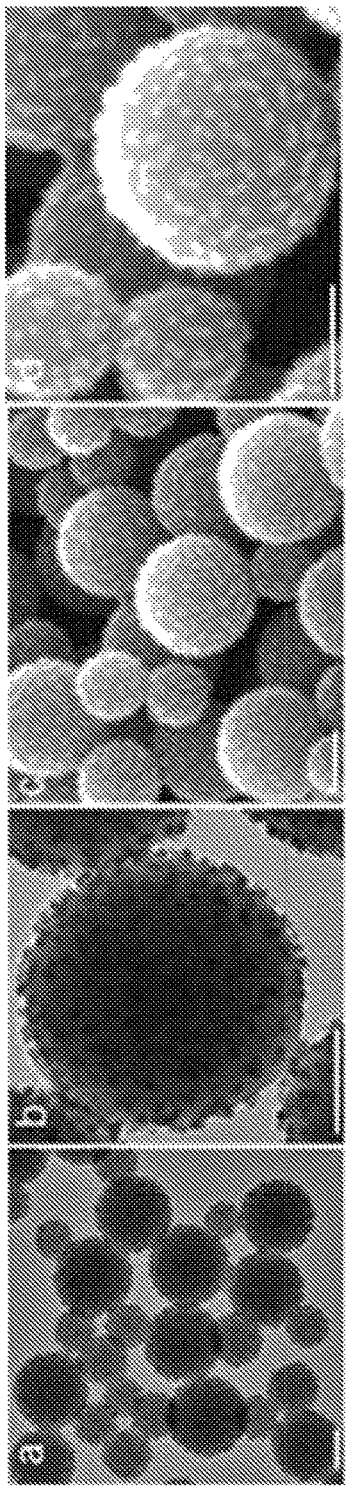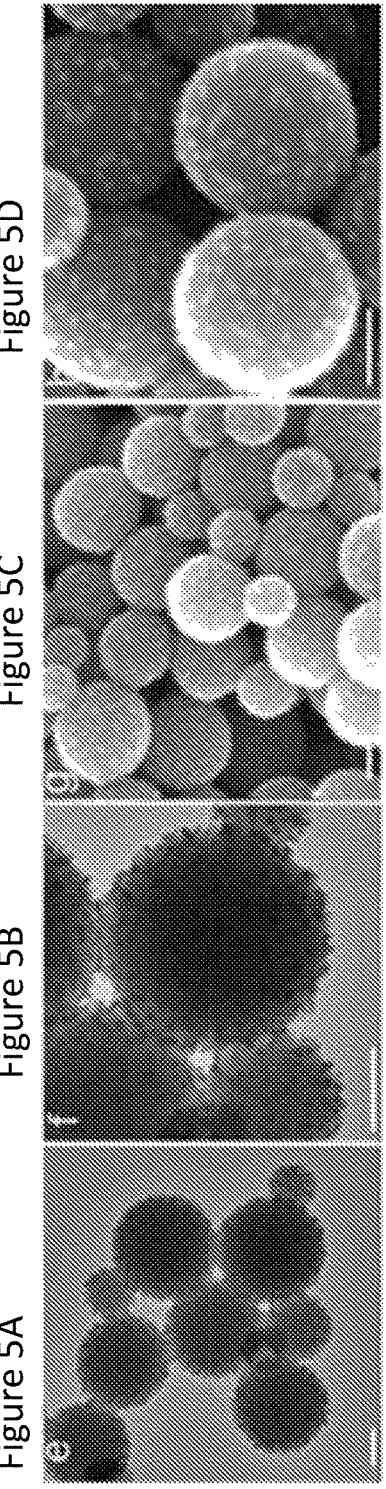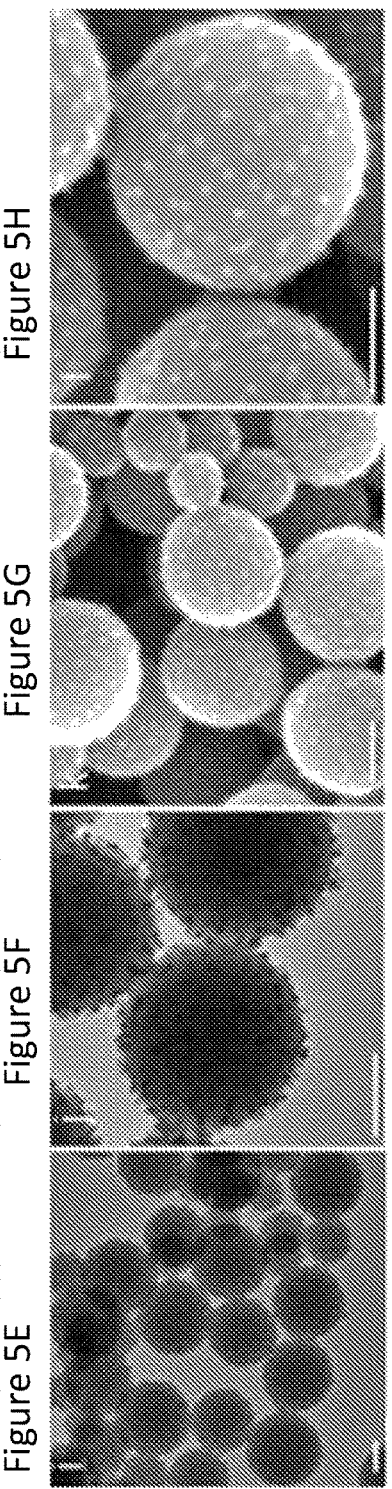

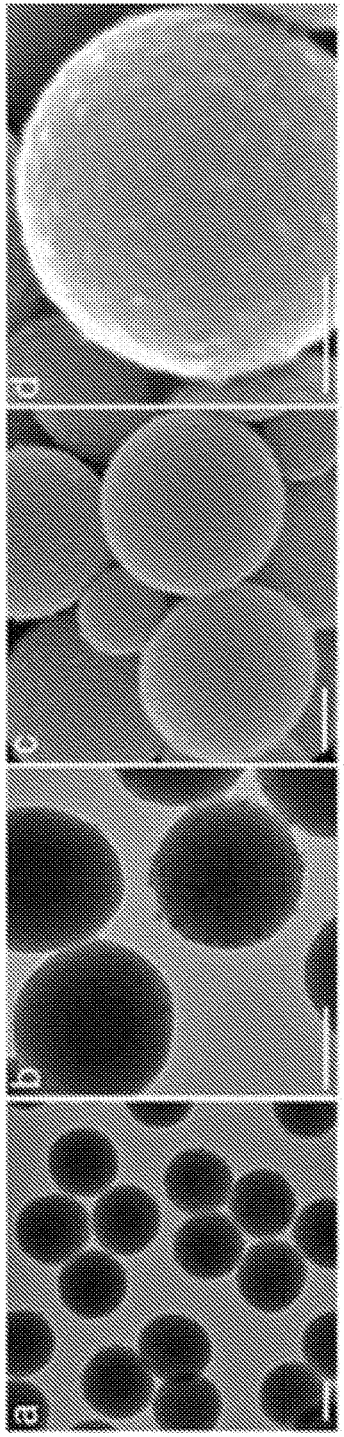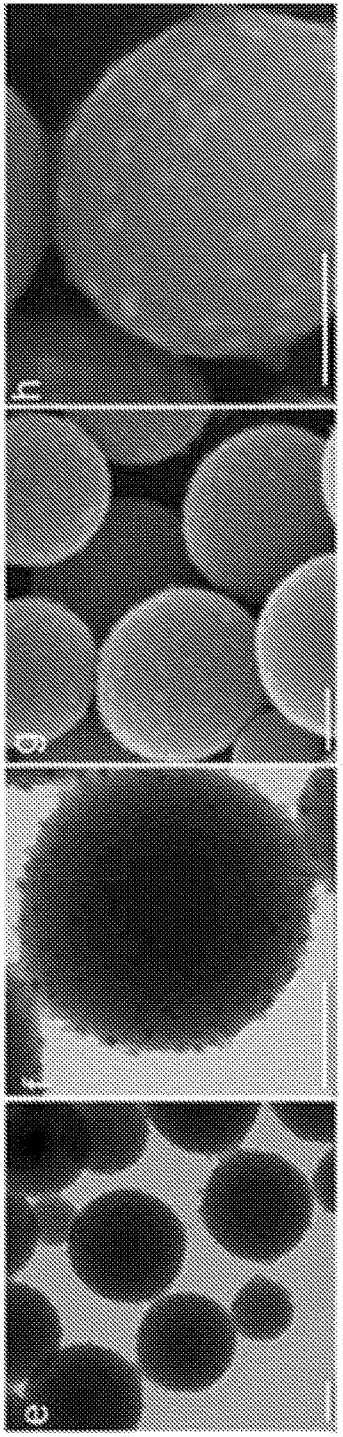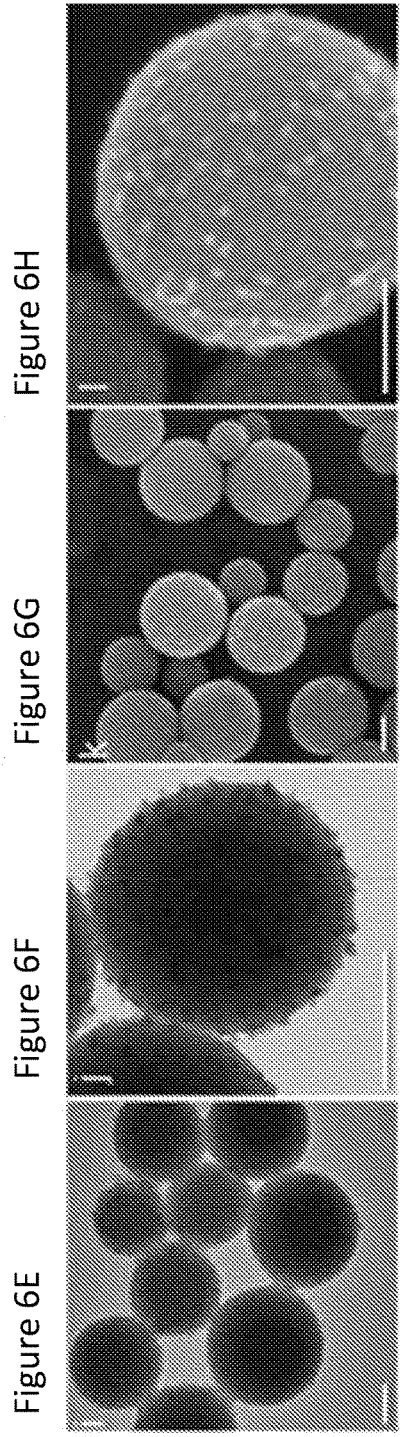

Figure 7A            Figure 7B
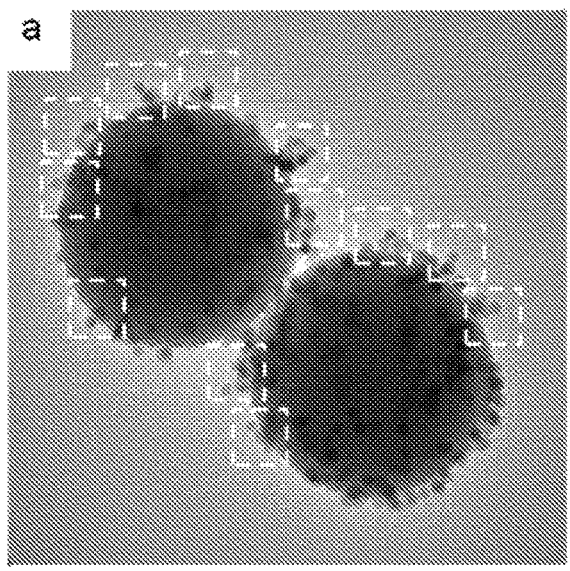
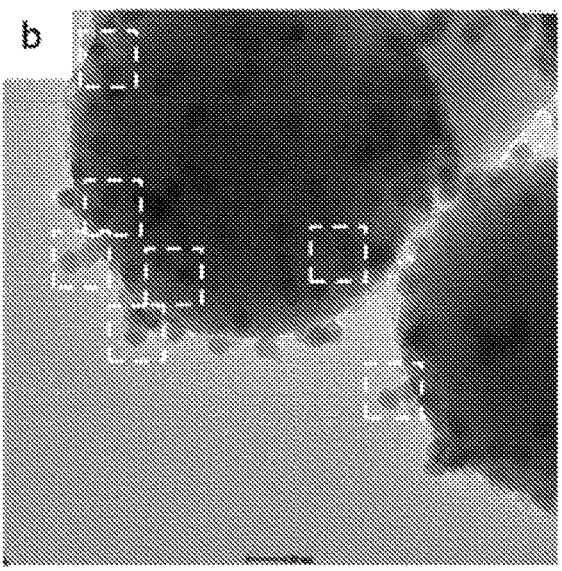
Figure 8A
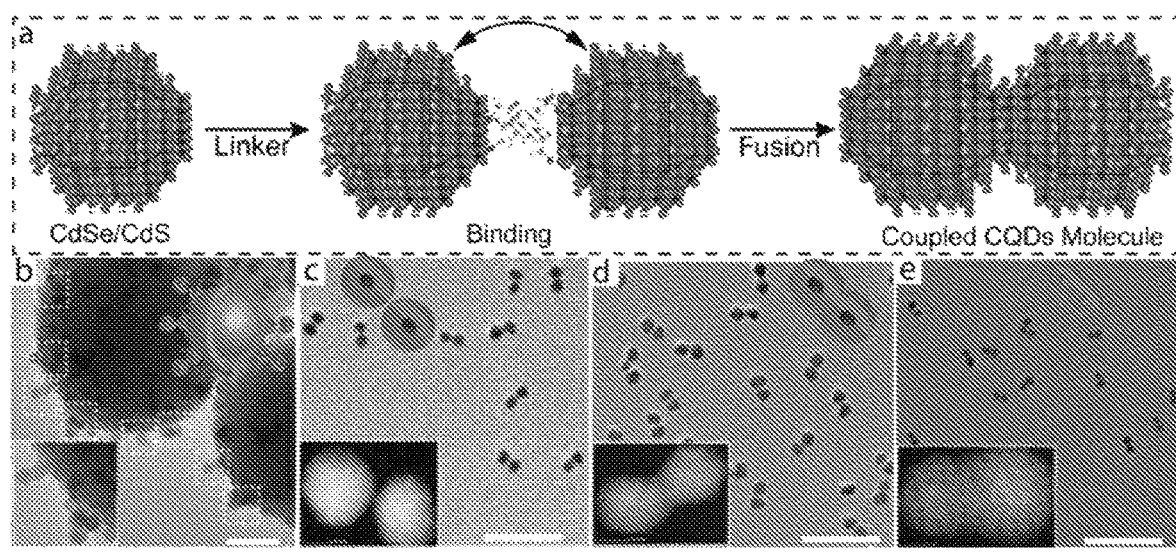
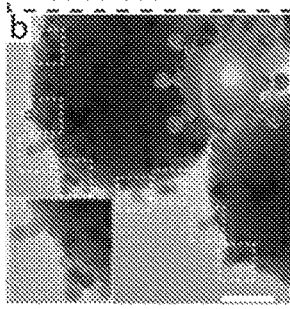
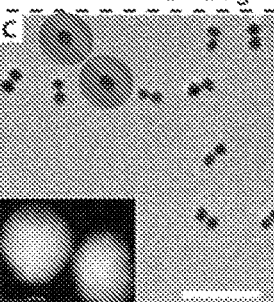
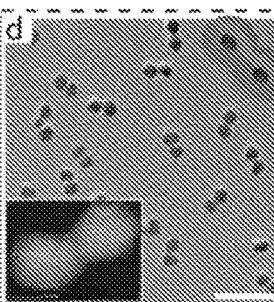
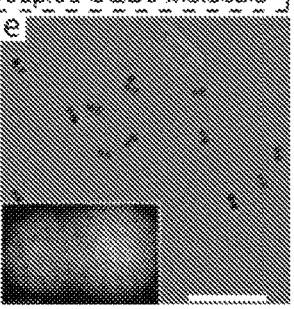
Figure 8B            Figure 8C            Figure 8D            Figure 8E

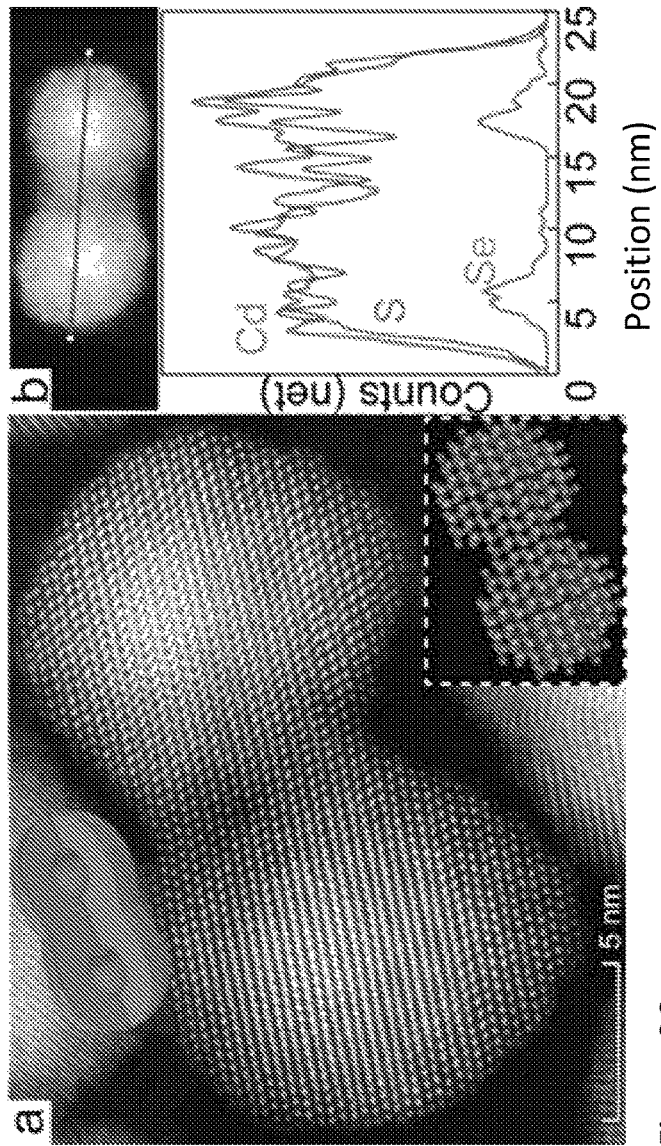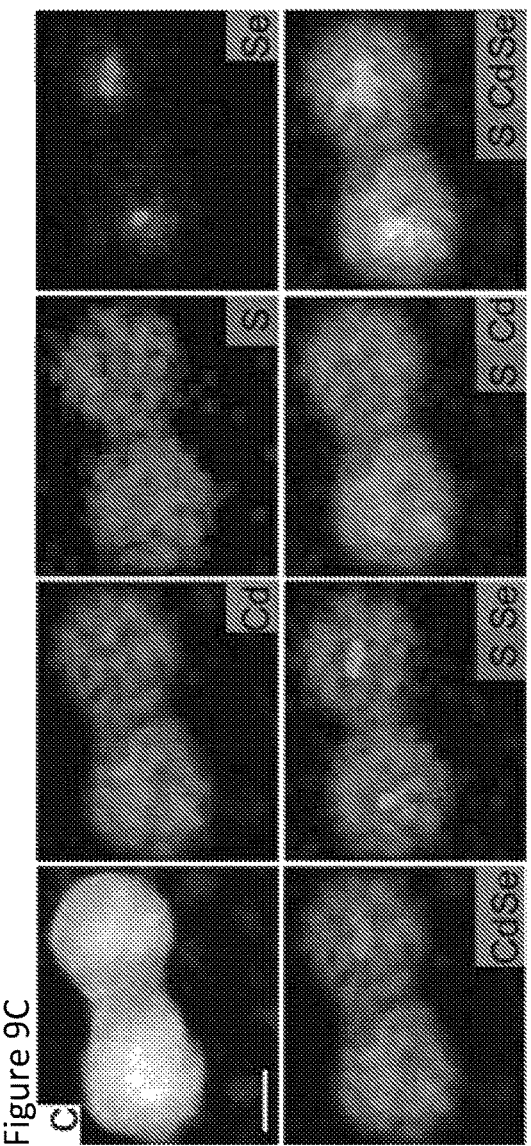
Figure 9A
Figure 9B
Figure 9C

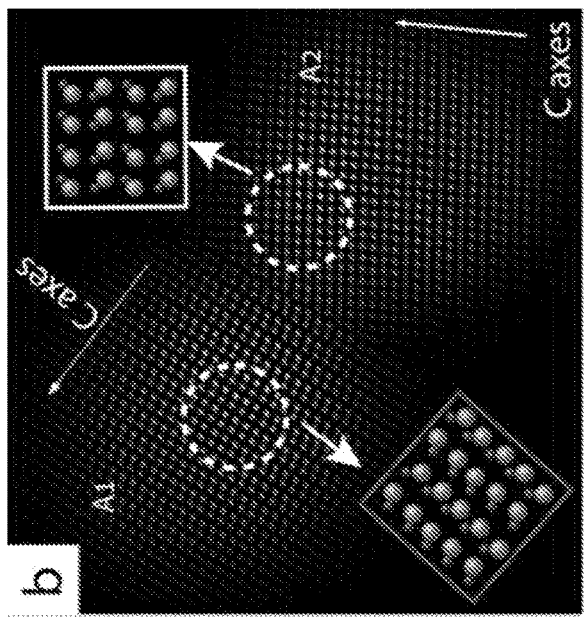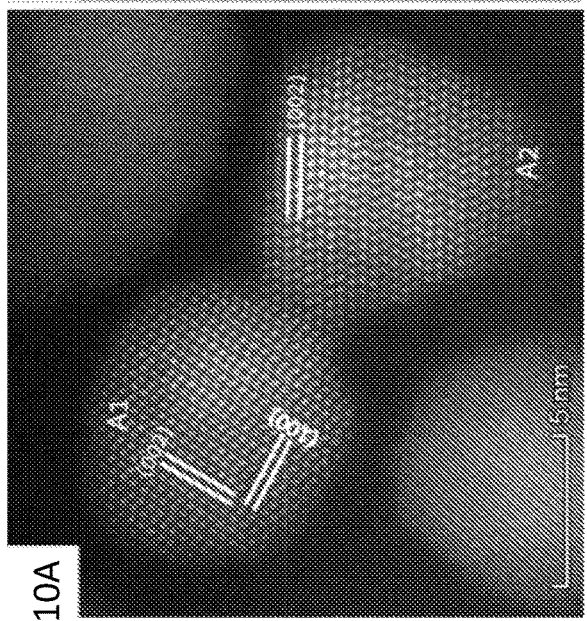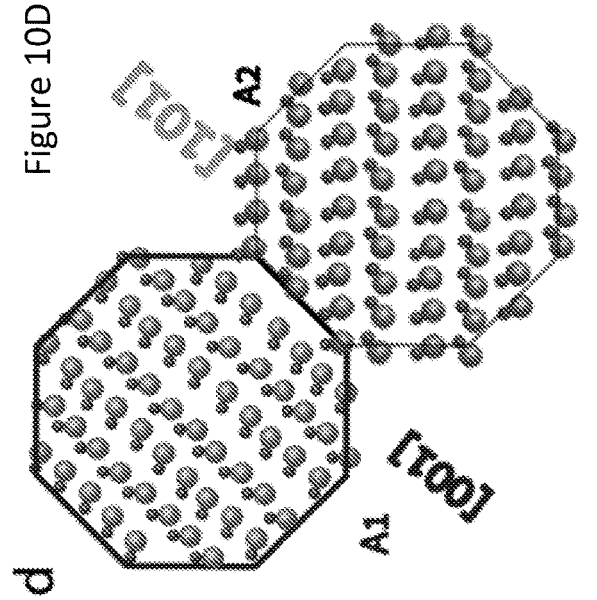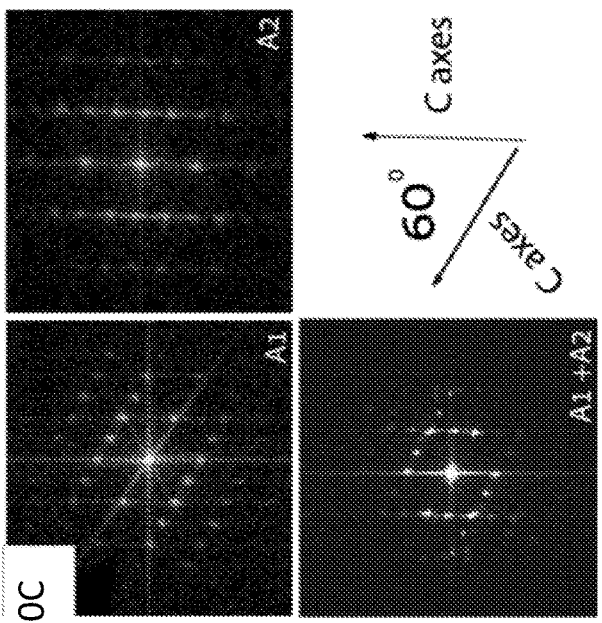

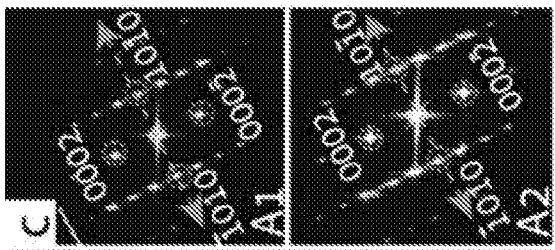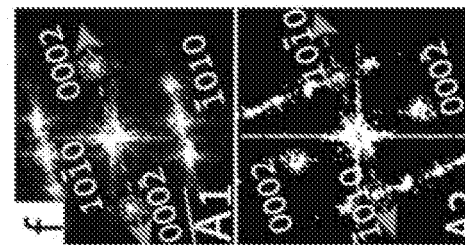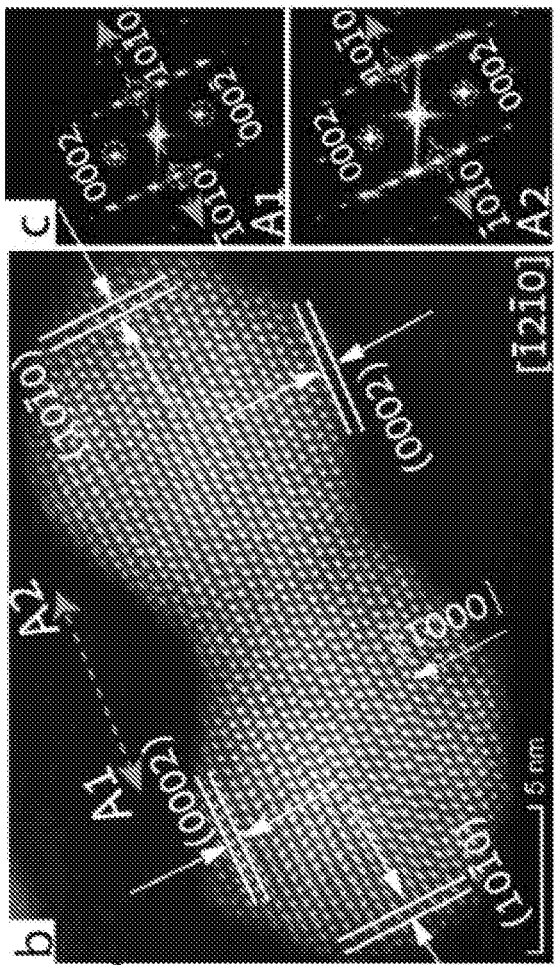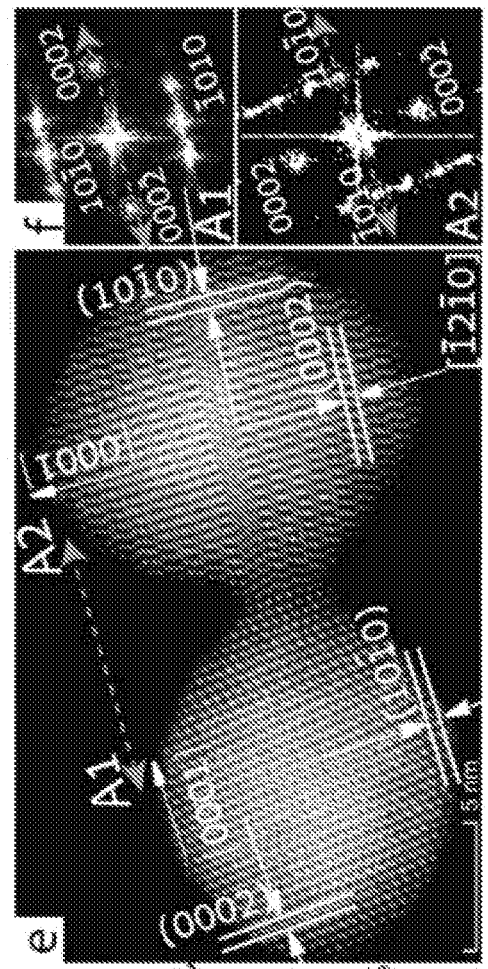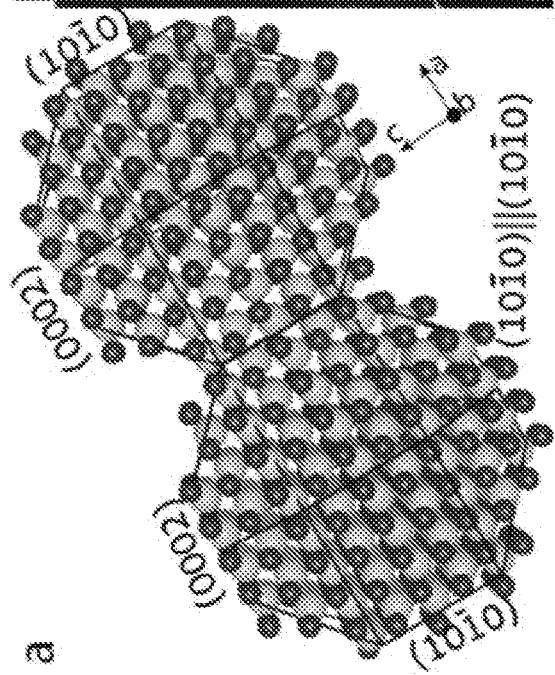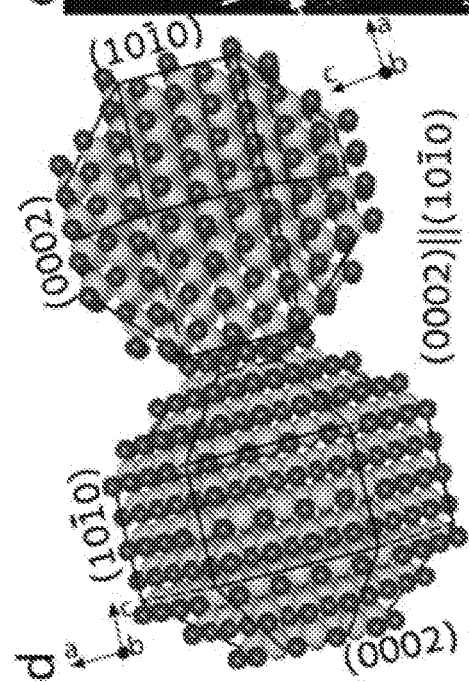

Figure 11G
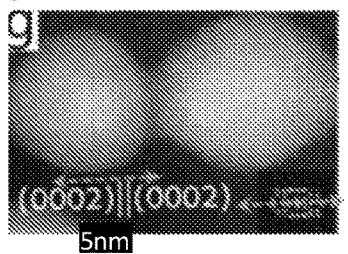
Figure 11H
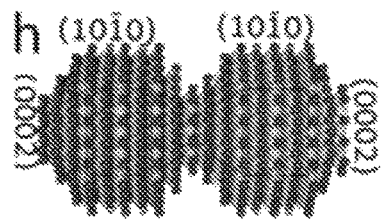
Figure 11I
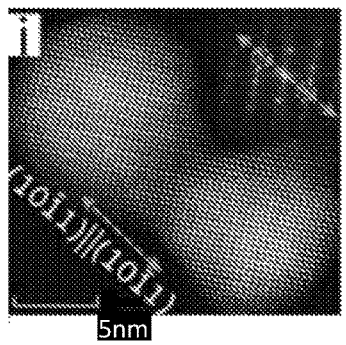
Figure 11J
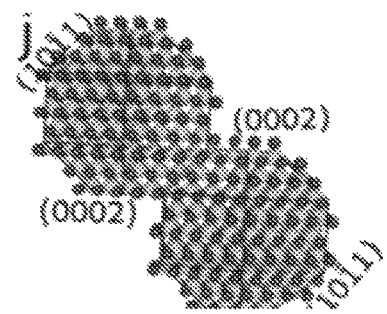
Figure 11K
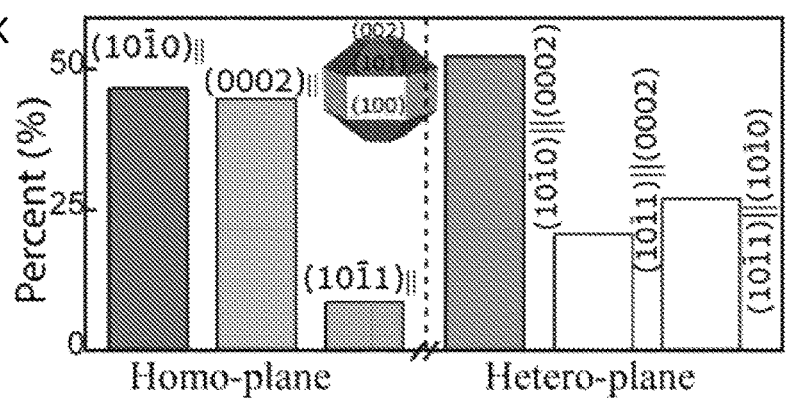
Figure 12A
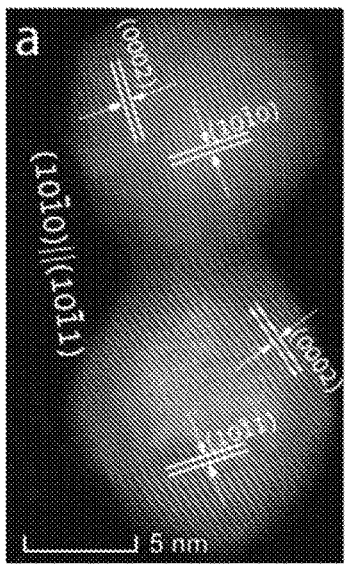
Figure 12B
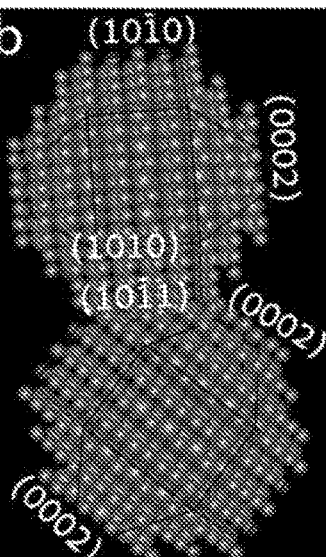
Figure 12C
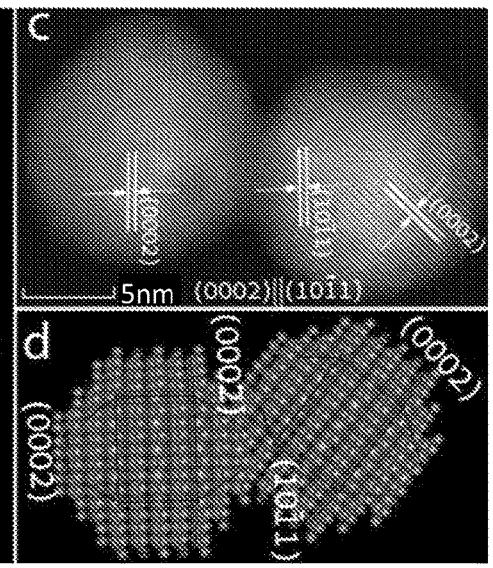
Figure 12D Figure 13A
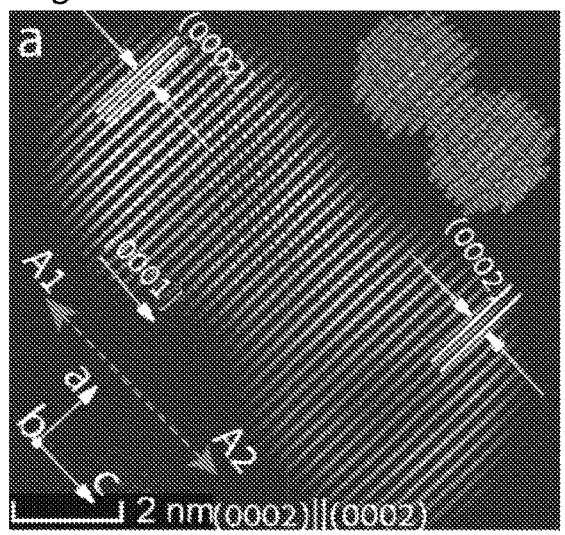
Figure 13B
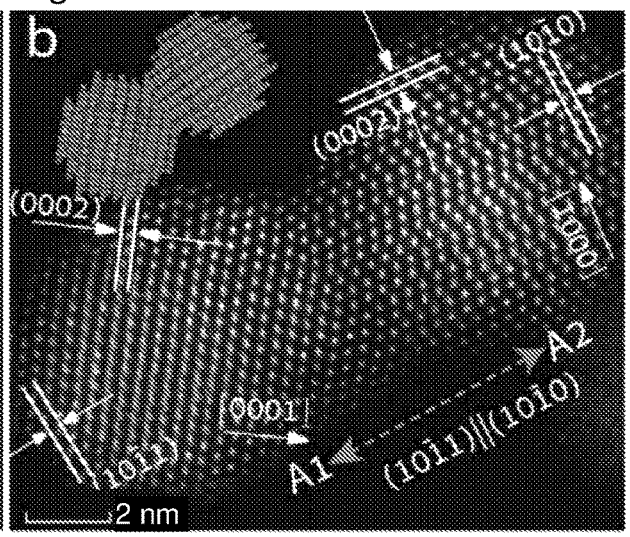
Figure 13C
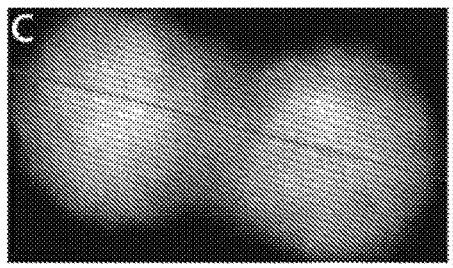
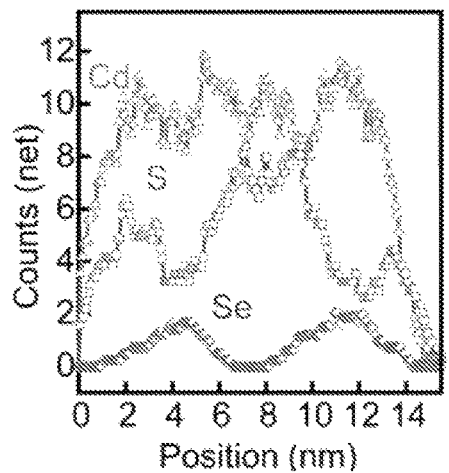
Figure 13D
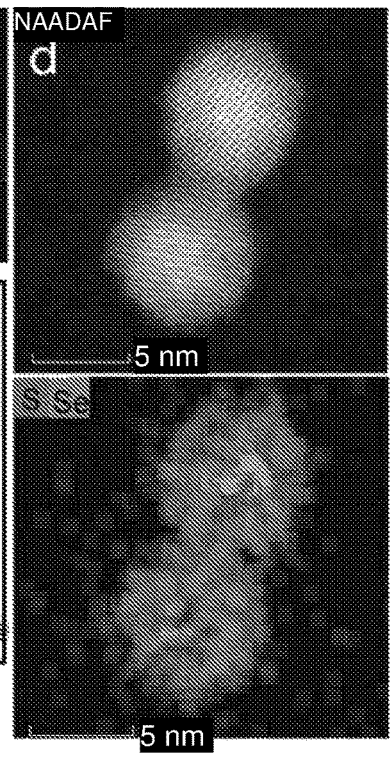
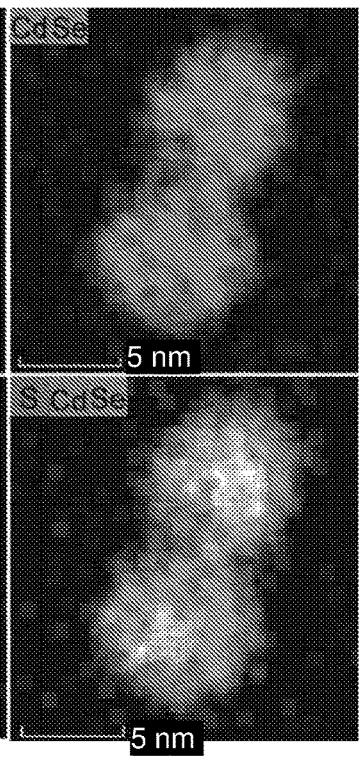

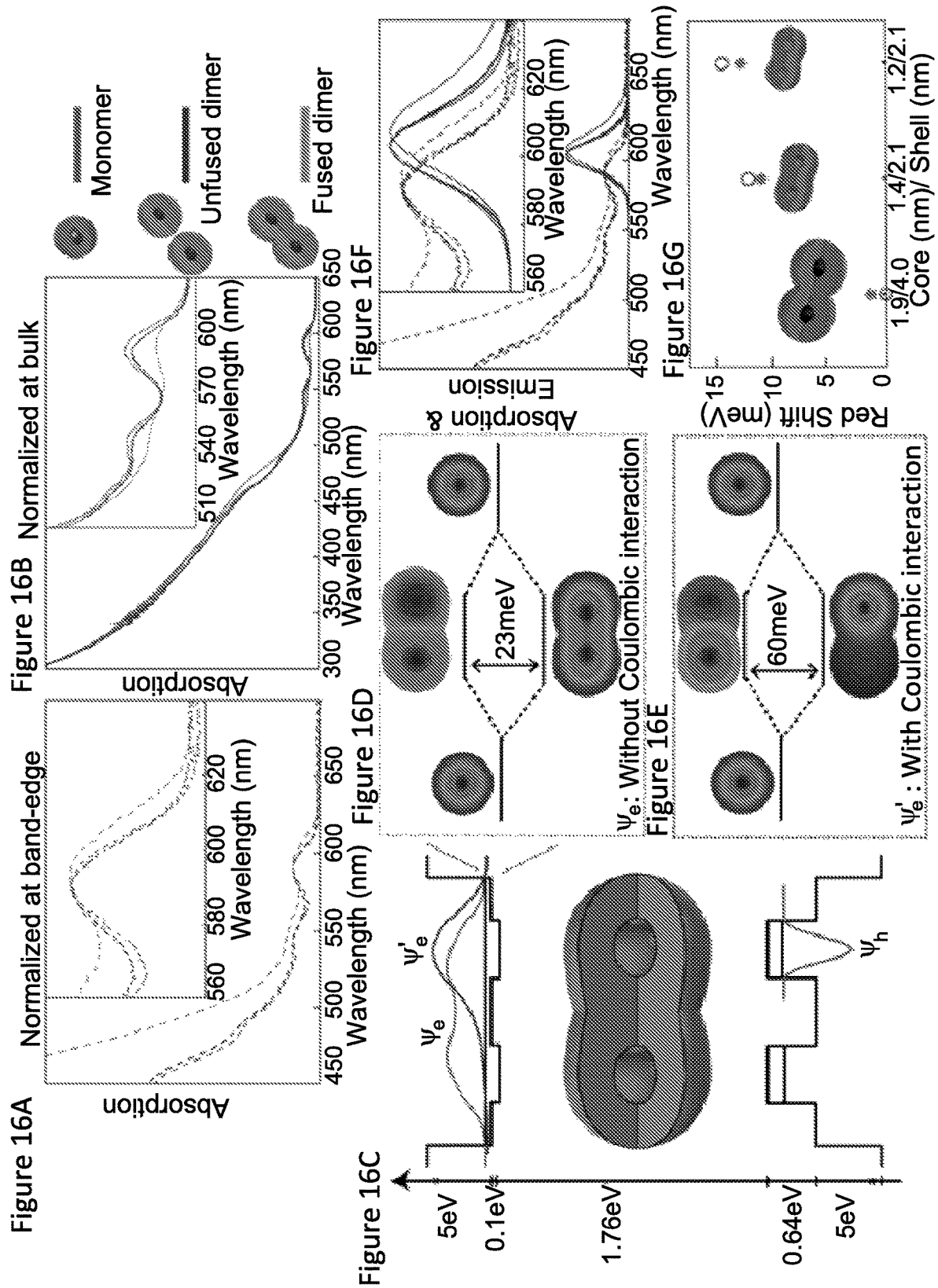

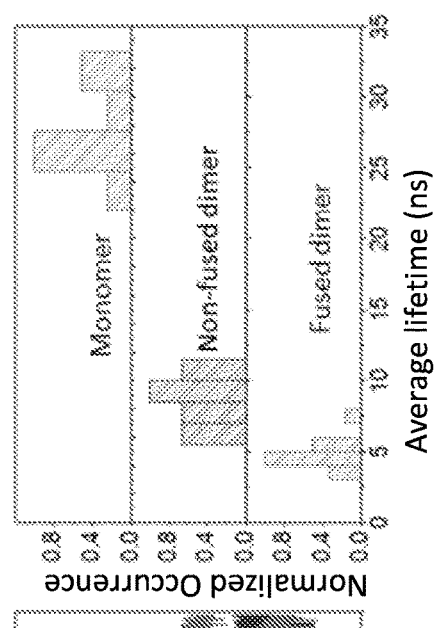
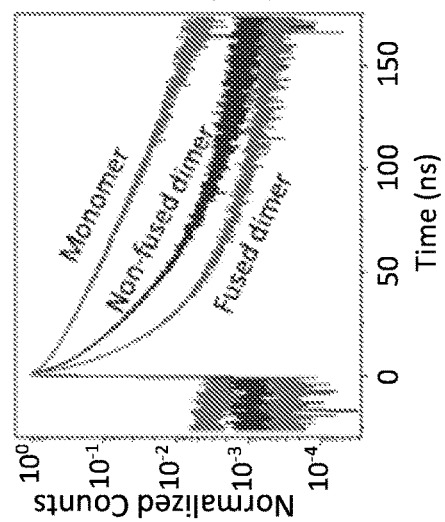
Figure 17A
Figure 17B
Figure 17C
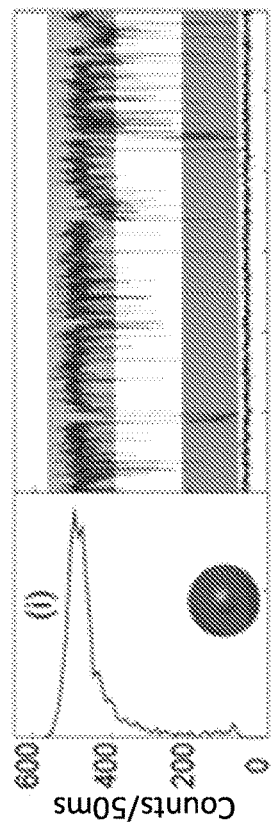
Figure 18A
Figure 18B Figure 21A
Figure 21B
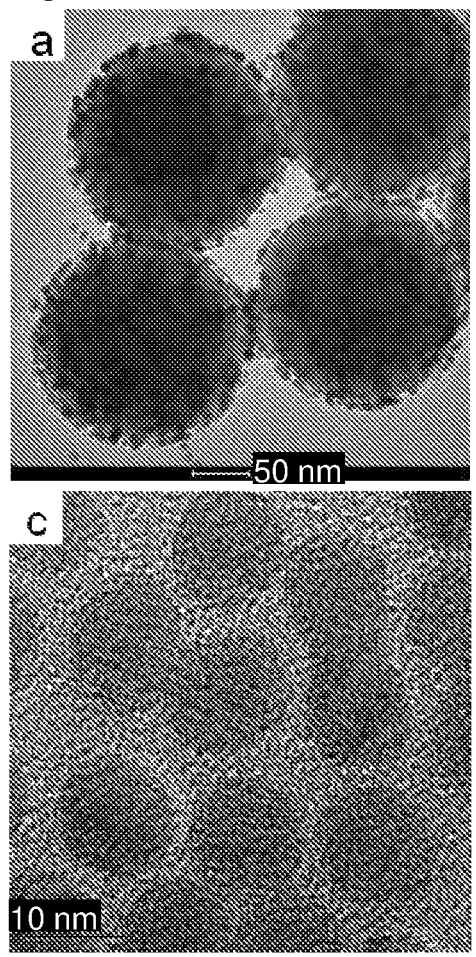
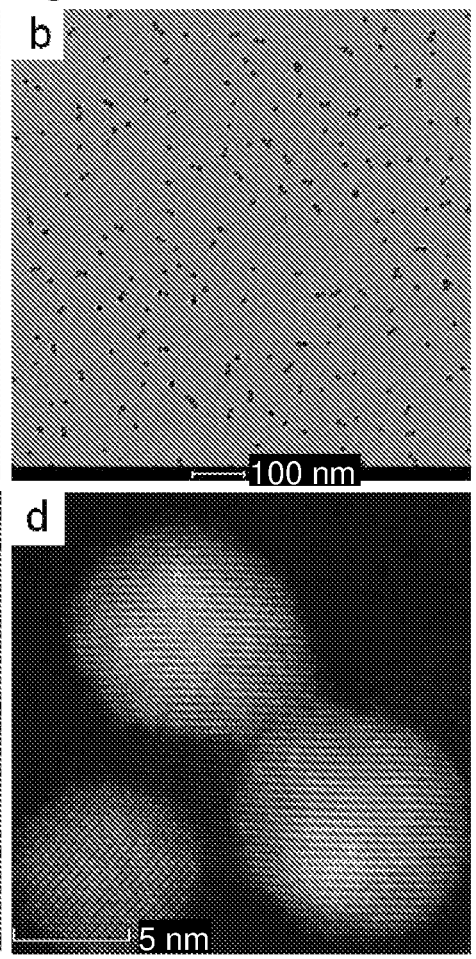
Figure 21C
Figure 21D
Figure 22A
Figure 22B
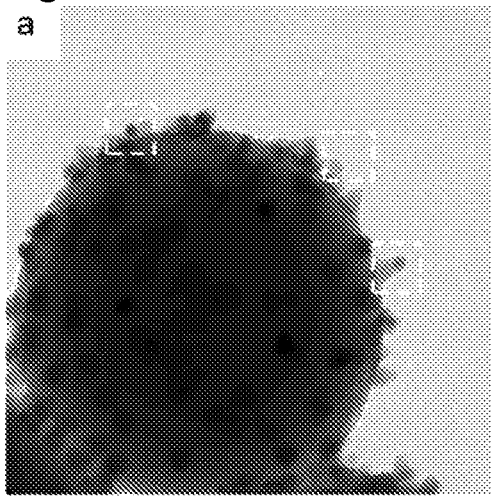
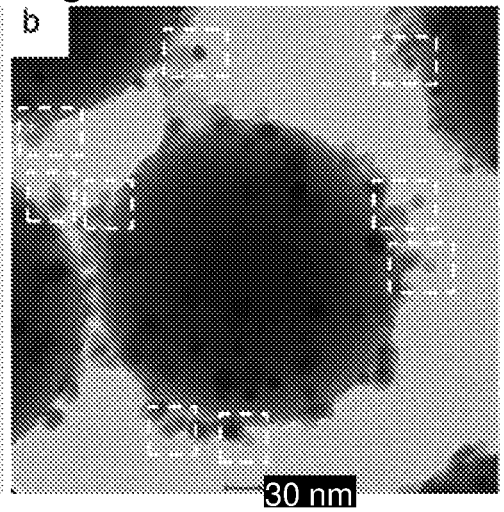

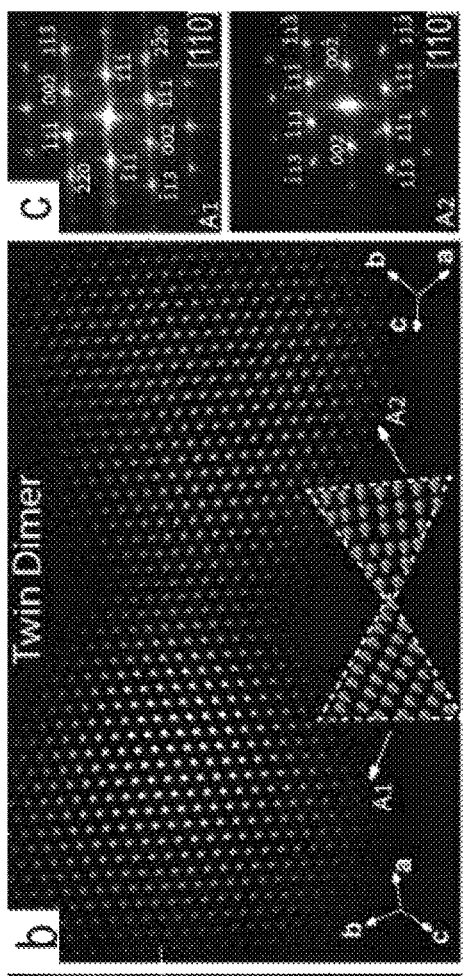
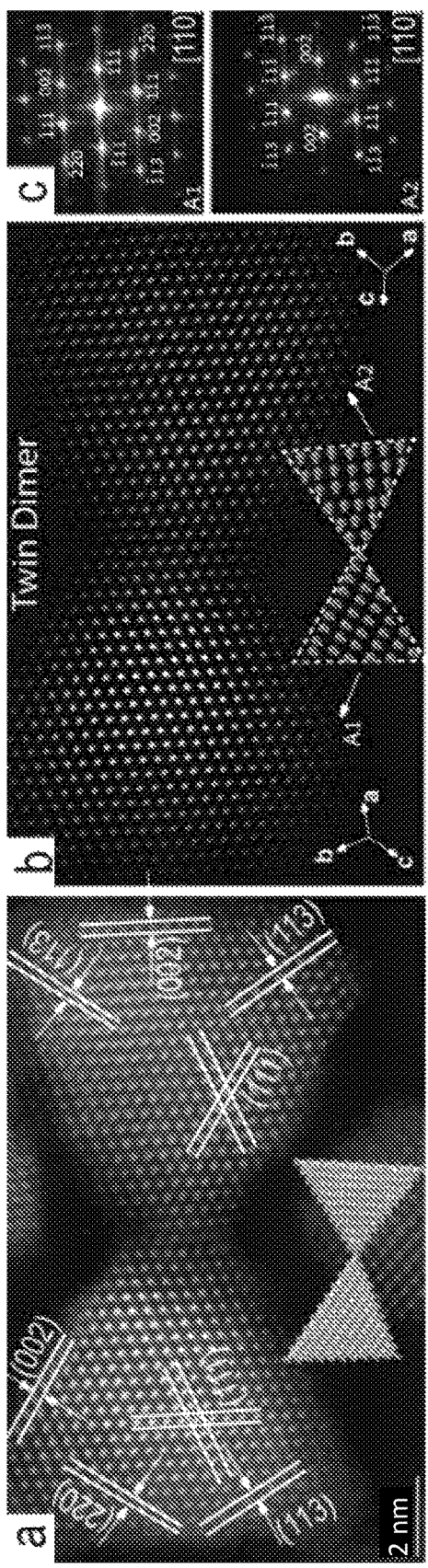
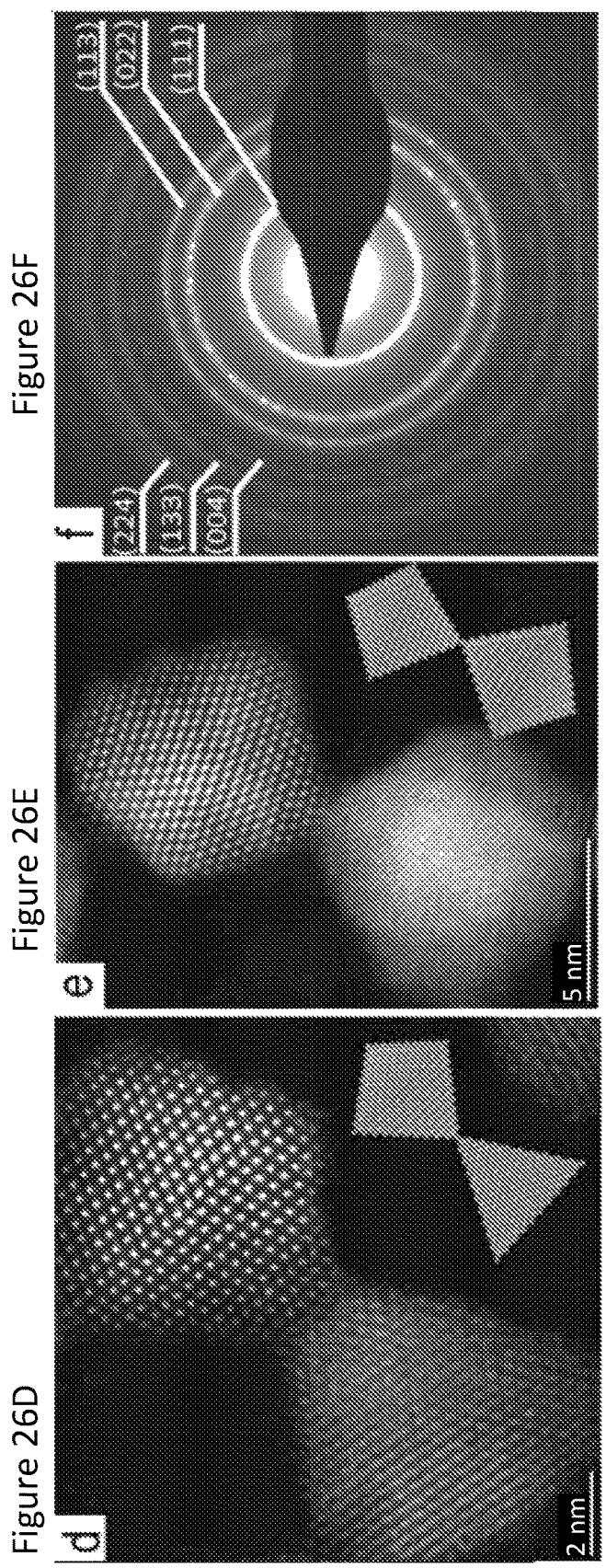
Figure 26A Figure 26B Figure 26C Figure 26D Figure 26E Figure 26F

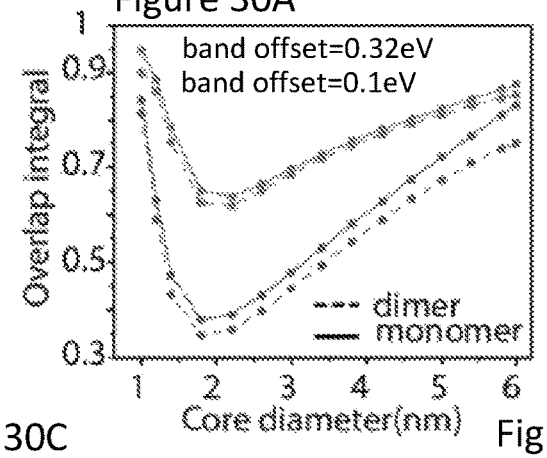
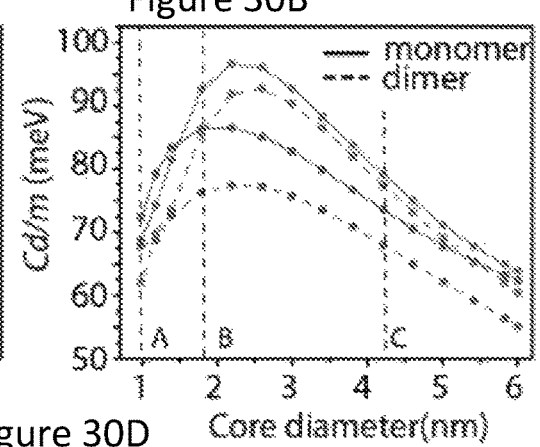
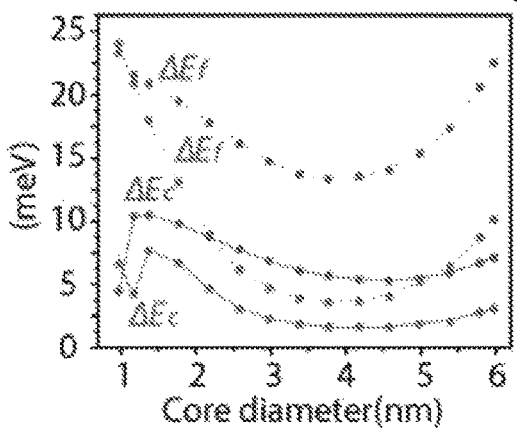
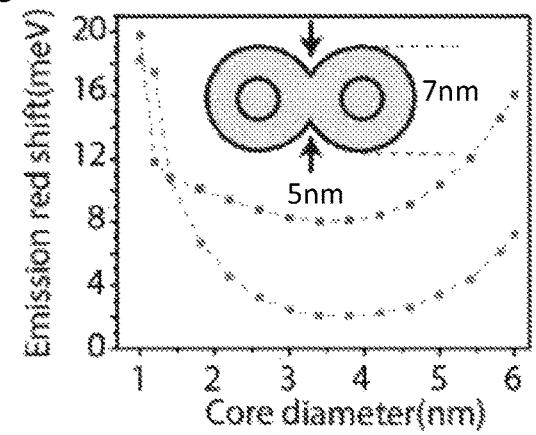
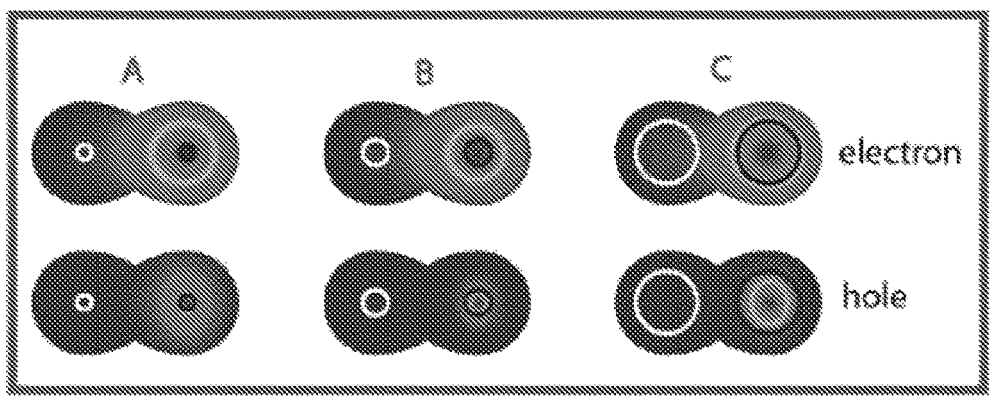
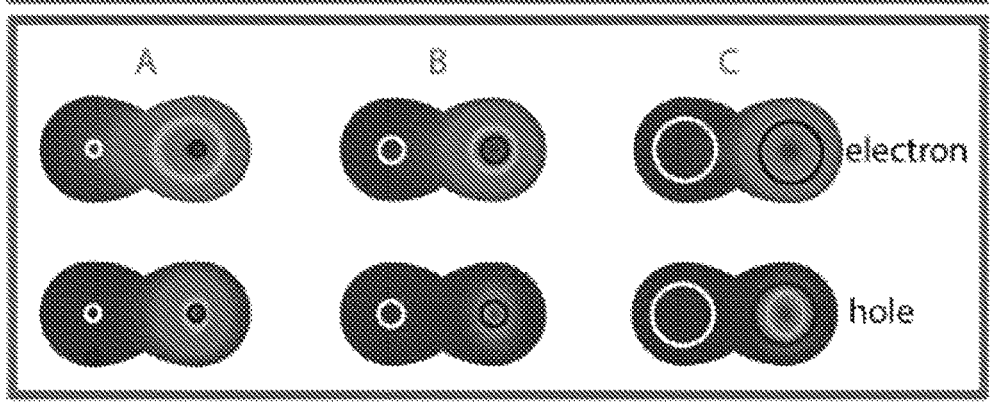

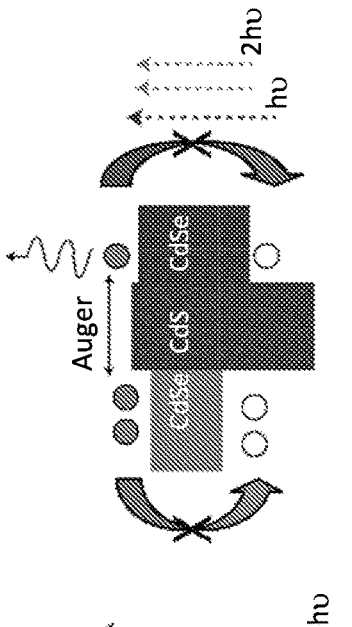
Figure 32A
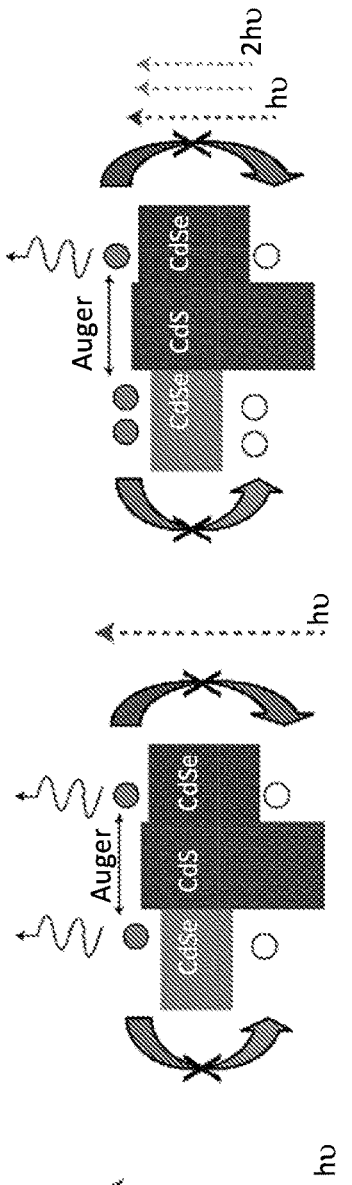
Figure 32B
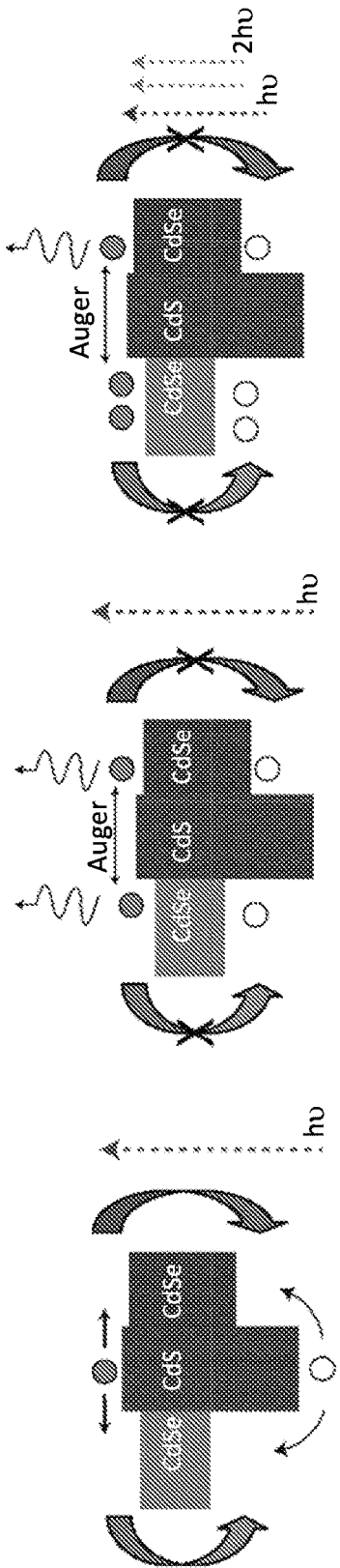
Figure 32C
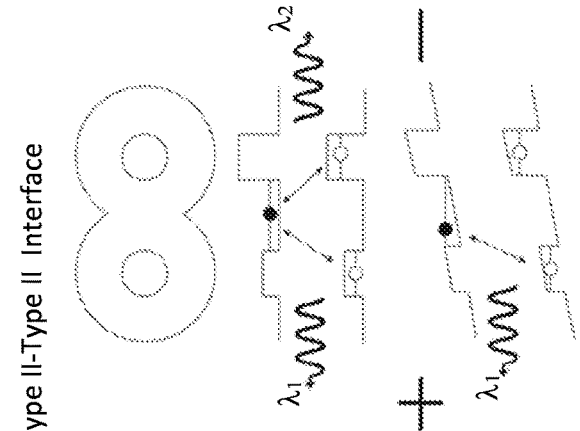
Figure 33A Type I-Type I Interface
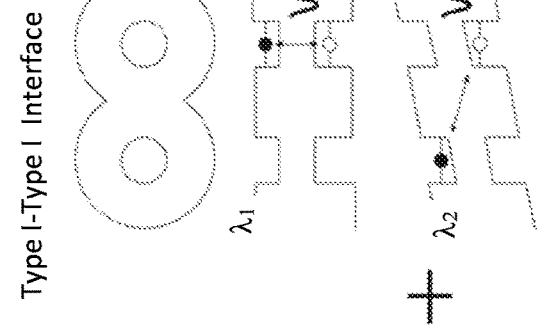
Figure 33B Type II-Type II Interface

COLLOIDAL SEMICONDUCTOR NANOSTRUCTURES

CROSS-REFERENCE TO RELATED APPLICATIONS

The present application is a National Phase Entry of PCT International Application No. PCT/IL2020/050055 which was filed on Jan. 14, 2020, which claims priority to provisional patent application Ser. No. 62/793,415, filed Jan. 17, 2019, both of which are hereby incorporated by reference in their entireties.

The project leading to this application has received funding from the European Research Council (ERC) under the European Union's Horizon 2020 research and innovation programme (grant agreement No 741767).

TECHNOLOGICAL FIELD

The invention disclosed herein generally concerns novel coupled nanocrystal molecules and uses thereof.

BACKGROUND

Colloidal coupled quantum materials with high control over the composition and size of the barrier between them hold a great potential for tuning their optical and electrical properties, making them applicable for various applications including light-emitting devices, displays, photovoltaics, quantum gates, biomedical sensors, electric field sensors, ratiometric sensors and so on.

Many potential interesting properties are expected in coupled nanocrystal molecules prepared by the bottom-up wet-chemistry synthesis approach. Quantum dots (QDs) that are grown by molecular beam epitaxy (MBE) [1], manifested unique behavior for the quantum couplings, both for excitons and for multiexcitons in such a system. However, MBE-grown double QD structures manifest limitations. First, due to the small energy scales, only low-temperature operation and revelation of coupling are possible thus limiting the applicability of these effects to specialized low-temperature applications only. This is also related to the typical size of MBE-grown QDs that is larger than the colloidal ones, and this also restricts the distance between the QDs for the coupling phenomenon. Lastly and significantly, MBE structures are inherently buried within a host semiconductor, and hence are not free in solution and not accessible for wet-chemical manipulations possible for colloidal NCs systems through their surface functionalization. That is, the colloidal NCs can be printed to create pixels, can be placed in polymer, can be used in solution and also linked to biomolecules and other entities and thus are highly applicable in various scenarios and environments.

Arranged architectures of colloidal nanocrystals (NCs) as building blocks were also suggested before. One powerful strategy for such molecular-like architectures is using programmed assembly via DNA chemistry or other organic linkers. However, the connection of the DNA segment of NCs presents obviously long-distance and forms significant energy barriers, which limit their quantum mechanical and electronic couplings. Electronic coupling of semiconductor materials in different regions of individual colloidal QDs, for example, exhibiting dual emission peaks was performed by the use of core/multi-shell NCs. However, this strategy was found to be limited for specific combined compositions, with a small enough lattice mismatch. Moreover, the electric field control over the optical and electronic properties in these multi-shell materials was also found to be limited due to the spherical symmetry of the core-shell structure [2]. In a different approach, the structure of core-shell nanorods with one semiconductor tip, where two semiconductor regions are separated by a rod region of a different semiconductor with a different bandgap by a tunneling barrier, presents upconversion properties [3]. However, the barrier width was constrained to large distances by the length of the nanorods. In addition, multiple heterojunctions with a combination of type-I and type-II band offsets, that is, this type of dumbbell structure achieving composition and band gap engineering of hole and electron were reported [4]. However, the distance between the two dots was limited down to 10 nm, where coupling effects are limited. Additionally, limited controlled barrier distance was also reported with heavy-metal-free dumbbell structures [5], whose coupling distance was 5 nm or more. Generally, the level of control over the size of the barrier is limited by these approaches and indicates room for further improvement to achieve a precisely controlled coupling structure.

Therefore, there is a lack of a more general approach and availability of coupled nanocrystals molecules that can manifest precisely controlled distances between core structures of different band offsets and characteristics such as size and compositions, as well as crystal structures, and at the same time provide control of the barrier distance and its potential energy landscape.

Recently, various strategies to produce dimer NPs were investigated. For example, a soft template, including silica, carbon nanotubes, and graphene, for the constraining of NPs was investigated [6]. But these dimer architectures are separated by linkers that are organic molecules and thus show a high potential barrier between the component nanocrystals. The limitation of such high barriers is that the potential energy landscape cannot be controlled—and thus the electronic coupling effects are not manifested since the electron and hole wave functions are strongly constrained to each nanocrystal.

Oriented attachment (OA), basing on energetically favorable nanocrystal facets interactions was also reported. For example for the production of PbSe QD architectures which were later fused to produce straight, zigzag, helical, branched, and tapered nanowires, 2D sheets, honeycomb, and chiral ribbons geometries. In all experimental investigations mentioned above, high pressure or high temperatures were used to fuse the QDs. These systems did not have any barrier between the different QDs and the fusion goal was for elongation purposes to achieve different and desired architectures such as rods, platelets, etc.

BACKGROUND ART

[1] Coupling and Entangling of Quantum States in Quantum Dot Molecules, Manfred Bayer, et al., Science 2001, 291, (5503), 451.
[2] U.S. Pat. No. 7,767,260.
[3] U.S. Pat. No. 9,577,125.
[4] U.S. Pat. No. 9,123,638.
[5] Heavy-Metal-Free Fluorescent ZnTe/ZnSe Nanodumbbells, Uri Banin, et al., ACS Nano 2017, 11, (7), 7312.
[6] U.S. Pat. No. 9,040,158.

GENERAL DESCRIPTION

Despite the above-exploited approaches, coupled nanocrystal-based materials with controllable barriers are not known.

The inventors of the technology disclosed herein provide a new class of nanoparticles characterized by a pair of nanocrystal structures of well-controlled size and composition that are coupled to each other. Electronic coupling existing between the pair of structures is controlled to the distance and to the potential energy such that hybridization and quantum coherences are achieved by using at least one core/shell quantum dot. Coupling can be tuned and determined by the thickness and composition of the shell. As will be demonstrated hereinbelow, the shape, size, and composition of the core can be engineered for the electronic coupling of the two QDs.

A facile and powerful strategy is thus presented that leads to coupled nanocrystals, e.g., QD, with precise structural control. These can manifest emergent quantum mechanical coupling effects within nanocrystal molecules, paving the way for an enormous spectrum of applications in diverse fields such as optical, optoelectronic, display, bio-medical, quantum technologies and photocatalytic applications.

Thus, in most general terms, the invention disclosed herein concerns novel coupled nanocrystals and uses thereof, having precise control over the composition, distance, and size of a coupling region present between the coupled nanocrystals.

In a first aspect, the invention provides a chemically fused nanocrystal molecule (or arrangement of nanocrystals or a nanoassembly of such nanocrystals) comprising two or more nanocrystals, at least one of said nanocrystals is a core/shell structure, wherein at least one of a shell thickness and shell composition defining electronic coupling between a core in the core/shell structure and a nanocrystal fused to the core/shell structure.

The invention further provides a chemically fused nanocrystal molecule comprising two or more semiconductor core/shell structures, the fused nanocrystal molecule comprising two or more core structures and a continuous outermost shell extending the circumference of the two or more core structures, the outermost shell comprising a material substantially identical to a shell material of any of said two or more semiconductor core/shell structures or an alloy material of the shell materials of the two or more semiconductor core/shell structures.

As noted, the two or more cores are embedded in a shell structure that extends the full circumference of the two or more cores. The shell structure may comprise one or more coats or shells of same or different shell materials. Unlike the topmost shell, or the exposed shell of the one or more shells, regarded as the outermost shell, which is said to extend or coat the circumference of the two or more structures, each of the inner shells may similarly extend or coat the circumference of the two or more structures or coat only one or a portion of the two or more structures. In other words, the two or more structures in a fused nanocrystal molecule are overcoated with one or more shells of semiconductors materials which may be the same or different. Thus, the invention further provides a fused nanocrystal molecule comprising two or more semiconductor core/shell structures, the fused nanocrystal molecule comprising two or more core structures and a shell structure comprising a continuous outermost shell extending the circumference of the two or more core structures, the outermost shell comprising a material identical to a shell material of any of said two or more semiconductor core/shell structures or an alloy material of the shell materials of the two or more semiconductor core/shell structures.

In some embodiments, the shell structure comprises only the continuous outermost shell, as defined.

In some embodiments, the shell structure comprises at least one shell and the continuous outermost shell, as defined, wherein the at least one shell is positioned below the outermost shell.

Each of the at least one shells (not including the outermost shell) may be coating or surrounding the two or more cores to provides a continuous coat or film or a discontinued coat or film which only partially coats the circumstance of the two or more cores.

Nevertheless, the shell structure as a whole fully embeds or fully covers the surface of the two cores. The cores are not in contact with each other, the distance between them is defined by the thickness of the shell fusion region. Where the two or more core/shell structures have the same shell material (while the core material may be the same or different), the outermost shell, which embeds the two or more cores (which may be the same or different) and which forms following fusion of the two structures, is continuous over the two or more cores and comprises the material of the shells. Where the two or more core/shell structures have different shell materials (while the core material may be the same or different), fusion between the two or more structures provides a continuous shell that fully embeds the core structures, and which comprises a region composed of the shell material of one of the structure, a region composed of the shell material of another of the structures, and a fusion region that is composed of a combination or an alloy of the two shell materials.

In cases where the core/shell structures are core/multishell structures (or wherein at least one of the structures is a core/multishell structure), fusion between the two or more structures may occur through the outermost shell structure in each core/shell or core/multishell structure. Additionally, when fusing a core/multishell structure, fusion may also involve inner shells, not only the outermost shell. In other words, in a similar fashion to the above, fusion between the two or more structures provides a continuous shell that fully embeds the core structures, and which comprises a region composed of the multishell material of one of the structure, a region composed of the shell/multishell material of another of the structures, and a fusion region that is composed of a combination or an alloy of the shell/multishell materials As used herein, the term "fusion" stands to mean a chemical association/blending/joining of two shell materials of neighboring structures (e.g., neighboring core/shell structures), or of two structures (e.g., non-core/shell, such as QD) by chemical means, as detailed herein, or by application of light, heat or pressure (so-called physical means, as disclosed herein), to yield assemblies of such structures. The term does not encompass the joining together of structures such as core/shell structures and QD structures by the mere enveloping two or more such structures in a common matrix or shell. The term further does not encompass the joining together of the such structures via organic or inorganic linker moieties or ligands. In a fused system according to the invention, a material of one of the structures undergoing fusion becomes chemically blended with a material of another of the structures. Such blending, where different materials are concerned results in a third material which may be an alloy of the two.

Systems of the invention may be further regarded colloidal. Excluded are systems manufactured by molecular beam epitaxy.

By preselecting one or both of shell thickness and shell composition, the distance between the nanocrystals and the interaction between them are controlled, thereby controlling the presence or absence or the degree (or level) of "electronic coupling" between the nanocrystals. In some embodiments, at least one of shell thickness and shell composition defines a physical barrier between the core in the core/shell structure and a nanocrystal fused to the core/shell structure thereby reducing or diminishing interaction between the nanocrystals.

As mentioned hereinbelow, the core/shell structure or any other core/structure present in the fused nanocrystal molecules of the invention is constructed of a core and at least one shell, both of said core and at least one shell is a nanocrystal material. In some embodiments, the core is selected from a metal and a semiconductor material. In some embodiments, the core is a semiconductor material. In other embodiments, the core is a metal.

In other embodiments, either the core or the shell material may be a perovskite material as known in the art.

Thus, in another aspect of the invention, there is provided a fused nanocrystal molecule comprising two or more core/shell structures, at least one of said core/shell structure comprises a metal core or a metal shell, the fused nanocrystal molecule comprising two or more core structures and a continuous outermost shell extending the circumference of the two or more core structures, the outermost shell comprising a material identical to a shell material of any of said two or more core/shell structures or an alloy material of the shell materials of the two or more core/shell structures.

Also provided is a fused nanocrystal molecule comprising two or more semiconductor core/shell structures, at least one of said core/shell structure comprises a metal core or a metal shell, the fused nanocrystal molecule comprising two or more core structures and a shell structure comprising a continuous outermost shell extending the circumference of the two or more core structures, the outermost shell comprising a material identical to a shell material of any of said two or more semiconductor core/shell structures or an alloy material of the shell materials of the two or more semiconductor core/shell structures. In some embodiments, the core material of the core/shell structure may be selected from metallic and semiconductor materials and the shell material of the core/shell structure is a semiconductor material.

In some embodiments, the fused nanocrystal molecules comprise two or more core/shell structures. Where fused nanocrystal molecules according to the invention comprises a plurality (two or more) of core/shell structures, the electronic coupling between any two fused nanocrystals in the fused nanocrystal molecules depends on the nature of the two fused nanocrystals. For example, wherein in fused nanocrystal molecules, the two fused nanocrystals are core/shell structures, the region enabling electronic coupling or through which electronic coupling can be achieved or controlled would be defined as the material thickness and composition of the two shells separating the two cores. The electronic properties would similarly depend on the shell's thickness and composition. In other cases, where one of the two fused nanocrystals is a core/shell structure and the second of the two is not a core/shell structure, the electronic coupling would depend inter alia on the material thickness and composition of the shell of the core/shell structure.

The fused nanocrystal molecules of the invention may further comprise two or more fused nanocrystals that are not core/shell structures. In such cases, any two fused non-core/shell structures would be free of a barrier to coupling and in fact, may be regarded as two core structures fused to one another.

In some embodiments, the fused nanocrystal molecules consist core/shell structures. In some embodiments, the fused nanocrystal molecules consist core/shell structures that are composed of semiconductor materials only. In some embodiments, the fused nanocrystal molecules consist core/shell structures, at least one of which comprising a metal core or a metal shell. Excluded from systems of the invention are systems consisting fully metallic core/shell structures, namely structures wherein the core is a metal and the shell material is a metal.

As disclosed herein, each nanocrystal, e.g., core/shell structure, constituting a fused nanocrystal molecule according to the invention, is selected to endow the fused structure with certain structural and electronic properties. The selection of nanocrystal material, size (e.g., thickness), structure (e.g., core/shell) and shape (e.g., architecture of the nanocrystals and relative sizes of each of its components) provide control over, e.g., hybridization and quantum coherence effects; and thus modulate (increase or decrease or maintain) or control electronic properties of the nanocrystals.

In some embodiments, each two fused core/shell structures have a fusion region therebetween, wherein the size, structure, and shape of said fusion region is selected to provide control of at least one electronic property of the fused nanocrystal molecules such as the carrier wavefunctions, and/or carrier separations, and/or emission characteristics, and/or absorption characteristics and/or catalytic activity.

In some embodiments, the electronic properties depend on or may be modulated by changing the material composition at the fusion region or by changing the physical distance between the two nanocrystals.

As shown herein, in core/shell structures, the material at the fusion region may be selected based on the core material or based on the shell material, where the fusion partner is a core/shell structure or the material of a nanocrystal that is not a core/shell structure, e.g., a QD, to which it is fused. The distance between the nanocrystals depends on the nature of the nanocrystals. Where the two fused nanocrystals are core/shell structures, the distance between the two cores would be defined, as explained herein, by the combined thicknesses of the shells. Where one of the two fused nanocrystals is a core/shell structure and the second of the two is not a core/shell structure, the distance between the core in the core/shell structure and the non-core/shell structure would be defined as the shell thickness.

In some embodiments, the fusion region may be of a material that is different from the shell material in a core/shell structure(s) and may be formed during fusion of the nanocrystals to afford the fused molecule, as further disclosed hereinbelow.

Notwithstanding the material composition of the fusion region present between the nanocrystals, the thickness of the fusion region between a core/shell structure and a nanocrystal fused thereto may range between 0.1 and 5 nm. The distance may be equal to a shell thickness thus being in the range of between 0.1 and 0.6 nm, or may be equal to a two-shell thickness, thus in the range of 0.2 and 1.5 nm. Greater distances may be achieved in case the shell thickness is greater or in case chemical fusion introduces a material causing a greater distance.

The "nanocrystal" is a nanostructure that is substantially monocrystalline. A nanocrystal has at least one region or dimension in the nanoscale. In some embodiments, the nanocrystal has a dimension of less than about 100 nm, less than about 50 nm, less than about 20 nm, less than about 10 nm or less than about 5 nm.

In some embodiments, the nanocrystal may be a substantially monocrystalline nanostructure comprising various defects, stacking faults, atomic substitutions, etc, or a monocrystalline nanostructure that is free of such defects, stacking faults, or atomic substitutions.

The nanocrystal may be a heterostructure comprising at least two different or distinguishable materials or material region. In some embodiments, one region of the heterostructure may comprise a first material, while a second region of the heterostructure comprises a second material. In some embodiments, the heterostructure is a core/shell or core/multishell structure, wherein the core is of a first material and at least one shell is of a second material, where the different material types are distributed radially about the long axis of the nanostructure or the center of a spherical nanocrystal. In some embodiments, the heterostructure may comprise a core of one material covered with spaced-apart material islands of a second material. In some embodiments, the heterostructure comprises two or more different material regions.

In some embodiments, in assemblies of the invention, at least one nanocrystal is provided as a core/shell or core/multishell structure. As used herein, any reference to a "core/shell" structure encompasses, unless otherwise specifically indicated, reference to a core and one or more shells, namely to a "core/multishell" as well.

The nanocrystal may be a quantum dot (QD) that exhibits quantum confinement or exciton confinement. QDs can be substantially homogenous in material properties, or in some embodiments, can be heterogeneous.

The nanocrystal may exhibit a well-defined 3D architecture or geometry or an irregular architecture. In some embodiments, the nanocrystal is spherical in shape or exhibits a polygonal structure having flat faces and straight edges. The polygonal structure may be n-gonal pyramids with a polyhedral base, such as tetrahedral or hexagonal pyramids, or hexagonal bipyramids. In some embodiments, the nanocrystal is a core/shell structure having a polygonal shape.

The nanocrystal may be of or comprise a material selected amongst metals, metal alloys, metal oxides, insulators, and semiconducting materials. As noted herein, core/shell structures used in accordance with the invention may be made of a core material and a shell material that, each independently of the other, is selected amongst metals, metal alloys, metal oxides, insulators, and semiconducting materials. In some embodiments, the core material is selected amongst metals, metal alloys, metal oxides, insulators, and semiconducting materials, and the shell material is selected from semiconductor materials.

In some embodiments, the fused nanocrystal molecule is a semiconductor heterostructure. In some embodiments, the heterostructure has a type-I, reverse type-I, quasi-type-II or type-II band-alignment between a core and a fusion region semiconductor materials or between the two core semiconductor materials.

In some embodiments, the material is or comprises an element of Groups IVB, VB, VIB, VIIB, VIIIB, IB, IIB, IVA, and VA of block d of the Periodic Table of the Elements. In some embodiments, the material is or comprises a metal, a transition metal or post-transition metal. In some embodiments, such metals are selected from Groups VIB, IVB, VB, VIB, VIIB, VIIIB, IB and IIB of block d the Periodic Table. In some embodiments, the transition metal is a metal selected from Sc, Ti, V, Cr, Mn, Fe, Ni, Cu, Y, Zr, Nb, Zn, In, Ga, Sn, Bi, Tc, Ru, Mo, Rh, W, Au, Pt, Pd, Ag, Mn, Co, Cd, Hf, Ta, Re, Os, Ir and Hg.

In some embodiments, the material is or comprises a semiconductor material selected from elements of Group I-VII, Group II-VI, Group III-V, Group IV-VI, Group III VI, Group I-VI, Group V-VI, Group II-V, Group I-III-VI$_2$, Group IV, ternary or quaternary semiconductors and alloys or combinations thereof.

In some embodiments, the semiconductor material is a Group I-VII semiconductors are CuF, CuCl, CuBr, CuI, AgF, AgCl, AgBr, AgI and the like. In other embodiments, the semiconductor material is a Group II-VI material being selected from CdO, CdSe, CdS, CdTe, HgO, HgS, HgSe, HgTe, BeO, BeS, BeSe, BeTe, MgO, MgS, MgSe, MgTe, CdSeTe, ZnO, ZnSe, ZnTe, ZnS, ZnCdSe, ZnCdTe, ZnCdS and any combination thereof.

In some embodiments, Group III-V materials are selected from InAs, InP, InN, GaN, InSb, InAsP, InGaAs, GaAs, GaP, GaSb, AlP, AlN, AlAs, AlSb, BP, BaS, BSb and any combination thereof.

In additional embodiments, the semiconductor material is selected from Group IV-VI, the material being selected from PbSe, PbTe, PbS, PbSnTe, Tl$_2$SnTe$_5$, GeS, GeSe, SnS, SnSe, GeTe, SnTe, PbO, and any combination thereof.

In some embodiments, the material is a ternary material such as CuInS, CuInSe, CuInTe, AgInS, AgInSe or AgInTe, SbSI, SbSBr, SbSeI, SbSeBr, SbTeI, BiSCl, BiSBr, BiSeCl, BiSeBr, BiSeI. In some embodiments, the material is a quaternary material such as CuInGaS, CuInGaSe, CuInGaTe, CuInS$_2$, CuInSe$_2$, CuInTe$_2$, CuGaS$_2$, CuGaSe$_2$, CuAlSe$_2$, CuGaTe$_2$, CuAlTe$_2$, AgInGaS, AgInGaSe, AgInGaTe, AgInS$_2$, AgInSe$_2$, AgInTe$_2$, AgGaS$_2$, AgGaSe$_2$, AgAlSe$_2$, AgGaTe$_2$ or AgAlTe$_2$.

In some embodiments, the fused nanocrystal molecules or any of the structures of the invention can be doped. Non-limiting example is one N-doped and the second P-doped creating a P-N junction.

In some embodiments, wherein the core/shell structure comprises a metal core and/or a metallic shell, the metal may be a metal as known in the art or comprise a metal as known in the art, or may be or comprise a transition metal or post-transition metal.

In some embodiments, the transition metal may be a metal selected from Sc, Ti, V, Cr, Mn, Fe, Ni, Cu, Y, Zr, Nb, Zn, In, Ga, Sn, Bi, Tc, Ru, Mo, Rh, W, Au, Pt, Pd, Ag, Mn, Co, Cd, Hf, Ta, Re, Os, Ir and Hg.

The assembly or arrangement of nanocrystals is characterized by two or more nanocrystals, which may be the same or different, and which are fused to each other directly via at least one of their surface regions. The assembly may be a dimer of two such nanocrystals, a trimer of three nanocrystals or a higher homologue comprising four or more nanocrystals. Where the nanocrystals in the assembly are all identical in composition, shape, and size, the assembly may be regarded as a homo-multimer (a homodimer, a homo-trimer, etc), and where the assembly comprises nanocrystals that are different in at least one of composition, crystals structure, shape, and size, the assembly may be regarded as a hetero-multimer (a hetero-dimer, a hetero-trimer, etc).

The assembly may be of any shape, as defined, and would depend on the number of nanocrystals making up the assembly. As shown below, where the assembly is a dimer, namely comprises two nanocrystals, the two nanocrystals are fused to each other through a surface region that defines the ability of the dimer to demonstrate electronic coupling. Where the assembly comprises three or more nanocrystals, the nanocrystal may be arranged or fused to each other in a linear fashion, in a cyclic fashion, in an angular fashion, in a zigzag fashion, in spiral fashion or in any other substantially 2D or 3D pattern. Typically, in an assembly comprising three or more nanocrystals, each nanocrystal has a single fusion point or surface with another nanocrystal in the assembly. In some embodiments, the assembly is linear or substantially linear.

In some embodiments, the coupled system could be identified by the splitting of the energy level due to hybridization. Non-limiting examples are low-temperature spectroscopy, response to an electric field, and binding of chiral ligands.

Non-limiting examples of dimers and multimers according to the invention are listed in Table 1 below.

| Nano-assembly | Nanocrystal 1 | Nanocrystal 2 | Nanocrystal 3 | Nanocrystal 4 | Material of the Fusion Region |
|---|---|---|---|---|---|
| 1 | CoreA/shellB | CoreA/shellB | — | — | B |
| 2 | CoreA/shellB | CoreC/shellD | — | — | B + D |
| 3 | CoreA/shellB | QD | CoreC/shellD | — | B (between CoreA and QD) and D (between QD and CoreC), wherein shell material B and shell material D may be the same or different |
| 4 | CoreA/shellB | CoreC/shellD | QD | — | B + D (between CoreA and CoreC) and D (between QD and CoreC), wherein shell material B and shell material D may be the same or different |
| 5 | QD1 | CoreA/shellB | QD2 | — | B (between CoreA and QD1) and B (between QD2 and CoreA), wherein QD1 and QD2 are different in composition |
| 6 | CoreA/shellB | QD1 | QD2 | — | B (between CoreA and QD1), wherein QD1 and QD2 are different in size, shape or composition |
| 7 | CoreA/shellB | CoreC/shellD | CoreE/shellF | — | B + D (between CoreA and CoreC) and D + F (between CoreC and CoreE), wherein shell material B, shell material D and shell material F, may be the same or different |
| 8 | CoreA/shellB | CoreC/shellD | CoreE/shellF | — | B + D (between CoreA and CoreC), D + F (between CoreC and CoreE) and B + F (between CoreA and CoreE), wherein shell material B, shell material D and shell material F, may be the same or different |
| 9 | CoreA/shellB | CoreC/shellD | QD1 | QD2 | B + D (between CoreA and CoreC), D (between CoreC and QD1), wherein shell material B and shell material D may be the same or different. |
| 10 | CoreA/shellB | QD1 | CoreC/shellD | QD2 | B (between CoreA and QD1), D (between CoreC and QD1) and D (between CoreC and QD2), wherein shell material B and shell material D may be the same or different. |
| 11 | CoreA/shellB | QD1 | QD2 | CoreC/shellD | B (between CoreA and QD1) and D (between CoreC and QD2), wherein shell material B and shell material D may be the same or different. |
| 12 | QD1 | CoreA/shellB | QD2 | CoreC/shellD | B (between CoreA and QD1), B (between CoreA and QD2) and D (between CoreC and |

-continued

| Nano-assembly | Nanocrystal 1 | Nanocrystal 2 | Nanocrystal 3 | Nanocrystal 4 | Material of the Fusion Region |
|---|---|---|---|---|---|
| 13 | QD1 | CoreA/shellB | CoreC/shellD | QD2 | QD2), wherein shell material B and shell material D may be the same or different. B (between CoreA and QD1), B + D (between CoreA and CoreC), and D (between CoreC and QD2), wherein shell material B and shell material D may be the same or different. |
| 14 | CoreA/shellB | CoreC/shellD | CoreE/shellF | QD | B + D (between CoreA and CoreC), D + F (between CoreC and CoreE), and F (between CoreE and QD), wherein shell material B, shell material D and shell material F, may be the same or different |
| 15 | CoreA/shellB | CoreC/shellD | QD | CoreE/shellF | B + D (between CoreA and CoreC) and D (between QD and CoreC) and F (between QD and CoreE), wherein shell material B, shell material D and shell material F, may be the same or different |
| 16 | CoreA/shellB | CoreC/shellD | CoreE/shellF | CoreG/shellH | B + D (between CoreA and CoreC), D + F (between CoreC and CoreE) and F + H (between CoreE and CoreG), wherein shell material B, shell material D, shell material F and shell material H, may be the same or different |
| 17 | CdSe/CdS | CdSe/CdS | — | — | CdS |
| 18 | CdSe/CdS | CdSe/CdS/ZnS | — | — | ZnS-CdS or CdS-ZnS-CdS |
| 19 | CdSe/CdS/ZnS | CdSe/CdS/ZnS | — | — | ZnS or CdS-ZnS-CdS |
| 20 | CdSe/CdS | InP/ZnS | — | — | ZnS-CdS |
| 21 | InP/ZnS | InP/ZnS | — | — | ZnS |
| 22 | CdTe/CdS | ZnSe/CdS | — | — | CdS |
| 23 | InP/ZnS | CdSe/CdS/ZnS | — | — | ZnS or ZnS-CdS |
| 24 | ZnSe/ZnS | ZnSe/ZnS | — | — | ZnS |
| 25 | InAs/CdSe/ZnSe | InAs/CdSe/ZnSe | — | — | ZnSe or CdSe-ZnSe-CdSe |
| 26 | InAs/InP/ZnS | InAs/InP/ZnS | — | — | ZnS or InP-ZnS-InP |
| 27 | InAs/CdSe/CdS | InAs/CdSe/CdS | — | — | CdS or CdSe-CdS-CdS |
| 28 | CdSe/CdS/HgS | CdSe/CdS/HgS | — | — | HgS or CdS-HgS-CdS |
| 29 | InAs/GaAs | InAs/GaAs | — | — | GaAs |
| 30 | GaP/ZnS | ZnO/ZnS | — | — | ZnS |
| 31 | ZnO/ZnS | ZnSe/ZnS | — | — | ZnS |
| 32 | ZnSe/ZnS | ZnO/ZnS | — | — | ZnS |
| 33 | InGaP/ZnS | InGaP/ZnS | — | — | ZnS |
| 34 | InGaP/ZnSe | InGaP/ZnSe | — | — | ZnSe |
| 35 | InP/ZnSe | InP/ZnSe | — | — | ZnSe |
| 36 | InAs/ZnSe | InAs/ZnSe | — | — | ZnSe |
| 37 | InAs/ZnS | InAs/ZnS | — | — | ZnS |
| 38 | CdSe/CdS | CdSe/CdS | CdSe/CdS | — | CdS |
| 39 | CdSe/CdS | CdSe/CdS | CdSe/CdS | CdSe/CdS | CdS |
| 40 | CdSe/CdS/ZnS | CdSe/CdS/ZnS | CdSe/CdS/ZnS | — | ZnS or CdS-ZnS-CdS |
| 41 | CdSe/CdS/ZnS | CdSe/CdS/ZnS | CdSe/CdS/ZnS | CdSe/CdS/ZnS | ZnS or CdS-ZnS-CdS |
| 42 | CdTe/CdS | ZnSe/CdS | CdTe/CdS | ZnSe/CdS | CdS (barrier for holes) |
| 43 | CdTe/CdS | CdTe/CdS | CdTe/CdS | CdTe/CdS | CdS (barrier for holes) |
| 44 | ZnSe/CdS | ZnSe/CdS | ZnSe/CdS | ZnSe/CdS | CdS (barrier for holes) |
| 45 | CdTe/CdS | ZnTe/CdS | — | — | CdS (barrier for holes only) |

-continued

| Nano-assembly | Nanocrystal 1 | Nanocrystal 2 | Nanocrystal 3 | Nanocrystal 4 | Material of the Fusion Region |
|---|---|---|---|---|---|
| 46 | CdTe/CdS | ZnTe/CdS | CdTe/CdS | ZnTe/CdS | CdS (barrier for holes) |
| 47 | ZnSe/CdS | ZnSe /CdS | — | — | CdS (barrier for holes only) |
| 48 | ZnSe/CdS | ZnSe/CdS | ZnSe/CdS | ZnSe /CdS | CdS (barrier for holes) |
| 49 | ZnTe/CdS | ZnTe/CdS | ZnTe/CdS | ZnTe/CdS | CdS (barrier for holes) |
| 50 | ZnSe/ZnTe | ZnSe/ZnTe | — | — | ZnTe (barrier for electrons) |
| 51 | ZnSe/ZnTe | ZnSe/ZnTe | ZnSe/ZnTe | ZnSe/ZnTe | ZnTe (barrier for electrons) |
| 52 | CdTe/ZnTe | CdTe/ZnTe | — | — | ZnTe (barrier for electrons) |
| 53 | CdTe/ZnTe | CdTe/ZnTe | CdTe/ZnTe | CdTe/ZnTe | CdTe (barrier for holes) |
| 54 | ZnSe/ZnS | ZnSe/ZnS | ZnSe/ZnS | ZnSe/ZnS | ZnS |
| 55 | InP/CdS | InP/CdS | — | — | CdS |
| 56 | InP/CdS | InP/ZnS | — | — | CdS-ZnS |
| 57 | InP/CdS | InP/CdS | InP/CdS | — | CdS |
| 58 | InP/CdS | InP/CdS | InP/CdS | InP/CdS | CdS |
| 59 | PbSe/CdS | CdSe/CdS | — | — | CdS |
| 60 | PbSe/CdS | PbSe/CdS | PbSe/CdS | PbSe/CdS | CdS |
| 61 | InAs/CdS | CdSe/CdS | — | — | CdS |
| 62 | InAs/CdS | ZnSe/CdS | — | — | CdS |
| 63 | InAs/CdS | InAs/CdS | InAs/CdS | InAs/CdS | CdS |
| 64 | PbSe/CdS | InAs/CdS | — | — | CdS |
| 65 | InP/ZnS | InP/ZnS | InP/ZnS | — | ZnS |
| 66 | InP/ZnS | InP/ZnS | InP/ZnS | InP/ZnS | ZnS |
| 67 | PbSe/ZnS | CdSe/ZnS | — | — | ZnS |
| 68 | PbSe/ZnS | PbSe/ZnS | PbSe/ZnS | PbSe/ZnS | ZnS |
| 69 | InAs/ZnS | CdSe/ZnS | — | — | ZnS |
| 70 | InAs/ZnS | InAs/ZnS | InAs/ZnS | InAs/ZnS | ZnS |
| 71 | PbSe/ZnS | InAs/ZnS | — | — | ZnS |
| 72 | ZnO/CdS | ZnSe/CdS | — | — | CdS, Type II |
| 73 | ZnO/CdS | CdTe/CdS | — | — | CdS, Type II |
| 74 | ZnO/CdS | ZnTe/CdS | — | — | CdS, Type II |
| 75 | InP/ZnSe | InP/ZnSe | InP/ZnSe | — | ZnSe |
| 76 | InP/ZnSe | InP/ZnSe | InP/ZnSe | InP/ZnSe | ZnSe |
| 77 | ZnSe/ZnS | ZnSe/ZnS | — | — | ZnS |
| 78 | ZnSe/ZnS | ZnSe/ZnS | ZnSe/ZnS | ZnSe/ZnS | ZnS |
| 79 | ZnSe/ZnS | CdSe/ZnS | — | — | ZnS |
| 80 | InAs/CdS | InAs/CdS | — | — | CdS |
| 81 | InAs/CdS | InAs/CdS | InAs/CdS | InAs/CdS | CdS |
| 82 | InAs/CdTe | InAs/CdTe | — | — | CdS |
| 83 | InAs/CdTe | InAs/CdTe | InAs/CdTe | InAs/CdTe | CdTe |
| 84 | GaAs/ZnS | GaAs/ZnS | — | — | ZnS |
| 85 | GaAs/ZnS | GaAs/ZnS | GaAs/ZnS | GaAs/ZnS | ZnS |
| 86 | GaAs/CdS | GaAs/CdS | — | — | CdS |
| 87 | GaAs/CdS | GaAs/CdS | GaAs/CdS | GaAs/CdS | CdS |
| 88 | GaAs/ZnSe | GaAs/ZnSe | — | — | ZnSe |
| 89 | GaAs/ ZnSe | GaAs/ZnSe | GaAs/ZnSe | GaAs/ZnSe | ZnSe |
| 90 | GaAs/GaP | GaAs/GaP | — | — | GaP |
| 91 | GaAs/GaP | GaAs/GaP | GaAs/GaP | GaAs/GaP | GaP |
| 92 | CdSe/CdS | CdSe | CdSe/CdS | — | CdS |
| 93 | CdSe/ZnS | CdSe | CdSe/ZnS | — | ZnS |
| 94 | ZnSe/ZnS | ZnSe | ZnSe/ZnS | — | ZnS |
| 95 | InP/ZnSe | InP | InP/ZnSe | — | ZnSe |
| 96 | Au/ZnO | ZnS/ZnO | — | — | ZnO |
| 97 | Ag/ZnO | Ag/ZnO | — | — | ZnO |
| 98 | Au/ZnS | ZnSe/ZnS | — | — | ZnS |
| 99 | Ag/ZnS | ZnSe/ZnS | — | — | ZnS |
| 100 | Au/ZnS | Au/ZnS | — | — | ZnS |
| 101 | Ag/ZnO | Ag/ZnO | — | — | ZnO |
| 102 | Au/ZnS | Au/ZnS | Au/ZnS | — | ZnS |
| 103 | Ag/ZnO | Au/ZnO | Ag/ZnO | Au/ZnO | ZnO |
| 104 | Cu/CdS | CdSe/CdS | — | — | CdS |
| 105 | Au/ZnS | InP/ZnS | — | — | ZnS |
| 106 | $Cu_2ZnSnS_4$/ZnS | $Cu_2ZnSnS_4$/ZnS | — | — | ZnS |
| 107 | ZnS(P-doped)/ZnO | ZnS(N-doped)/ZnO | — | — | ZnO |
| 108 | ZnS(P-doped)/ZnSe | ZnS(N-doped)/ZnSe | — | — | ZnSe |
| 109 | Pd/$Ag_2S$ | Pt/Ag2S | — | — | $Ag_2S$ |
| 110 | InP(N-doped)/ZnS | InP(P-doped)/ZnS | — | — | ZnS |
| 111 | InAs(N-doped)/ZnSe | InAs(P-doped)/ZnSe | — | — | ZnSe |

The dimers and other listed multimers may be similarly used to construct higher homologs with other core/shell or non-core/shell structures.

Homo- and hetero-dimers are depicted in FIG. 1. As shown, the dimers may comprise two nanocrystals of the same size core, may be constructed of two cores of different sizes, may be in the form of a core/shell comprising one or more shell(s) (core@shell$_1$@shell$_2$), wherein the cores may be same or different in size and composition, may be a heterodimer wherein the cores are of the same size but different compositions, or may be a heterodimer wherein the cores are of different sizes and different compositions.

Assemblies of the invention may be prepared by a variety of methods. Generally speaking, they are prepared bottom-up on a substrate region by fusing one nanocrystal onto another, giving rise to nanocrystal assemblies comprising two or more fused nanocrystals.

In an exemplary process according to the invention, a first nanocrystal population is immobilized on a surface region of a substrate, e.g., a nanoparticle surface, surface regions of the immobilized nanocrystals of the first nanocrystal population are chemically grafted by ligand molecules and contacted with nanoparticles of a second nanocrystal population to thereby conjugate nanocrystals of the second nanocrystal population to the immobilized nanocrystals and obtain a dimer assembly on the surface region of the substrate. The process steps may be repeated again to associate/conjugate nanocrystals of a further population to obtain nanocrystal multimer assemblies.

Thus, the invention further provides a substrate decorated with an assembly of the invention, wherein each nanocrystal in the assembly is associated with another nanocrystal in the assembly via a plurality of ligand molecules.

The nanocrystal assembly may be released from the substrate by e.g., etching the surface of the substrate employing any etching method known in the art; e.g., by selective release of the binding ligands between the substrate and the fused nanocrystal molecule; or by breaking one of the bonds along the molecular chain connecting the nanocrystal surface and the substrate. Non-limiting examples include breaking or releasing the ligand by chemical reactions such as hydrolysis, change in the environmental conditions such as pH or in response to a physical trigger, such as light, resulting in photodissociation.

The association between the two or more nanocrystals in the released assembly may thereafter be strengthened by fusing the nanocrystals to form a chemically fused assembly of nanocrystals comprising two or more nanocrystals, as defined. Fusion may be achieved chemically or by application of heat or pressure (e.g. by physical means, including for example thermal means or by application of pressure), to result in a material neck or surface that associates by fusing any two nanocrystals.

The substrate on the surface of which assemblies of the invention are formed may be of any material provided that association between the first nanocrystals and the surface material may be formed directly or via ligand molecules. The surface may be of a planar substrate or a 3D substrate. In some embodiments, the surface is a surface region of a particle such as a nanoparticle or a microparticle. In some embodiments, the nanoparticle is not a nanocrystal.

In some embodiments, the process comprises
immobilizing on a surface region of a substrate a plurality of nanocrystals of a first population;
chemically grafting ligand molecules onto the immobilized nanocrystals of the first population; and
contacting the ligand grafted immobilized nanocrystals of the first population with nanocrystals of a second population to thereby associate/conjugate nanocrystals of the second population to the immobilized nanocrystals and obtain a dimer assembly on the surface region of the substrate.

In some embodiments, nanocrystals of a third population may be associated to the nanocrystals of the second population (and/or the first population), by grafting ligands on the surface of the nanocrystals of the second population (and/or the first population) to thereby afford a trimer or a multimer comprising a multiple number of same or different nanocrystals.

In some embodiments, the dimer assembly or a trimer assembly, or a tetramer assembly, and so forth, is optionally further chemically grafted with ligand molecules and contacted with nanocrystals of a further population to obtain nanocrystal multimer assemblies. The ligand grafting and contacting with a further nanocrystals population may be repeated as many times as may be desired to obtain a multimer assembly of a desired length, size, shape and/or composition.

The nanocrystals making up the first nanocrystal population may be the same, namely, the population may be homogeneous, selected to have the same size, shape, architecture, and composition, or may be heterogeneous whereby the nanocrystals are not identical in each of size, shape, architecture, and composition. Typically, the nanocrystals of the first population share at least one of size, shape, architecture, and composition, or are all identical.

The nanocrystals of the second population may be identical to those of the first population or may be different therefrom in at least one of size, shape, architecture, and composition.

Where a multimer arrangement is desired, each of the nanocrystal populations used may be identical or different in at least one of size, shape, architecture, and composition.

In some embodiments, the surface region is grafted with ligand molecules to enable immobilization of the nanocrystals through ligand association.

In some embodiments, the dimer assembly or a multimer assembly is etched off the surface of the substrate to obtain a dimer assembly or a multimer assembly that is surface unbound.

In some embodiments, the unbound dimer or multimer assembly may be treated under conditions permitting chemical fusion of any two nanocrystals in the assembly.

Fusion may be achieved chemically by a precursor-selected growth on the boundary between the bound or associated or conjugated nanocrystals or physically (e.g. by light, thermally or by pressure). Where fusion may be achieved by an energy source such as light, heat or pressure, fusion of any two nanocrystals results in a "material marriage" of the two materials present on the outer most surfaces of the nanocrystals undergoing fusion, e.g., shell materials in case of core/shell structures. At a material region defining a point of fusion of two nanocrystals, e.g., two core/shell structures, the shell materials are mixed to form a material bridge that is defined by the mixture of materials in case the shell materials are different. In fusing the shell materials together, the core materials are not affected.

Where fusion is achieved chemically, a material of choice or a precursor thereof may be used to form a material bridge between the two nanocrystals. This may be achieved by material growth at the interface between the two nanocrystals or by material deposition. The material of choice may be a precursor of the shell material or a precursor of a different material that is used to construct the fusion region between the nanocrystals.

The point of fusion of the nanocrystals defines the ability to control electronic coupling. The size or thickness of the fusion region, as defined herein, is the distance between any two cores. In some embodiments, the distance between a core/shell structure and a nanocrystal fused thereto may range between 0.1 and 5 nm. The distance may be equal to a shell thickness thus being in the range of between 0.1 and 0.6 nm, or may be equal to a two-shell thickness, thus in the range of 0.2 and 1.5 nm. Greater distances may be achieved in case the shell thickness is greater or in case chemical fusion introduces a material causing a greater distance.

A process of the invention may comprise one or more additional steps such as:
- obtaining nanocrystals of a first and/or second and/or further nanocrystal population(s); and/or
- obtaining a nanoparticle for forming on its surface a multimer assembly according to the invention; and/or
- pre-treating a surface region of a substrate material onto which a multimer assembly is to be formed; and/or
- separating (or purifying) a population of multimer assemblies from the nanocrystal monomers;
- forming a shell or a coat on a surface or surface region of a multimer assembly according to the invention; and/or
- performing additional synthesis, such as metal growth on the fused nanocrystal molecules.

In some embodiments, the multimers obtained by a process of the invention may be purified from the nanocrystal monomers by any separation method known in the art, including, but not limited to, size-selective precipitation, density gradient separation, and others. In some embodiments, dimer assemblies may be separated from monomer nanocrystals or from higher multimers by employing any of the separation methods.

In some embodiments, the substrate is a nanoparticle such as a $SiO_2$ nanoparticle. In some embodiments, the $SiO_2$ nanoparticle is of a size of between 50 and 300 nm. In some embodiments, the coated $SiO_2$ nanoparticle is grafted with surface bifunctional ligand molecules capable of attaching to the surface of the nanoparticle from one end and to the nanocrystal or to the ligand on its surface on the other end. Such bifunctional molecules may be thiol or disulfide molecules having silane functionalities, e.g., (3-mercaptopropyl)trimethoxysilane (MPTMS) or any other ligand used and known in the art.

Colloidal coupled quantum materials with high control over composition and size of the fusion region between them hold great potential for tuning their optical and electrical properties, making them applicable for various applications including light-emitting devices, elements in displays, photovoltaics, quantum gates, biomedical sensors, and so on. Thus, the invention also provides a method of controlling at least one of size and composition of a fusion region between two coupled or fused nanocrystals in an arrangement according to the invention. The method permits control over size, thickness or distance between the two nanocrystal such that, for example, hybridization and quantum coherence effects take place.

The invention thus provides a process for the preparation of fused nanocrystal molecules according to the invention, which comprises
- immobilizing on a surface region of a substrate a plurality of quantum dots (QD);
- chemically grafting ligand molecules onto the immobilized QD;
- etching said substrate (or releasing the ligand from the substrate or breaking a bond along the molecular chain connecting the nanocrystal to the substrate), to release the plurality of ligand grafted (Janus) QDs;
- allowing dimerization to thereby obtain the associated nanocrystals;
- fusion the associated nanocrystals to form a fused nanocrystal molecule.

The dimerization of Janus particles can be homodimerization in case the hemisphere of the nanocrystal attached to the substrate has affinity to similar surfaces of other release particles. Non-limiting examples include Janus nanocrystals with hydrophobic/hydrophilic nature producing dimers through hydrophobic-hydrophobic interactions or hydrophilic-hydrophilic interactions.

Heterodimers can be produced in a similar way by repeating this process at least twice, each time producing a different but complementary Janus particles which upon their release and mixture produce the dimers. Non-limiting examples involve producing Janus particles with complementary acid-base ligands or positively-negatively charged ligands.

In some embodiments, the QDs of the first population are grafted with a plurality of hydrophobic ligands prior to immobilization on the substrate. The hydrophobic ligands may be a mixture of oleylamine (OAm) and oleic acid (OA).

In some embodiments, immobilization of the QDs of the first population occurs via thiol groups present on the surface of the substrate. As above, the surface may be the surface of $SiO_2$.

In some embodiments, etching is achieved by contacting the immobilized QDs with a solution of HF/NMF. Upon etching, the released QDs are characterized by a surface region having hydrophobic ligands and another surface region having hydrophilic ligands. Association of QDs of the second population with the released Janus QDs of the first population occurs via the hydrophobic surface region.

Fusion of the dimer may be achieved as discussed above.

In some embodiments, fusion is achieved thermally, optionally in the presence of a precursor material selected to form a material bridge between the two QDs in the dimer.

The invention further provides another process for the preparation of fused nanocrystal molecules according to the invention. Accordingly, the process comprises
- adding a solution of ligands in a first liquid to a suspension of ligand-grafted QDs in a second liquid, wherein the first liquid and second liquid are immiscible, allowing ligand exchange;
- allowing dimerization of the QDs by homo or heterodimerization to thereby obtain nanocrystal association; and
- fusion of the nanocrystals to form the fused nanocrystal molecules.

The invention provides a further process for the preparation of the fused nanocrystal molecules according to the invention. Accordingly, the process comprises
- mixing a first nanocrystal population optionally grated with ligand molecules with a second nanocrystal population decorated with a linking group to the first nanocrystal or to the ligand molecules on their surfaces;
- fusion of the nanocrystals to form the fused nanocrystal molecules.

The invention further provides a process for directing attachment of a first nanocrystal to a preselected region of a second nanocrystal, the process comprising
- blocking a reactive region on the surface of the second nanocrystal;

directing fusion to the preselected region (being different from the blocked region) of the second nanocrystal;

allowing fusion between the first and second nanocrystal; and optionally de-blocking the reactive region;

to thereby obtain a fused nanocrystal molecule.

In some embodiments, wherein the first and second nanocrystal are core/shell structures.

In some embodiments, the process is used for direct attachment of two or more nanocrystals.

Processes of the invention, resulting in fused systems, as defined, may further include one or more post-production steps which involves treatment of the fused systems to permit conjugation, surface coating, islands growth, further coating by a metallic or non-metallic material, cation exchange enabling formation of other nanocrystals, or generally to render the systems reactive or susceptible for further manipulation. Thus, processes of the invention further provide modified fused systems that are, e.g., conjugated, surface-associated, surface decorated, etc.

In all processes of the invention, unless otherwise indicated, the nanocrystal may be a semiconductor core/shell structure or a core/shell structure wherein the core or shell are composed of a metallic material.

In assemblies of the invention, where the nanocrystal is a core/shell structure, electronic coupling can be tuned and determined by the thickness and composition of the shell; and the shape, size, and composition of the core can be engineered for achieving electronic coupling of the two nanocrystals, such that the fused or coupled nanocrystals are tailored to meet one or more pre-requisites for optoelectronic applications as in displays, bio-medical applications, optoelectronic devices, and photocatalysis.

Thus, the invention further provides a device composing a fused nanocrystal molecule or an assembly according to the invention. The device may be selected from optical devices, electro-optical devices and devices for photocatalytic applications. Such devices may be dual-color single-photon sources, light-emitting diode (LED) devices, nanocrystal lasers, photodetectors, solar cells, liquid crystal display (LCD) screens, electric field sensors, entangled state generator, one-bit rotation gates and two-bit control not (CNOT) gates, quantum cascade laser (QCL), data storage devices, components in electronic device, reactive species generator, hydrogen peroxide generator, hydrogen gas generator, photoelectrochemical electrodes, photocatalytic electrodes, photoredox electrodes, sensors based on photoredox, photoelectrochemical or photocatalytic reactions, water purification device and waste consumption device.

In some embodiments, the device comprises a type I, reverse type I, quasi-type II or type II heterostructure.

In some embodiments, the device comprises a heterostructure according to the invention for enhancing reduction by electron transfer.

In some embodiments, the device comprises a heterostructure according to the invention for use in enhancing oxidation by hole transfer.

In some embodiments, the device comprises a heterostructure according to the invention for use in enhancing charge transfer to an electrode.

In some embodiments, the device comprises a heterostructure according to the invention for enhancing the extraction of charge carriers to an electrode or molecular species in the solution.

In some embodiments, the device is for use in methods of photo-catalysis or photo-redox reactions.

In some embodiments, the device comprises a heterostructure according to the invention for use in photo-electrochemical reactions.

In some embodiments, the device comprises a heterostructure according to the invention for use in photo-catalysis for water splitting.

In some embodiments, the device comprises a heterostructure according to the invention for use in enhancing the formation of reactive species.

In some embodiments, the device comprises a heterostructure according to the invention for use in enhancing the formation of reactive oxygen species.

In some embodiments, the device comprises a heterostructure according to the invention for use in photo-decomposition of organic molecules.

In some embodiments, the device comprises a heterostructure according to the invention for use in photodynamic therapy.

In some embodiments, the device comprises a heterostructure according to the invention for use in antibacterial disinfection.

The invention further provides a photocatalyst in the form of a heterostructure according to the invention.

Also provided is a photoinitiator in the form of a heterostructure according to the invention, the photoinitiator being suitable for use in e.g., photocuring and 3D printing applications.

Further provided is a fused nanocrystal molecules, as defined, exhibiting emission form multicarrier configurations beyond excitonic emission.

Further provided are fused nanocrystals exhibiting triexciton or trion states, and devices implementing such systems.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIGS. 3A-3I provide quantum dots characterization. TEM micrographs, absorption and photoluminescence spectra of different sizes of CdSe/CdS core-shell CQDs: (FIGS. 3A-C) 1.9/4.0 nm, (FIGS. 3D-F) 1.4/2.1 nm, and (FIGS. 3G-I) 1.2/2.1 nm.

(FIG. 4I) High-resolution HAADF-STEM image and atomic structure model (FIG. 4J) of CdSe/CdS CQD viewed under ZA [1210]. The core regions are marked with pink circles in (FIG. 4G) and (FIG. 4I). FFT patterns are inserted in (FIG. 4G), and (FIG. 4I). SAED (FIG. 4K) and XRD pattern acquired at large ensembles of CdSe/CdS CQDs (blue curve—experimental XRD data, red bars—theoretical positions for diffraction peaks of hcp) CdS (JCPDF 04-001-6853), black curve—integrated intensity of SAED (FIG. 4K)).

FIGS. 5A-5L provide CdSe/CdS @ $SiO_2$ characterized with electron microscopy. TEM and SEM images acquired at different magnification of the CdSe/CdS @ $SiO_2$ NPs produced with different loading ratios of (FIG. 5A-D) 1:2000, (FIG. 4E-H) 1:1000, and (FIG. 4I-L) 1:500. Scale bars are 100 nm.

FIGS. 6A-6L provide TEM and SEM images acquired at different magnification of the $SiO_2$@CdSe/CdS@$SiO_2$ NPs produced with different amount of TEOS for masking (FIG. 6A-D) 200, (FIG. 6E-H) 100, and (FIG. 4I-L) 50 μL. Scale bars are 100 nm.

FIGS. 7A-7B provide TEM images of the $SiO_2$@homodimer particles.

FIGS. 8A-8E provide coupled CQDs molecules. (FIG. 8A) Scheme for fabrication of coupled CdSe/CdS CQD molecule. (FIG. 8B) The dimer@$SiO_2$ CQD structure. The dimer 1.9/4.0 nm CQD molecules (FIG. 8C) before, and (FIG. 8D) after the fusion procedure. (FIG. 8E) The 1.4/2.1 nm fused CdSe/CdS CQD molecules. Schematic structures are illustrated. Scale bars (FIG. 8B-E) are 50 nm and insets show higher magnification images.

FIGS. 9A-9C provide HAADF-STEM (FIG. 9A), line scan (FIG. 9B) and STEM-EDS (FIG. 9C) analysis of the coupled CdSe—CdS molecules.

FIGS. 10A-10D provide HRTEM (FIG. 10A), Fast Fourier transform reconstruction imaging (FIG. 10B), electron diffraction (ED) pattern (FIG. 10C), and coupling model (FIG. 10D) of the coupled CdSe—CdS molecules with [010] zone axis. While the white arrow was the c-axis for the QDs and insets show zoom-in on regions of the different orientation (Cd atoms are marked with grey and S atoms in dark grey).

FIGS. 11A-11K provide fusion orientation relationships in CQD molecules. Atomic structure model (FIG. 11A, D; cadmium atoms—brown, sulfur atoms—blue.), HAADF-STEM images (FIG. 11B, E), and FFT patterns (FIG. 11C, F) of the homo-plane (FIG. 11A-C) and hetero-plane (FIG. 11D-F) attachment of coupled CQD molecules with orientation relationship of attachment on (1010)∥(1010) and (0002)∥(1011), respectively. The HAADF-STEM (FIG. 11G, I) and atomic structure model (FIG. 11H, J) of homo-plane attachment on (0002), and (1011) facets, respectively. Dashed orange arrows indicate the CQD fusion/molecular axis in plane of the image normal to projection ZA [1210]. Note that for (1010)∥(1010) homo-plane attachment, the homonymous (1010) faces of A1 and A2 are parallel (FIG. 11C), while for the hetero-plane attachment the heteronymous faces are parallel (0002)∥(1010) (FIG. 11C). (FIG. 11K) Distribution of observed homo- and hetero-plane attachment orientations on (1010), (0002), and (1011) faces. Inset shows the CQD model and faces.

FIGS. 12A-12D provide HAADF-STEM images and atomic structure models of the fused 1.9/4.0 nm CdSe/CdS molecules with hetero-plane attachment of (1010)∥(1011) (FIG. 12A-B), (0002)∥(1011) (FIG. 12C-D). For the atomic model, the Cadmium atoms are marked in brown and Sulfur atoms in blue.

FIGS. 13A-13D provide characterization of 1.4/2.1 nm CQDs molecule. Fourier filtered HAADF-STEM images of the coupled CdSe/CdS molecules with homo-plane attachment of (0002)∥(0002) (FIG. 13A) and hetero-plane attachment of (1010)∥(1011) faces (FIG. 13B). (FIG. 13C) EDS line scan data and (FIG. 13D) STEM-EDS analysis.

FIGS. 16A-16G provide the normalized absorption spectra of monomers (blue), unfused (green), and fused 1.4/2.1 nm CdSe/CdS CQD molecules when normalized with respect to (FIG. 16A) band-edge peak and (FIG. 16B) bulk transitions (300 nm). (FIG. 16C) The potential energy landscape and a cross-section of the calculated first electron wave-function without Coulombic interaction $\Psi_e$ (red), with Coulombic interaction $\Psi_e$ (green) and of the hole wave-functions $\Psi_h$(blue) of the coupled CQD molecules. (FIG. 16D) Calculated bonding and antibonding 2-dimensional electron wave-functions without (cross-section of the bonding state is the red curve in FIG. 16A), and (FIG. 16E) with Coulombic interaction (cross-section of the bonding state is the green curve in FIG. 16A). (FIG. 16F) Absorption and fluorescence spectra of monomers (blue), unfused (green), and fused 1.4/2.1 nm CdSe/CdS CQD molecules (red). (FIG. 16G) Calculated (red asterisk) and experimental (blue circles) bandgap red shift of monomer-to-respective-homodimer structures for CQD molecules with different core/shell dimensions.

FIGS. 17A-17C provide a representative photoluminescence lifetime decay data at (FIG. 17A) ensemble and (FIG. 17B) single particle level for monomer, unfused dimer and fused dimer composed of 1.4/2.1 nm CQD (FIG. 17C) Histograms summarizing the distribution of the average lifetimes from single particle data for all three types of particles. Further shortening of the lifetime for dimer is observed upon fusion.

FIGS. 18A-18B provides a time-tagged, time-resolved data for single (FIG. 18A) CQD monomer and (FIG. 18B) fused dimer. Shown are, (i) photoluminescence intensity time trace, (ii) second-order photon correlation and (iii) lifetime for the single-particle (the light grey and dark grey lifetime curves were generated from data shaded in the same color in the corresponding time traces).

(FIG. 19A) A bimodal on-off distribution of the intensity was found (bin-50 ms). The black curve represents the background noise. (FIG. 19B) Fluorescence lifetime of the on-state follows a single exponential decay of 31 ns. (FIG. 19C) Strong photon antibunching with $g^2$ value of 0.09. All these observations for the fusion protocol treated monomer are highly correlated with the untreated monomer particle as explained in the previous section.

FIGS. 21A-21D provide a TEM imaging of homodimer@SiO$_2$ (FIG. 21A) and homodimer NCs after etching and release procedure (FIG. 21B). HRTEM and STEM of coupled homodimer QDs after the fusion procedure (FIG. 21C and FIG. 21D, respectively).

FIGS. 22A-22B provide TEM imaging of SiO$_2$@heterodimers.

FIGS. 26A-26H provide a HAADF-STEM image (FIG. 26A), Fast Fourier transform reconstruction imaging (FIG. 26B), electron diffraction (ED) pattern (FIG. 26C) on [110] zone axis. HAADF-STEM image of other types of coupled ZB for hetero-orientation attachment CdSe—CdS molecules (FIGS. 26D-E). Inset shows the model of the dimer QDs structure. The SAED of the ZB CdSe—CdS CQDs (FIG. 26F). HAADF-EDS line scan data (FIG. 26G) and STEM-EDS (FIG. 26H) analysis of the coupled ZB tip attachment CdSe/CdS molecules.

(FIG. 28A) The wave-functions of the first electronic state (symmetric state) of specific points on the contour graphs 2d-f. core diameter/barrier thickness 2.8 nm/0.9 nm, 2.8 nm/8 nm, 4 nm/5 nm, 5 nm/0.9 nm and 5 nm/8 nm in: (FIG. 28A) 0 eV conduction band offset, (FIG. 28B) 0.1 eV conduction band offset and (FIG. 28C) 0.32 eV conduction band offset.

(FIG. 29A) Energy difference between the symmetric and anti-symmetric states as a function of the neck diameter. The blue curve refers to 0.1 eV conduction band offset, and the red curve refers to 0.32 eV conduction offset. Inset: the dimensions considered in the calculation. (FIG. 29B) The wave-functions of the symmetric (bottom) and the anti-symmetric (top) electronic states and the energy difference between them in three points: B1, B2, and B3 which refers to 1.5 nm, 4 nm, and 6.2 nm neck thickness, respectively (0.1 eV band offset). (FIG. 29C) The wave-functions of the symmetric (bottom) and the anti-symmetric (top) electronic states and the energy difference between them in three points C1, C2 and C3 corresponding to 1.5 nm, 4 nm, and 6.2 nm neck thickness, respectively (0.32 eV band offset).

FIGS. 30A-30F depict the excitonic behavior for the CQDM. (FIG. 30A) The overlap integral between the first electron and hole wave-function after applying the Coulomb interaction as a function of the core diameter for the dimer (dashed line) and the monomer (solid line), considering 0.32 eV (red) and 0.1 eV (blue) conduction band offset. (FIG. 30B) The Coulomb energy $C_d$ of the dimer (dashed line) and monomer $C_m$ (solid line), in 0.32 eV (red) and 0.1 eV (blue) conduction band offset as a function of the core diameter. (FIG. 30C) The difference between the monomer and dimer coulomb energy $\Delta E_c$ (solid line) and the fusion energy $\Delta E_f$ (dashed line) in 0.32 eV (red) and 0.1 eV (blue) conduction band offset as a function of the core diameter. (FIG. 30D) The emission redshift between the monomer and dimer in 0.32 eV (red) and 0.1 eV (blue) conduction band offset as a function of the core diameter. Inset: the dimensions considered in the calculation. (FIGS. 30E-F) A, B, and C show the wave-functions of the first electron and hole states after applying the Coulomb interaction in 1 nm, 1.8 nm and 4.2 nm core diameter respectively, considering 0.1 eV (blue frame) and 0.32 eV (red frame) conduction band offset.

(FIG. 31A) Absorption cross-section as a function of energy for monomer CQD (blue), Non-fused CQD (green) and fused dimer CQDM (red). (FIG. 31B) Monomer absorption cross-section (blue) along with calculated transitions overlap integral (purple) for 0.1 eV band offset. (FIG. 31C) Dimer absorption cross-section (red) along with calculated transitions overlap integral (orange) for 0.1 eV band offset. Electron and hole wave-functions involved in strong transitions are also presented.

FIGS. 32A-32C demonstrate the dual emitting NC heterodimer molecule, made by coupling two CdSe/CdS core/shell NCs with different core sizes, one green emitting and a larger NC with red emission. (FIG. 32A) Excitation above the entire particle gap will lead to dual color emission. (FIG. 32B) Dual-color single photon source. Emission of two color simultaneously is forbidden since the charge carriers will undergo Auger process. (FIG. 32C) Intensity controlled green emission dictated by the intensity of the red excitation. Higher intensity of red excitation will create multi-excitons that will suppress the green emission through Auger process.

FIGS. 33A-33B present QD molecule as an optical switch controlled by electric field. (FIG. 33A) Type I-Type I interface. Under no electric field the exciton can recombine from either of the cores end to emit a photon with wavelength $\lambda_1$ Under electric field the lowest energy photon is an indirect exciton. If the cores are closed different wavelengths will be emitted. If they are far away the emission will be suppressed. (FIG. 33B) Type II-Type II interface. Under no electric field both wavelengths can be emitted, $\lambda_1$ and $\lambda_2$. Under electric field the electron is overlapping with only one of the cores hole, leading to the selection of wavelength by electric field.

DETAILED DESCRIPTION OF EMBODIMENTS

A first example of coupled NC molecules presented herein combines two core/shell nanocrystals, to thereby yield highly controlled coupled systems. The core-shell nanocrystal building blocks can be constructed providing highly diverse geometric patterns. The building blocks are selected from all types of core/shell NCs.

Taking the CdSe@CdS core-shell structure as a non-limiting example, this core/shell system could be synthesized to adopt a spherical-like shape or polygonal shapes such as tetragonal pyramid, hexagonal pyramid, and hexagonal bipyramid. Other core/shell NCs might also have other geometry such as cubes and so on. With these core/shell building blocks, the coupled QDs molecules could be fabricated to yield a rich set of coupled NC molecules with diverse geometries including peanut-like, peasecods-like, snowman-like, calabash-like, matchstick, and additional geometries. In terms of bandgap engineering, in the first instance tuning the size, shape, and composition of the quantum dots (QDs) cores is used to manipulate the wavefunctions and energies of the electron and hole. In addition, the wavefunctions and energies are then further manipulated by the synthesis of shells on top of these cores. Once fused—these core/shell nanocrystals combine to form the coupled nanocrystal molecules.

There are vast possibilities starting from coupled homodimer structure where two similar core/shell nanocrystals are combined in one nanocrystal molecules. Through control of the shell size, composition and geometry it is then possible to achieve diverse combinations for coupled nanocrystal molecules where the constituent cores are similar. Moreover, using different cores of different sizes or compositions, it is possible to create coupled nanocrystal molecules of heterodimer morphology. It is also possible to combine core/multishell nanocrystals into a coupled nanocrystal molecule to yield rich and further control of the potential landscape between the cores. Additionally, it is possible to combine cores of different materials in the core/shell constituents and thus generate the coupled nanocrystal molecules with different properties.

In essence, we are introducing a whole set of nanocrystal molecules, not limiting only for dimers. It is analogous to going from atoms of the periodic table which is finite, to the infinite possibilities for molecules comprised of these atoms. And our invention offers such potential for the core/shell nanocrystals serving as the building blocks of the coupled nanocrystals molecules.

Figure 1:
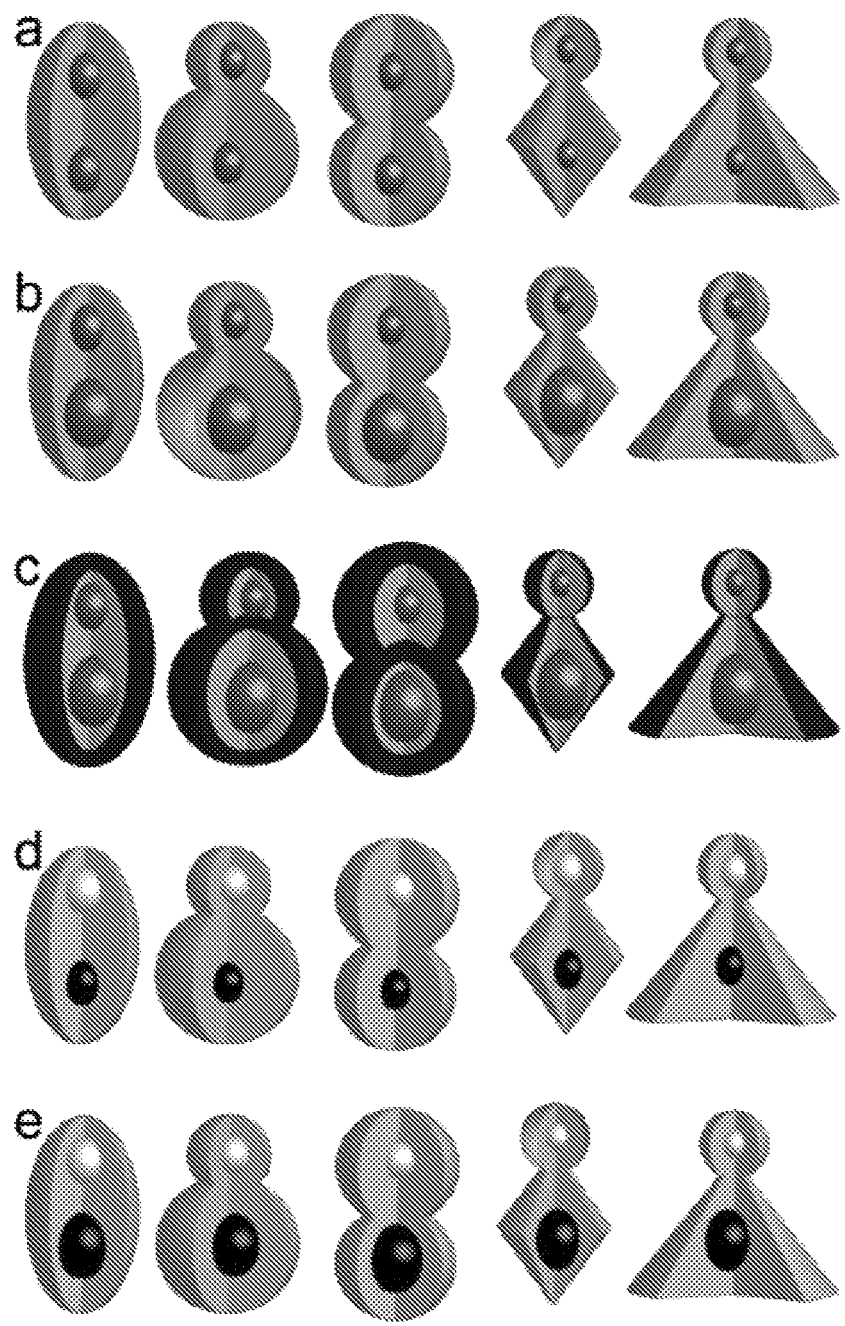
FIG. 1 schematically depicts various types of coupled dimer structures. (A) Coupled dimer structure with the same size of core. (B) Coupled dimer structure with different sizes of core. (C) Coupled dimer structure of core@shell$_1$@shell$_2$ with different sizes of core. (D) Coupled heterodimer structure with the same size of cores of different materials. (E) Coupled heterodimer structure with different sizes of core of different materials.
Figure 2:
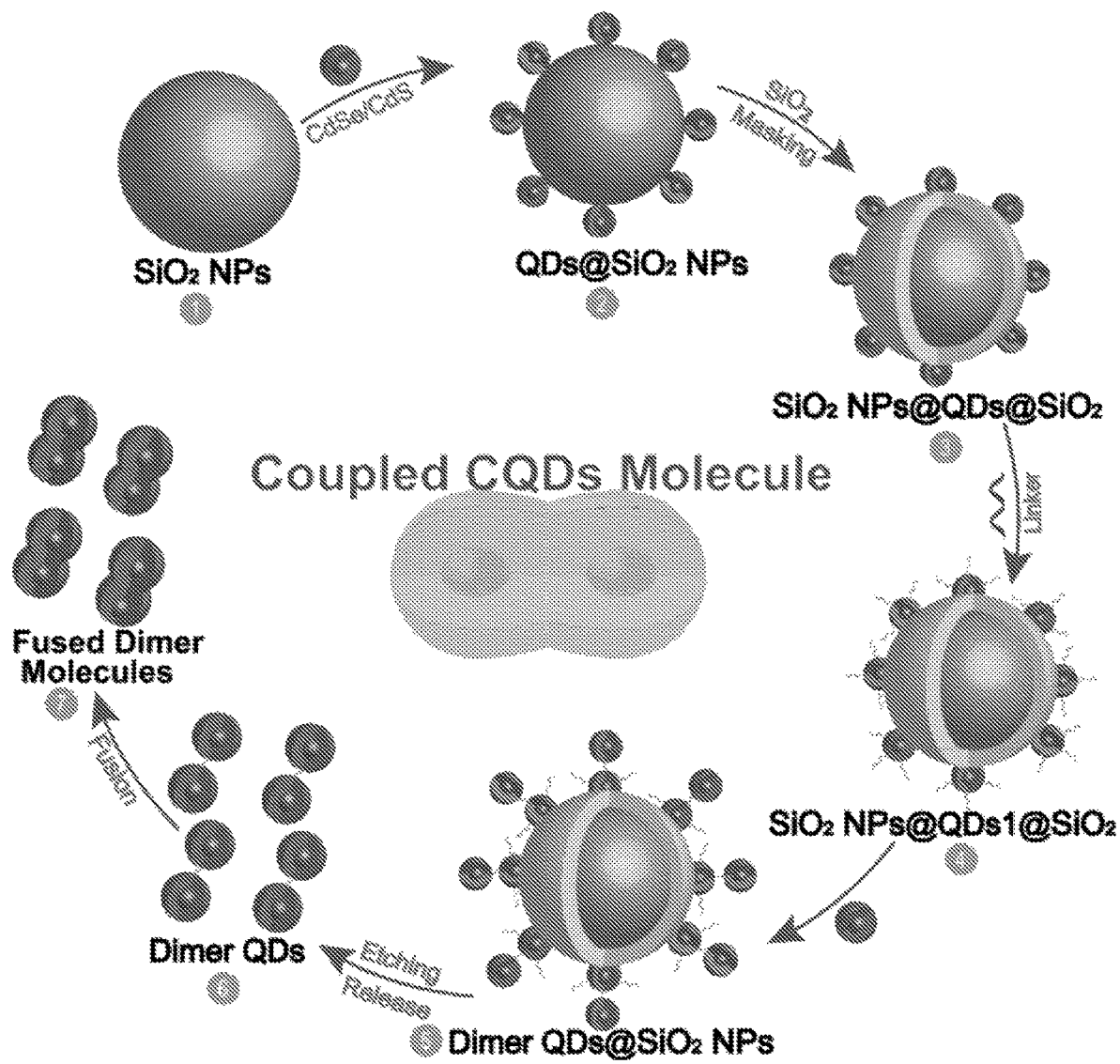
FIG. 2 is a schematic illustration for an exemplary fabrication processes of coupled CdSe@CdS dimer structure.

By way of a non-limiting example, we show one approach we used for the formation of coupled QDs molecules in FIG. 2. This was performed by the following steps:

1. Fabrication of $SiO_2$ nanoparticles with a size of 200 nm and coated by (3-mercaptopropyl)trimethoxysilane (MPTMS). This kind of $SiO_2$ particle presents on the outer surface thiol groups, which are used for the binding of the QDs.

2. Core/shell NCs binding to the $SiO_2$ particle surface: mixing a solution with the chosen core/shell NCs, to the $SiO_2$ nanoparticles allows their binding to the available thiol sites. After this step, the NCs are bound on the surface of the $SiO_2$ nanoparticles.

3. (optional step) Secondary thin layer of $SiO_2$ growth on the $SiO_2$@QDs for masking: Achieved by a modification of the Stober method, the thin $SiO_2$ layer is synthesized. In this manner, the NCs are immobilized by this masking $SiO_2$ layer and cannot rotate or reorient while only a top hemisphere is remaining exposed for further chemical functionalization of the NCs.

4. Selective surface decoration of the NCs by linker groups: Chemical grafting of a functional structure and group is then applied and it reacts only with the exposed NC hemisphere. For example, a tetrathiol ligand can be added as a linker that also exchanges the NC ligands on the exposed surface (for example oleylamine).

5. Forming dimer geometry on the silica surface: Addition of a solution of second NCs allows for conjugate formation yielding the controlled formation of a dimer structure by binding to the linkers.

6. Dimer release: The dimers are released from the silica surface and separated. For example, this can be achieved by selective $SiO_2$ etching using an HF/NMF solution.

7. Fusion to form the coupled NC molecule: Dimers are fused. For example by the addition of suitable precursor and heating to form a continuous link between the two shell regions of the pre-made dimers.

Additional optional purification of the dimers versus monomer and higher linked oligomers is possible in between steps 6 and 7, or after fusion step 7. This can be achieved by a multitude of separation methods such as but not limited to size-selective precipitation, density gradient separation, and others. Moreover, other post-coupling processing, such as synthesis of a shell, metal growth and surface engineering are also possible. Additional methods, such as oriented attachment, for the formation of dimers are also possible.

Example 1: Homodimer Formation (with Linkers)

Different sizes of CdSe@CdS NCs as building blocks for the dimer were synthesized by known methods. Taking 1.9/4.0 nm CdSe@CdS NCs for example (FIGS. 3A-C), the CdSe core (3.8 nm) was synthesized at 350° C. by hot-injection method for 70 sec the absorption (580 nm) and photoluminescence (PL) spectra (595 nm) were measured after the purification procedure (FIG. 3). Then the CdSe@CdS NCs (11.5 nm) were fabricated by CdS shell growth achieved by injection of $Cd(OA)_2$ and octanethiol precursor. After the shell growth, the photoluminescence (PL) spectra (637 nm) show a red-shift compared with the cores, which reveal the successful fabrication of quasi-type II QDs. Moreover, the fluorescence quantum yield was greatly enhanced.

Figure 4A:
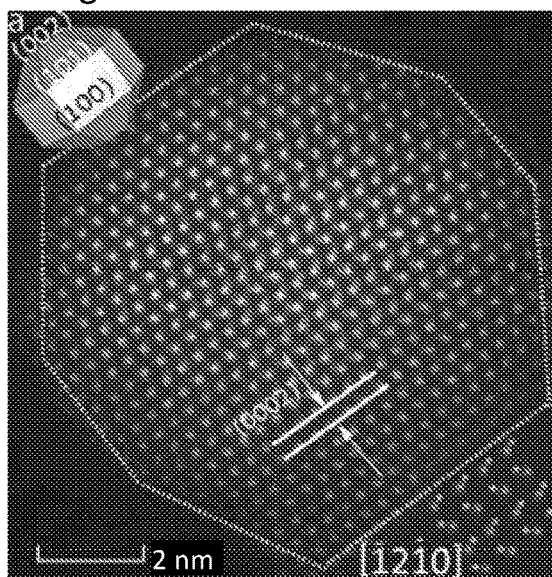
FIGS. 4A-4L provide a structural characterization of the coupled CQDs. Raw (FIG. 4A) and Fourier filtered (FIG. 4B) HAADF-STEM images of 1.9/4.0 nm CdSe/CdS CQD monomer viewed under [1210] zone axis (ZA). Inset in (FIG. 4A) is a cartoon model built with VESTA software with bounding faces indexed based on the STEM data. Magnified images of edge (shell) (FIG. 4C) and central (core) parts (FIG. 4D) of the CQD shown in (FIG. 4B). Sulfur, selenium, and cadmium atoms are marked in blue, green and purple, respectively. Coherent growth of the shell lattice is identified. (e) and (f) are FFT and atomic structure model of (FIG. 4A), respectively. HAADF-STEM image of CdSe/CdS CQD under ZA [0001] (FIG. 4G) and atomic structure reconstruction imaging calculated for the same orientation (FIG. 4H).
Figure 4B:
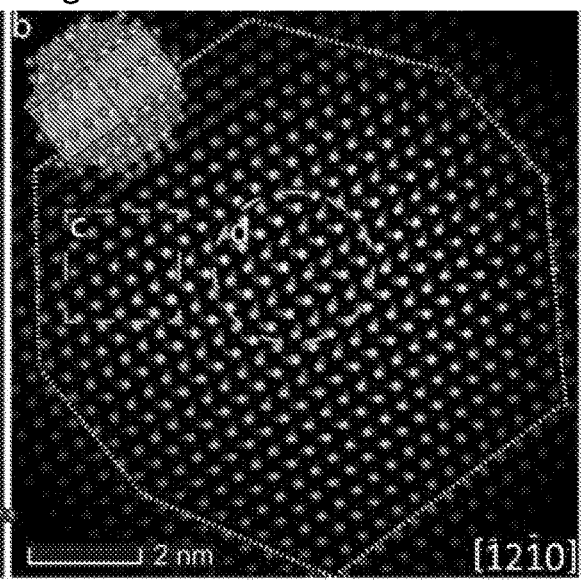
Figure 4C:
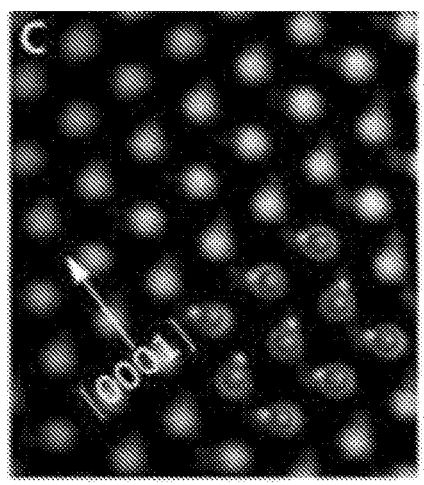
Figure 4D:
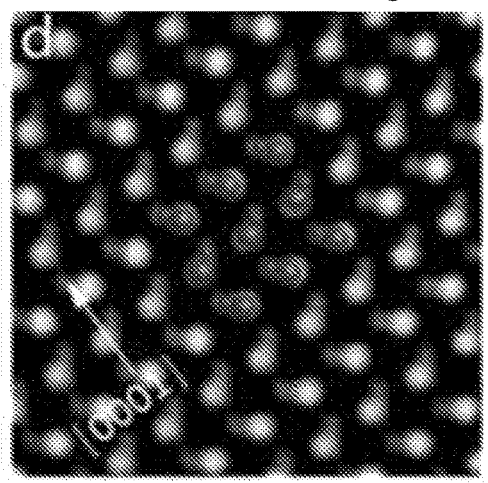
Figure 4E:
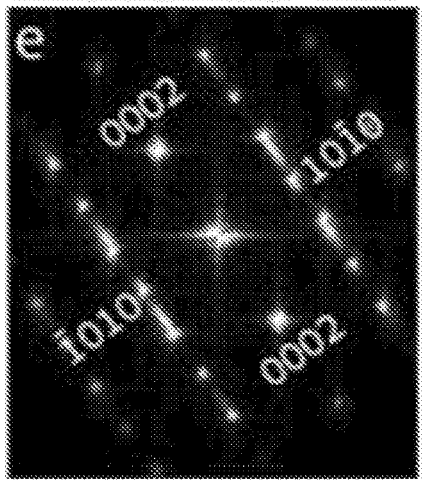
Figure 4F:
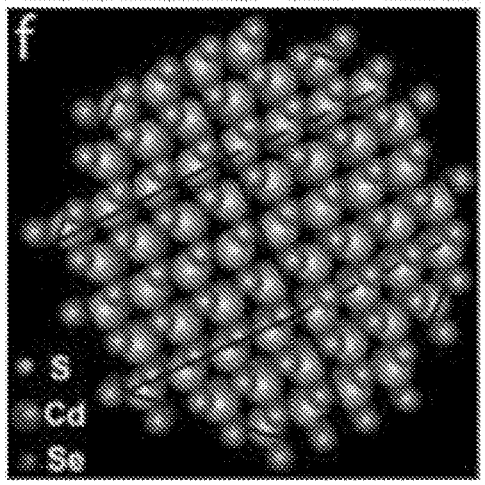
Figure 4G:
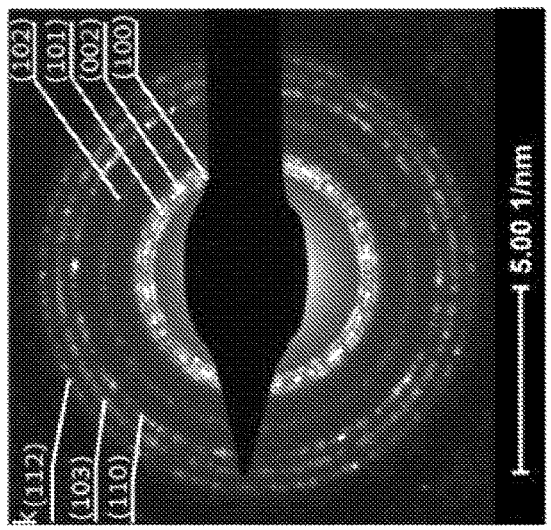
Figure 4I:
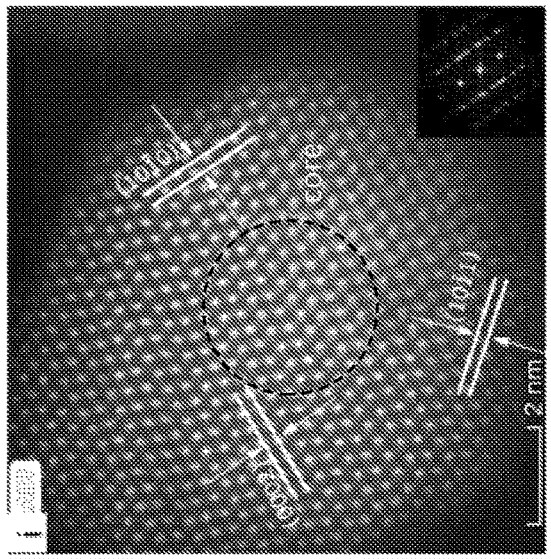
Figure 4K:
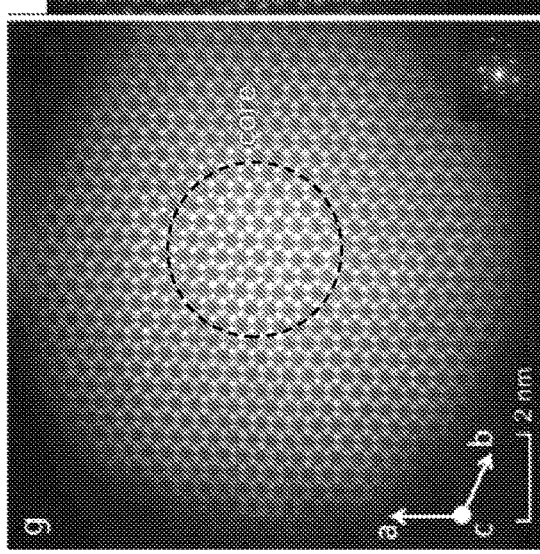
Figure 4H:
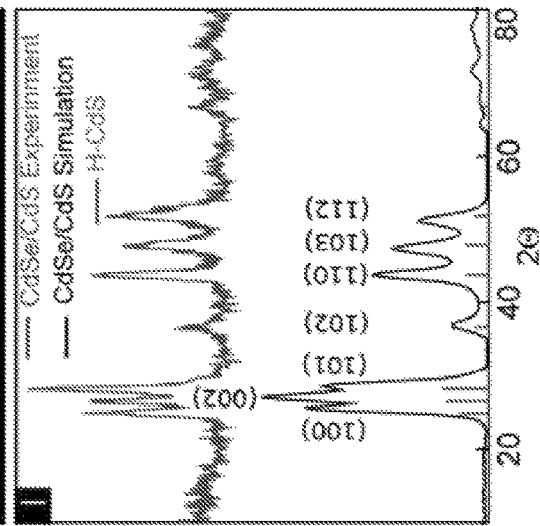
Figure 4J:
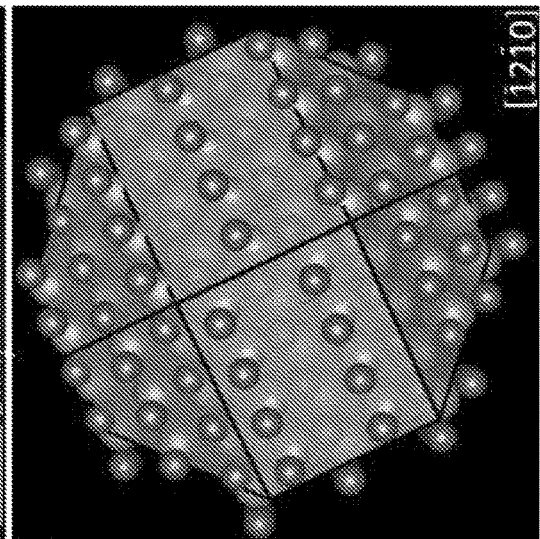
Figure 4L:
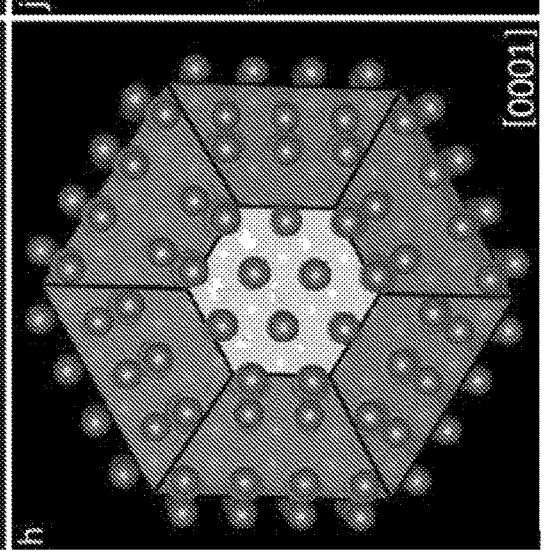

Structure analysis for the monomer was shown in high-resolution scanning-transmission electron microscopy (STEM) imaging and high angular annular dark field detector (HAADF) measurement. The core-shell structure was clear depicted by Fast Fourier transform (FFT) reconstruction imaging (FIGS. 4A-B). Furthermore, the lattice planes and structure with different zone axis (ZA) matches well with the structure model. Additionally, the X-ray powder diffraction (XRD) and selected area electron diffraction (SAED) measurement (FIGS. 4K-L) manifests the hexagonal close-packed (hcp) wurtzite structure of CQDs.

The 200 nm diameter $SiO_2$ nanoparticles (step 1) were prepared as described in the methods section. Then $SiO_2$@QDs particles were prepared in step 2 by adding the CdSe/CdS QDs to the $SiO_2$ nanoparticles solution. The resulting particles were characterized by TEM and SEM as shown in FIG. 5. In order to avoid the NCs overlap and aggregation on the $SiO_2$ surface, the ratio of QDs added to the $SiO_2$ nanoparticle was controlled. In this specific sample, a 1:500 $SiO_2$:QD ratio yielded good results of well-separated and clearly resolved QDs as seen in FIG. 5. The $SiO_2$@QDs nanoparticles solution was cleaned twice from excess of free and weakly bound QDs by centrifugation, discarding the supernatant and re-dispersion in toluene.

After this purification process, the $SiO_2$@QDs were dispersed in ethanol. A secondary thin $SiO_2$ masking layer was deposited on the surface of $SiO_2$@CdSe—CdS NCs (step 3) using the Stober method. Briefly, tetraethyl orthosilicate (TEOS), polyvinylpyrrolidone (PVP) and ammonia solution (28%) are added and stirred at room temperature for 10 hours. The secondary masking silica layer has two functions: firstly, the secondary layer can cover the surface thiol group of MPTMS to avoid the adsorption of additional CdSe—CdS NCs in the dimerization step 5. This will enhance the efficiency of the dimer structure versus monomers. Secondly, the secondary layer immobilizes the CdSe—CdS NCs such that they cannot rotate and their hemisphere that emerges in the solvent can be modified selectively by the chemical grafting of a functional structure and group. In order to control the thickness of the secondary $SiO_2$ layer, the amount of PVP and TEOS was optimized. As shown in FIG. 6, after the growth of the secondary $SiO_2$ layer, the surface roughness of the $SiO_2$@CdSe—CdS nanoparticles increases significantly due to this growth, while the emergent QDs can still be discerned.

Next, towards the dimer formation, the chosen linkers are added to be bound to the exposed region of the bound QDs (step 4). In this example, tetrathiol molecule was used as a bi-dentate linker molecule. The thiol binding is strong on the QD surface and can displace the existing surface ligands selectively on the exposed QD hemisphere. In order to enhance the conjugation of the linkers, the surface modification procedure was performed at 60° C. for overnight with Ar flow. Then the excess linker molecules were removed by precipitation and centrifugation of the $SiO_2$@QDs nanoparticles.

In step 5, the secondary QDs composing the dimers were added. In this example of a homodimer formation, the same type of core/shell QDs were used in this step as those already bound to the $SiO_2$. The ratio of the added QDs to the original amount used in step 2 was optimized and a ratio of 1:1.5 was used. As shown in FIG. 7, the $SiO_2$@dimer structure was formed with precise control.

Step 6 is then performed to release and separate the dimers from the $SiO_2$ spheres. The release of the dimer CdSe—CdS NCs was performed by the selective etching process of the $SiO_2$ using an HF/NMF (10%) etching solution. The freed dimers were separated by centrifugation decanting the supernatant and repeated ethanol/centrifugation cycles for three times. As seen in FIG. 8C, the precisely controlled dimer CdSe—CdS NCs were successfully synthesized. Some monomers are identified as well, along with possible aggregates with larger numbers of NCs, and these can be separated optionally after this step or after the fusion in step 7.

Step 7, the fusion of the dimers to form the coupled NC dimer molecule is then performed. In order to get the coupled CdSe/CdS NCs in this example, the fusion procedure was performed while adding $Cd(OA)_2$ and heating to 180° C. for 20 h (FIGS. 8D-E). At this non-trivial important stage, the reaction parameters such as temperature and amount of ligands and precursors play a significant role in the fusion of the CdSe—CdS NCs. If the temperature was too high (more than 220° C.), a ripening process of the NCs can be dominant, leading to the collapse of the dimer structures. On the other hand, if the temperature was too low, the fusion rate would be too slow and insignificant. Dimer structure formation is sensitive to both temperature and ligands. In the presence of excess ligands in the solution, the fusion would be inhibited and leads to the decrease of the dimer yield. Thereby, the appropriate tuning of temperature, time and ligands type, and concentration has a significant influence on the formation of the coupled dimer structure. Careful tuning and choice of these reaction parameters is crucial for achieving high dimer yields and lower yields of ripening and collapse while achieving a continuous linking region of the shell materials forming the "barrier" between the two cores in the fused dimers.

Analysis of TEM and HAADF-STEM images confirms that coupled dimer formation is indeed achieved by fusion of the core/shell QD monomers (FIGS. 9A-B). Closer inspection as shown in FIG. 9, proves clearly that a continuous lattice was formed fusing the two QDs shells together. The high-resolution images (FIG. 9A) show lattice planes that are continuous through the entire structure, indicating coupled dimers. The coupled structure was further proved by the STEM line scan and commensurate energy dispersive spectroscopy (EDS) analysis measurement. As shown in FIG. 9, a continuous distribution of Cd (both in core and shell) and sulfur (only in shell) is identified along the line of the dimer axis. Along the same line, selective regions of the selenium (only in core) are clearly identified signifying the cores locations.

The crystal structure and in particular the interfacial fused region of the coupled nanocrystals was further investigated by HAADF-STEM and Fast Fourier transform (FFT) reconstruction imaging. FIG. 10A shows the as-measured lattice image along with an indication of the identified lattice planes in each of the Monomer QDs A1 and A2. Next, A1 and A2 QDs were marked for selected FFT analysis. The selected FFT data of each region was then filtered in k-space and the filtered image after back-FFT is presented in FIG. 10B. Analysis of the data shows that for QD A1 we clearly identify the (002) and (100) lattice planes with an angle of −90° between them, typical of the hexagonal CdS wurtzite structure observed along the [010] zone axis. For QD A2 the structure also conforms to CdS wurtzite phase with stacking faults. The analysis allows for determining the c-axis direction for each QD as indicated by the white arrows. This is fully consistent with the analysis of the electron diffraction (ED) patterns of A1 and A2 shown in FIG. 10C. Both analyses yield an angle of 60° between the C-axis of each QD in the fused dimer and we term this as the "coupling angle".

Additionally, the orientation relationships including homo-plane-attachment and hetero-plane-attachment in the fusion process were observed by HAADF-STEM images. That is, homonymous faces attachment: (1010)||(1010), (0002)∥(0002), and (1011)∥(1011); heteronymous faces attachment: (1010)∥(0002), (1011)∥(0002), and (1010)∥(1011) (FIGS. 11-12).

Figure 14A:
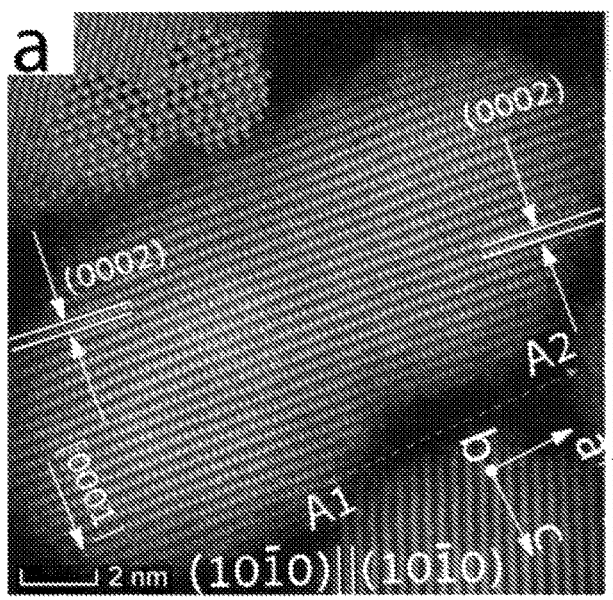
FIGS. 14A-14B provide HAADF-STEM image and atomic structure model of the fused 1.4/2.1 nm CdSe/CdS molecules with homo-plane attachment on (1010)∥(1010) (FIG. 14A), and (1011)∥(1011) (FIG. 14B). For the atomic model, the Cadmium atoms are marked in purple and Sulfur atoms in light blue.
Figure 14B:
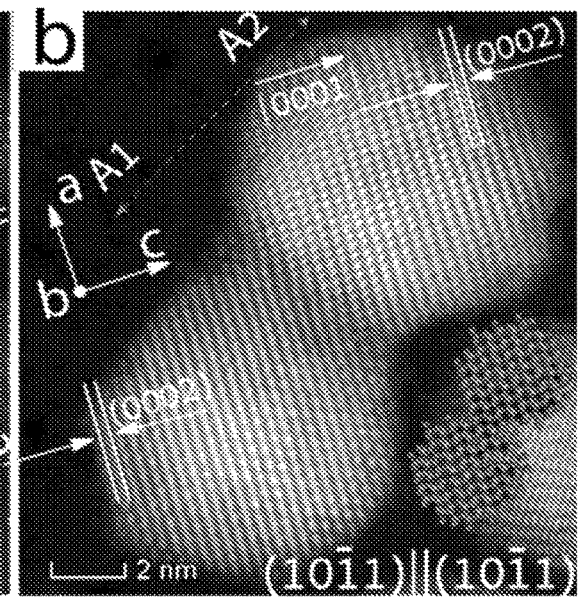
Figure 15A:
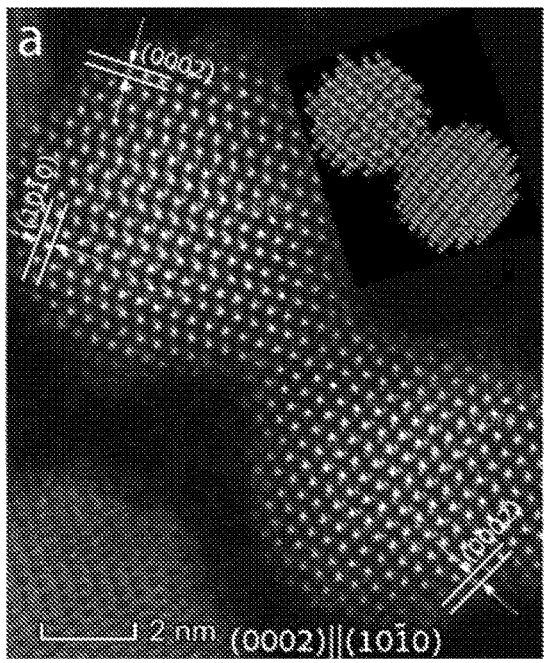
FIGS. 15A-15B depict HAADF-STEM images and atomic structure model of the fused 1.4/2.1 nm CdSe/CdS molecules with heteronymous-plane attachment on (0002)∥(1010) (FIG. 15A), (0002)∥(1011) (FIG. 15B). For the atomic model, the Cadmium atoms are marked in purple and Sulfur atoms in light blue.
Figure 15B:
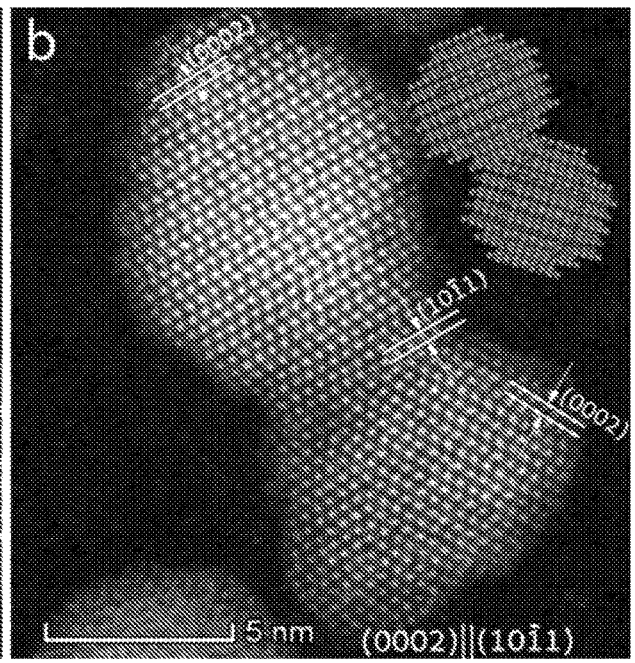

Based on this detailed structural data, the statistical analysis was taken for the fused dimer structure. As shown in FIG. 11 K, the (0002) facets, while in minority, is more active during the fusion step, which is a reactive facet manifesting a Cd rich termination with 3 dangling bonds per atom. The fusion relationship for the small CQDs (1.4/2.1), including home-plan attachment and hetero-plan attachment (FIGS. 13-15), is similar to the big CQDs (1.9/4.0) via HAADF-STEM images.

The electronic and wavefunction hybridization for the coupled CQDs molecules was attained by the red-shift both in the absorption and emission spectrum, which was in agreement with the quantum-mechanical calculation as shown in FIG. 16.

Further, the photo-physical properties of the CQD molecules at both ensemble and single-molecule level manifest novel exciton recombination pathways converging to the internal electron rearrangement throughout the artificial CQD molecule. Firstly, we observe the shortening of the lifetime for the fused CQDs molecules as shown in FIG. 17.

Figure 19A:
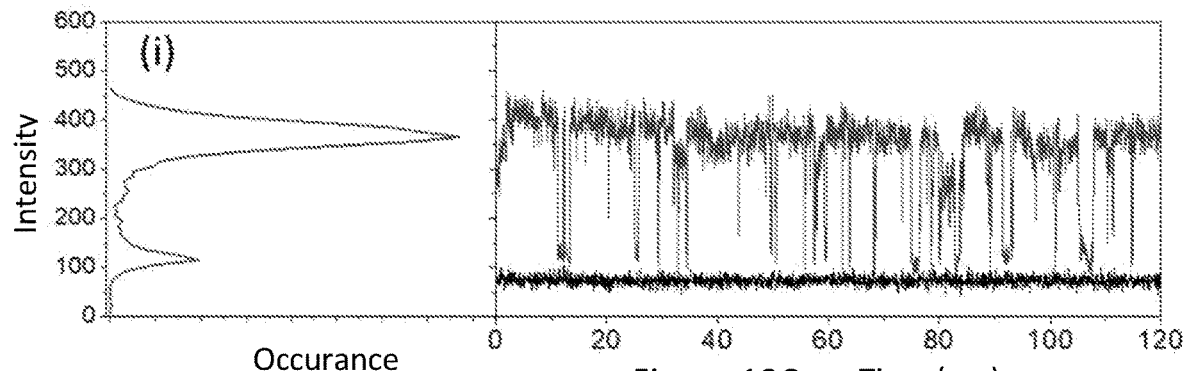
FIGS. 19A-19C provide a time-tagged time-resolved analysis of the fusion protocol treated monomer CQD (1.4/2.1 nm).
Figure 19B:
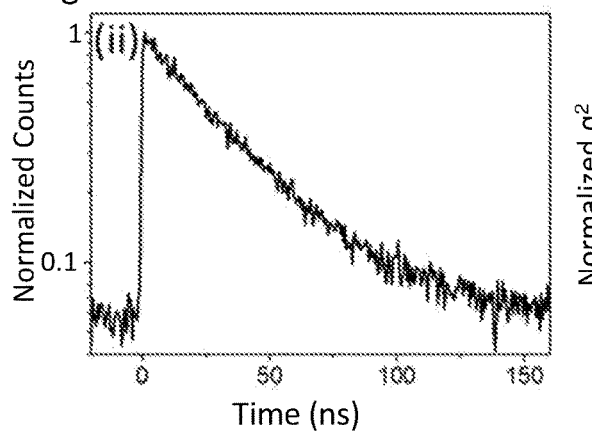
Figure 19C:
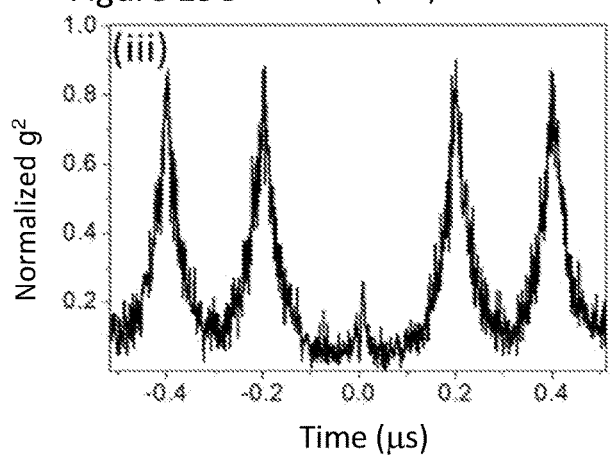

The photon statistics of the dimer altered significantly exhibiting fluorescence flickering instead of the ON-OFF blinking feature in the monomers (FIGS. 18-19). A clear off state was not detected for the 1.4/2.1 nm CQD dimers at the experimental resolution. While the monomer CQDs exhibit perfect photon antibunching with a contrast=$g^2(0)/g_2(\tau)$ value ~0.1 at low excitation power, at a similar condition, the dimers exhibit a much higher value. This is an indication of the formation of enhanced biexciton quantum yield. The deviation of the fluorescence decay profile from single exponential behavior is another important observation in dimer. While the highest intensity trace of the single monomer particles decay in a perfect single exponential manner due to exciton pair recombination, none of the levels in dimer posses single exponential behavior. The formation of the charged trion which is emissive is also possible. These characteristics indicate the introduction of additional recombination pathways and the rich possibilities for multiexciton configurations in the artificial CQD molecule compared with the monomers, also related to coupling within the system.

Figure 20:
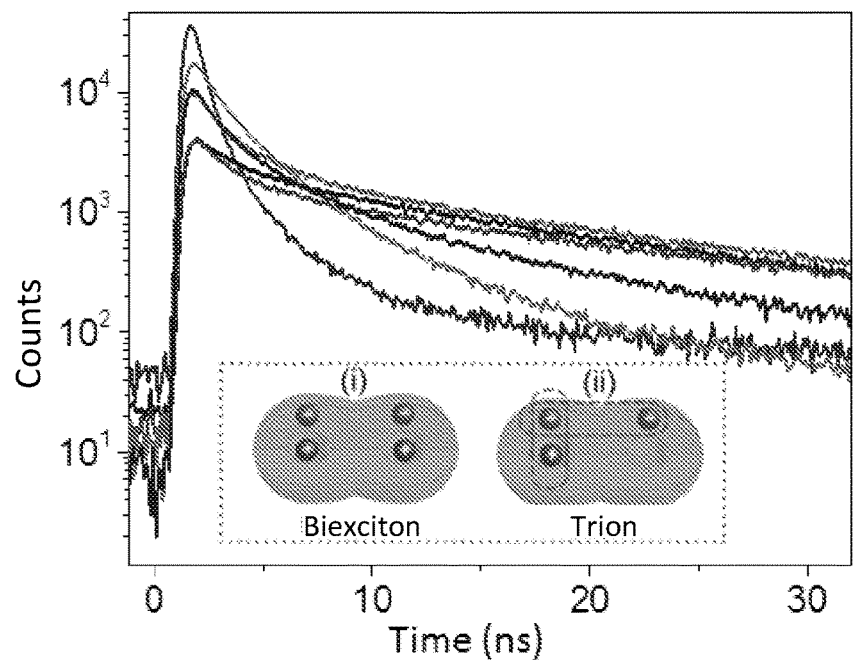
FIG. 20 provides a pump fluence dependent fluorescence lifetime of single 1.4/2.1 nm fused CQD molecule. As the power is stronger the lifetime shortens. The inset shows the possible new multicarrier configurations.

The absence of a monomer like OFF state in dimer indicates the reduction in the Auger recombination rate and thus an emissive multicarrier can be generated in the homodimers (comprising two identical nanocrystals). Fused homodimers show an enhanced excitation power dependence of the fluorescence lifetime which is possibly the stabilization of emissive biexciton or trions (FIG. 20).

Example 2: Homodimer Formation (Intrinsic Janus Method)

A homodimer structure can also be fabricated with Janus QDs as the building blocks, even without using clear linker molecules. First, QDs with hydrophobic ligands, (combination of oleylamine (OAm) and oleic acid (OA) ligands in this example) were bound to the surface of $SiO_2$ (by thiol groups in this example) (FIG. 21A). Then, an etching step, with HF/NMF solution, was used to selectively etch the $SiO_2$ and release Janus QDs, having approximately one hemisphere coated with hydrophobic ligands and the second hemisphere coated with hydrophilic thiolate ligands. Performing the etching in polar solvents, such as the NMF, results in natural homodimer formation due to hydrophobic-hydrophobic interactions while the hydrophilic part of the Janus QDs is facing outwards on both sides of the dimers. FIG. 21B shows the TEM data that manifests the formation of a significant fraction of homodimers (unfused at this step).

Next, this unfused dimer solution has undergone a fusion step performed by adding $Cd(OA)_2$, OAm and heating to 240° C. for 20 hours (FIGS. 21C-D). The HRTEM and HAAD-STEM imaging shows a continuous shell formed after the fusion procedure, which future identified the final coupled homodimer structures.

Example 3: Heterodimer Formation (Different Shell Size)

Figure 23A:
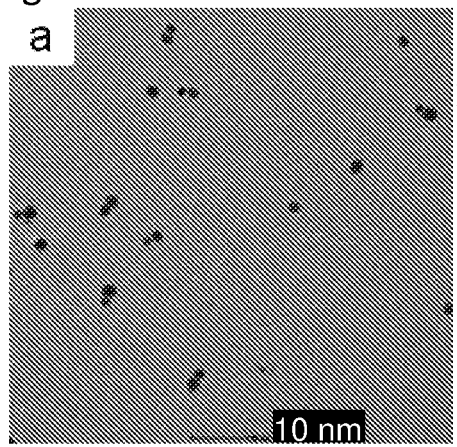
FIGS. 23A-23D provide TEM imaging of the heterodimers before (FIGS. 23A, B) and after (FIGS. 23C, D) the fusion procedure with different magnification.
Figure 23B:
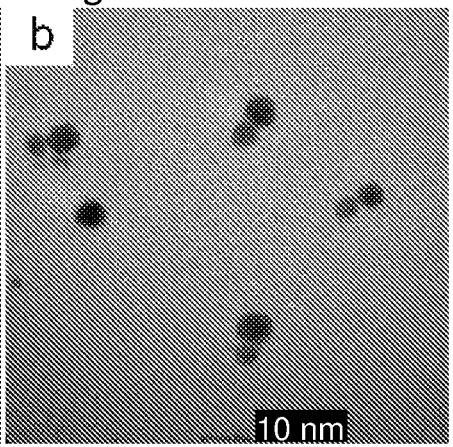
Figure 23C:
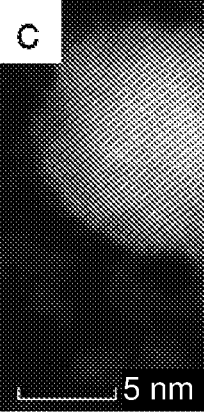
Figure 23D:
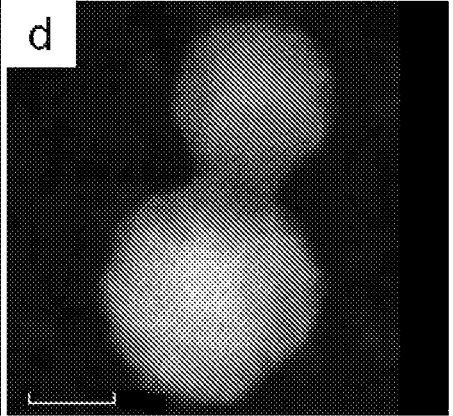

Heterodimers can be formed in a similar method as presented in example 1, but by the use of primary and secondary quantum dots with different shell dimensions. FIGS. 22A-B present $SiO_2$@heterodimer of CdSe/CdS Quantum dots, wherein in one QD the shell comprises of 11 layers and in the second QD of 6 layers. FIGS. 23A-B presents the released dimers after the etching of the $SiO_2$ spheres. This was followed by a fusion process (FIG. 2, steps 6-7 performed similar to example 1 above) providing coupled heterodimers as shown in FIGS. 23C-D.

Example 4: Heterodimer Formation with Different Core Size

Heterodimers with different core sizes can be formed using a similar method as that presented in example 1. For example, coupled heterodimer of CdSe/CdS wherein one CdSe/CdS with a defined core radius are fused with a second QD of the same composition with different core radius.

Example 5: Heterodimer Formation with Different Core/Shell Material

Heterodimers with different core/shell materials can also be formed by a similar procedure to that presented in example 1. These structures can be achieved by introducing a secondary QDs comprise of different core materials than the primary QDs, in step 5 (FIG. 2). As a non-limiting example, InP/CdS can be fused to CdSe/CdS, to form InP—CdSe coupled heterodimer with CdS as the barrier and shell.

Example 6: Heterodimer Formation of a Core/Shell QD with QD of the Shell Material A private case for example 5 is a heterodimer, with one QD having the same composition as the shell of the second. Non limiting examples are coupling CdSe/CdS with CdS NCs or CdSe/ZnS with ZnS NCs.

Example 7: Trimer Formation by Dimer and Monomer Binding

Figure 24A:
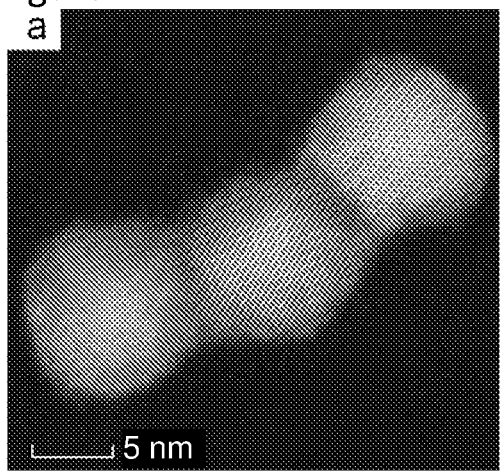
FIGS. 24A-24B provide TEM images of trimer structures.
Figure 24B:
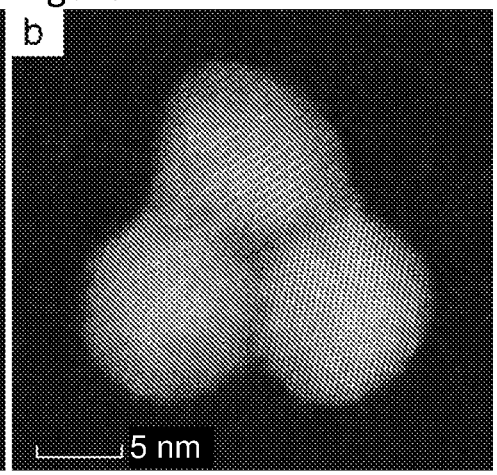

The dimer structures as fabricated in the previous examples can further be utilized as the building blocks for the synthesis of trimer (and in general of more complex) structures. FIG. 24 presents a non-limiting example of trimers produced after the binding and coupling of a quantum dot to a dimer structure. First, a fused dimer structure of CdSe—CdSe with CdS barrier and shell were bound to $SiO_2$ following the above-mentioned method. After that, the secondary QDs of CdSe/CdS were added into the solvent to form the trimer structure and the release and fusion processes were used.

Example 8: Chain Structure Formation

Chain structures of different lengths can be achieved by similar procedures as utilized above. The short-chain structures could be used as the building blocks to grow longer chain structure.

Example 9: Dimer Structure of Core/Multishell Monomer QDs

Dimer structure composed of core/multishell monomer QDs can be achieved by similar procedures as utilized above. A non-limiting example is CdSe/CdS/ZnS QD coupled to secondary CdSe/CdS/ZnS Quantum dots forming CdSe/CdS-CdSe/CdS dimer heterostructure with a ZnS barrier and shell. Another example is CdSe/CdS/ZnS coupled to InP/ZnS forming CdSe/CdS—InP dimers with ZnS barrier and shell.

Example 10: Dimer Structure with Outer Shell

Different structures (e.g. dimers, trimers, chains) with multi-shells can be synthesized by the introduction of precursors during or after the fusion step. For example, a ZnS outershell can be grown with $Zn(OA)_2$ and S-ODE precursors on CdSe—CdS coupled dimers. In this example, type I band alignment, the outer shell growth is beneficial for passivation of the entire structure to remove possible surface traps.

Figure 25A:
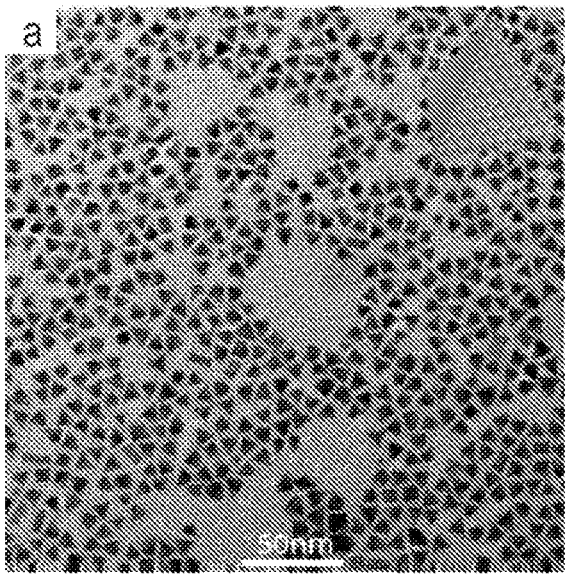
FIGS. 25A-25D provide TEM image (FIG. 25A), STEM image (FIG. 25B) of the zinc blende (ZB) CdSe/CdS QDs. The TEM of ZB QDs dimer @SiO$_2$ structure (FIG. 25C). The fused dimer ZB QDs structure (FIG. 25D). Inset shows the HAADF-STEM image of dimer tip attachment QDs structure.
Figure 25B:
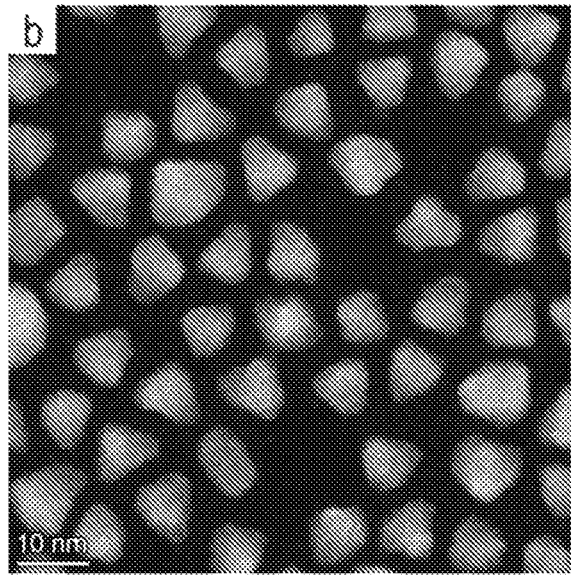
Figure 25C:
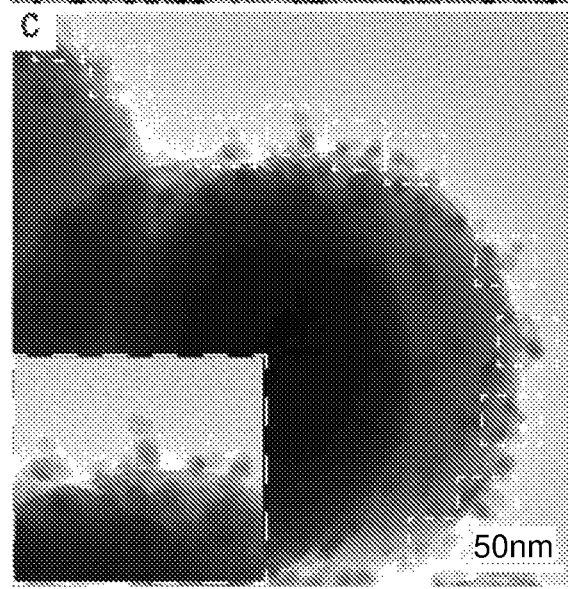
Figure 25D:
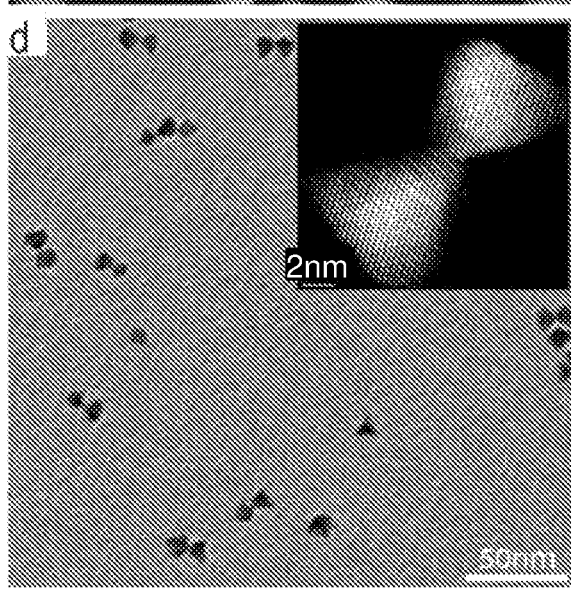

Example 11: The Controlled Attachment of Dimer Structure Based on Zinc Blende (ZB) Structure The ZB CdSe@CdS building blocks were generated by previous methods, as shown in TEM and the HAADF-STEM image (FIGS. 25A-B). The formation of the dimers via constrained attachment is then performed. The QDs were first binding to the $SiO_2$ nanoparticles. Following, the masking for the secondary thin $SiO_2$ was achieved. Then with the surface modification, the subordinate QDs were added to form the dimer QDs@ $SiO_2$ nanoparticles. As seen in FIG. 25C, the controlled ZB dimer CdSe—CdS were successfully synthesized. Next, the ZB dimer CdSe—CdS was released with an etching strategy. The coupled CQDs molecules were formed via fusion step. In our system, the optimized temperature scope for fusion of the ZB CQDs is 180-220° C. Then the fused ZB CdSe@CdS molecules based on the tip-attachment were formed.

The binding relationship and attachment analysis was further investigated by HAADF-STEM and FFT reconstruction imaging. Analysis of the HRTEM for QDs, we clearly identify the (002) and (111) lattice planes, a typical of the tetragonal CdS ZB structure observed along the [110] zone axis which matches well with the Fast Fourier transform (FFT) imaging. Further, the (111) plane of A1 was corresponding with the (002) plane of A2 to form the coupled dimer structure. Additionally, other tip attachment with different orientation was depicted in FIGS. 26D-E.

Figure 26G:
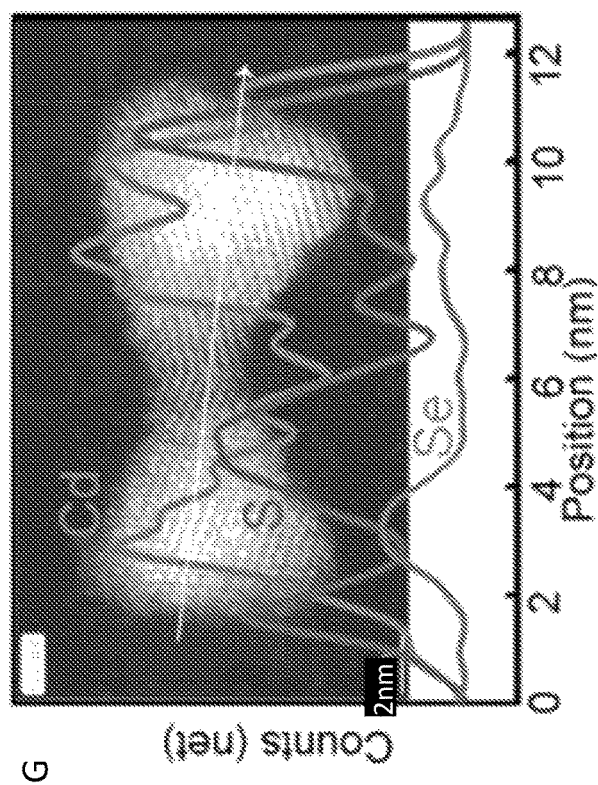
Figure 26H:
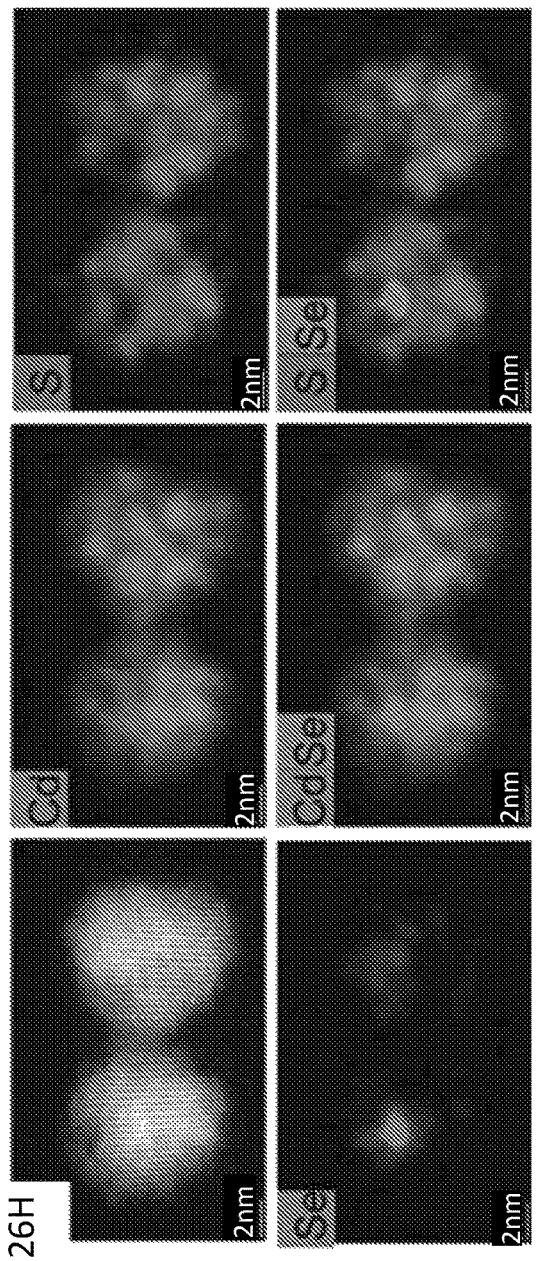

The coupled structure was further proved by the STEM line scan and EDS analysis measurement. As shown in FIG. 26G, a core-shell dimer molecule based on the ZB CQDs molecules was clearly identified.

Example 12: Quantum Mechanical Calculations of CQD Molecules Energy Levels

Figure 27A:
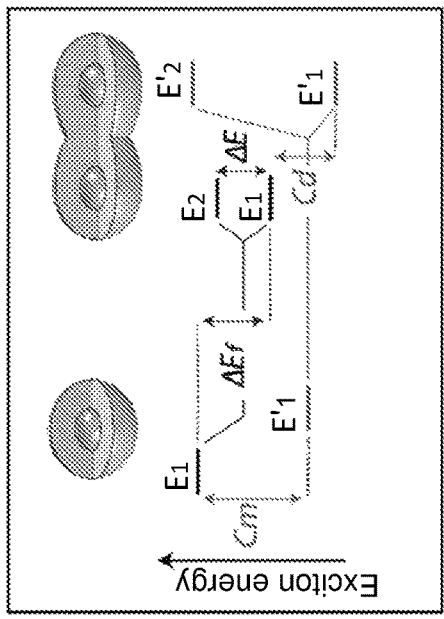
FIGS. 27A-27B provide a scheme for the potential energy landscape of the monomer (left side) and the fused CQDM dimer (right side) along with a cross-section of the highest hole wave-function (blue), the lowest state of the electron without Coulomb interaction (red), with coulomb (dashed red), the first excited state of the electron without Coulomb interaction (green) and with Coulomb (dashed green). (h) Exciton energy level ordering for the monomer CQD (left side) and the dimer CQDM (right side) before (black), and after (magenta) applying the Coulomb interaction. $C_{m/d}$ refers to the Coulomb energies in the monomer and the dimer respectively, $\Delta E_f$ refers to the fusion energy. $\Delta E$ refers to the coupling energy, the difference between the symmetric and anti-symmetric electron states in the dimer CQDM.
Figure 27B:
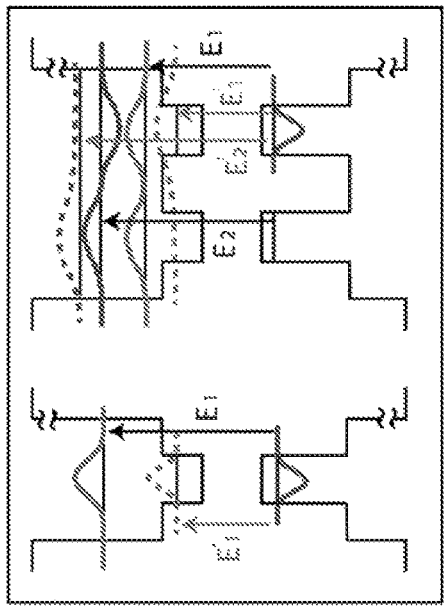
Figure 28A:
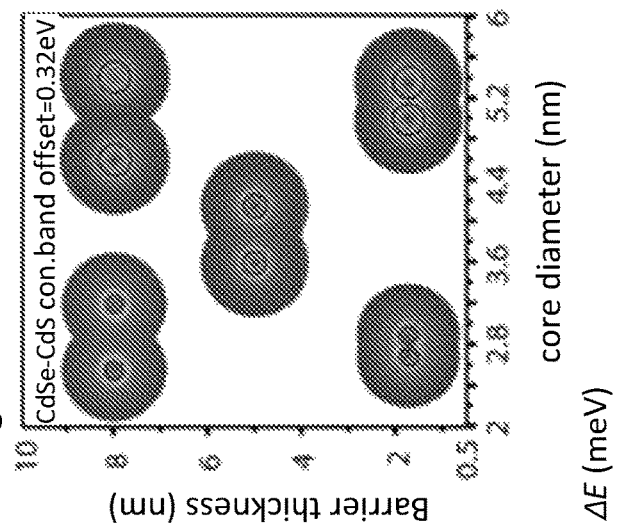
FIGS. 28A-28C provide the effects of core dimensions, barrier thickness, and band offsets on the coupling of the lowest conduction band state in the CQDM.
Figure 28B:
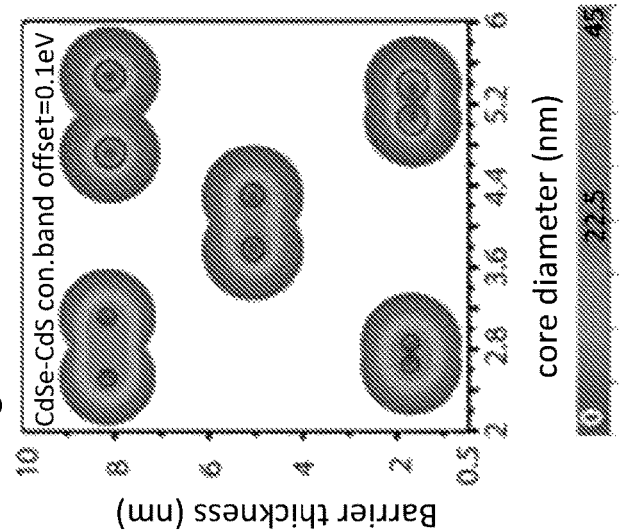
Figure 28C:
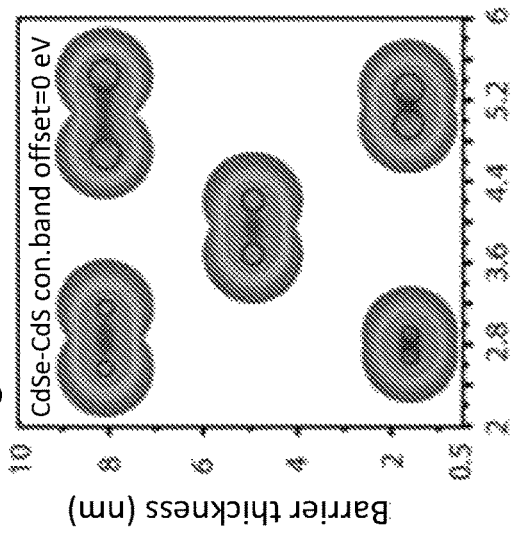

Upon fusion, the potential energy landscape is changing from the core/shell type I heterostructure in which a core composed of the smaller bandgap material (CdSe) is embedded inside the shell of the larger bandgap material (CdS), to two closely spaced quantum dots separated by the barrier with height dictated by the band offsets between CdSe and CdS (FIG. 27 A). The resulting wave-functions are those of a symmetric state (red) and anti-symmetric state with a node in the center (green). The hole effective mass is much larger than that of the electron. As a result, the picture for the hole is still that of essentially two separate CQDs which means that in the single exciton regime the hole wave-function is mostly localized inside one of the cores (blue). Upon taking into account the electron-hole Coulomb interaction, the first electron wave-function becomes more localized in the core where the hole resides, while the next electron level will be more localized in the other core (dashed line in FIG. 27A).

A key observation is a redshift of the emission wavelength upon fusion indicative of quantum coupling. The CB 1S, ground level of each CQD is shifted to lower energies due to the presence of the other CQD. However, this shift does not lift the twofold degeneracy of the lowest CB state. This degeneracy is lifted only by the coupling between the two CQDs. The fusion energy, which is the redshift between the ground states before and after fusion, is marked here as $\Delta E_f$. Taking into account the Coulomb energy (magenta levels in FIG. 27B), the monomer ground state energy is red-shifted by $C_m$ that is greater than $C_d$, the Coulomb redshift of the dimer ground state. The difference between the Coulombic terms $\Delta E_c$ defined as: $\Delta E_c = C_m - C_d$. The total redshift of the bandgap energy of the dimer with respect to the monomer is then: Red shift=$\Delta E_f - \Delta E_c$.

We have analyzed the coupling energy dependence on different diameters of CdSe cores and different barrier widths. The barrier width is controlled by overlapping the two outer spheres of the core/shell CQDs. We examined three representative CB offset values of 0.32 eV, 0.1 eV and 0 eV.

As expected, the general trend is that as the core diameter and the barrier width decrease, the coupling energy $\Delta E$ increases. In addition, as the band offset decreases the coupling energy increases. However, in small core diameters and small barrier widths, the trend is opposite. As the band offset becomes higher the coupling energy increases.

We next examined how the neck size affects the coupling energy. In order to control the neck we are attaching two CQDs at a center to center distance of 7 nm so their surfaces touch. Then we converted half of the spheres in the side which connects the two CQDs, to half ellipsoid so they will overlap each other. We then merge them and hence the neck size is dictated by the long axis of the ellipsoid.

Figure 29A:
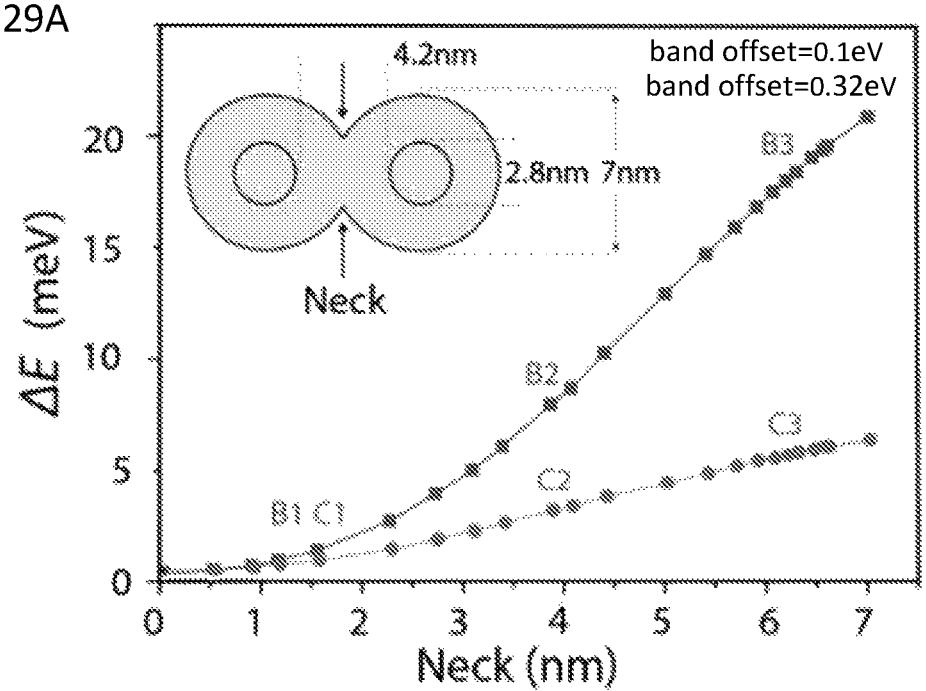
FIGS. 29A-29C demonstrate the neck effect on the coupling of the lowest electron state in CQDMs.
Figure 29B:
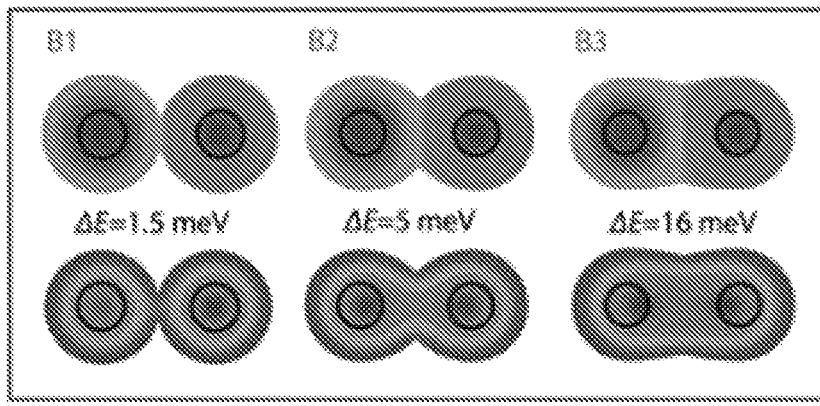
Figure 29C:
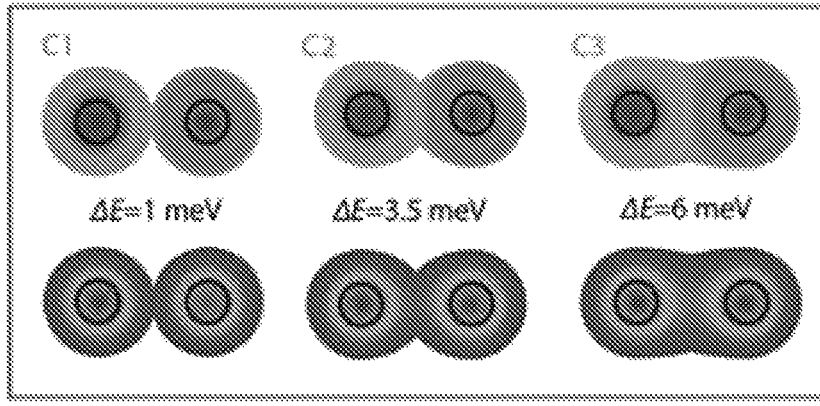

In order to comprehend the different behavior for 0.1 eV compared to 0.32 eV CB band offsets, the wave-function of the symmetric and anti-symmetric states are presented in FIGS. 29B-C. For 0.1 eV with the largest neck, the wave-functions are delocalized all over the shell. Thus, the reduction of the neck size from 7 nm to 4 nm is significantly reducing the coupling energy. Whereas, for 0.32 eV band offset in all neck sizes the wave-function is concentrated around the cores, so the reduction of the neck from 7 nm to 4 nm is not affecting the coupling energy as dramatically as in the case of 0.1 eV band offset. These calculations demonstrate that the neck has a major effect on the coupling energy and filling the neck by suitable fusion reaction conditions can thus change the emission redshift and additional quantum coupling effects significantly.

A general trend of non-monotonic overlap integral values, holds for all cases. For core sizes up to 2.5 nm the overlap integral decreases with size, while for larger core sizes the overlap integral increases with size. For both band offset values the overlap integral is slightly smaller in the case of the dimers compared to the monomers. In addition, for all core diameters the overlap integral is higher in the case of 0.32 eV band offsets compared to 0.1 eV. The same trend holds also for the 0.32 eV band-offset (FIG. 30F). The main difference is that the overlap integral is larger for all core diameters Commensurately, the opposite trend holds for the Coulombic interactions. In small core diameters up to 2.5 nm the Coulombic interactions $C_m$ and $C_d$ are increasing with core diameter size. Above 2.5 nm, the Coulombic interactions decrease with core size. For all core sizes the Coulombic interactions are stronger in the case of monomer compared to dimer. As for the different band offsets, except from core sizes below 1.5 nm, $C_m$ and $C_d$ are stronger in the larger band offset of 0.32 eV both for monomers and dimers. Looking on $\Delta E_f$ and $\Delta E_c$ as a function of the core diameter, one can see that both for 0.32 eV and for 0.1 eV band offsets, $\Delta E_f$ is always larger than $\Delta E_c$ (FIG. 30C). As a consequence, one should expect a redshift but never blue shift upon fusion (FIG. 30D). In small core diameter, $\Delta E_f$ decrease with size because the electron becomes more localized to the core which leads to lesser hybridization. However, beyond 4 nm core diameter, the surfaces of the cores getting closer leading to more coupling and hence to higher fusion energy. These results suggest that one of the signatures of fusion will be the emission redshift.

Figure 31A:
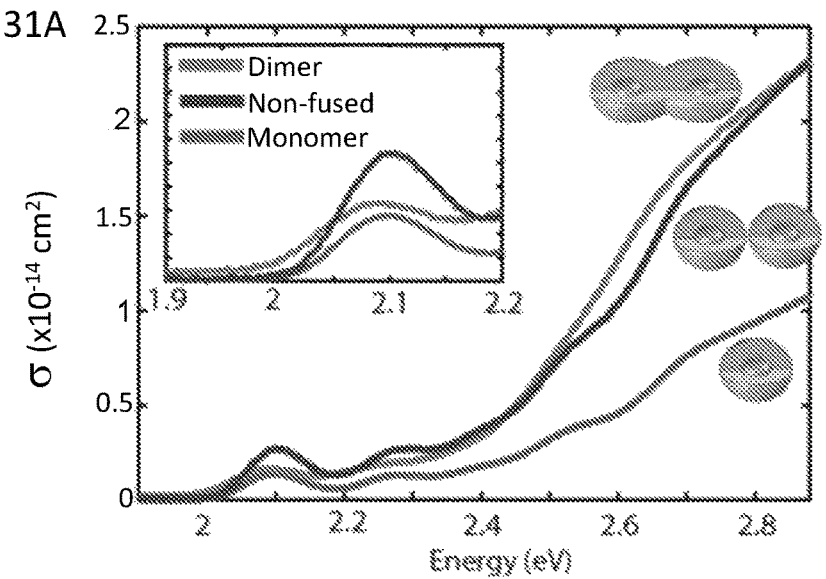
FIGS. 31A-31C depict the absorption spectra of CQD versus CQDMs and comparing theory with experiments (for fused core diameter/shell thickness 2.8/2.1 nm CdSe/CdS.

Another signature for fusion is the absorption cross-section. The absorption cross-section (ACS) σ of both monomers (core diameter/shell thickness 2.8/2.1 nm) and their corresponding fused and non-fused dimers were extracted from the absorption spectrum and ICP measurements. While the ACS of non-fused dimers (green FIG. 31A) imitating the monomers (blue) one but only doubled, the ACS of the fused dimer is changing significantly. The ACS of fused dimers is losing the distinct features of the monomers and while at energies higher than 2.5 eV the ACS, σ, is twice the one of the monomer. At the band edge, the a of the dimer is in the height of the monomer but more smeared into lower energies (red in FIG. 31A). Integration on a of the band edge transition gives 80% of the one of the non-fused dimer.

Figure 31B:
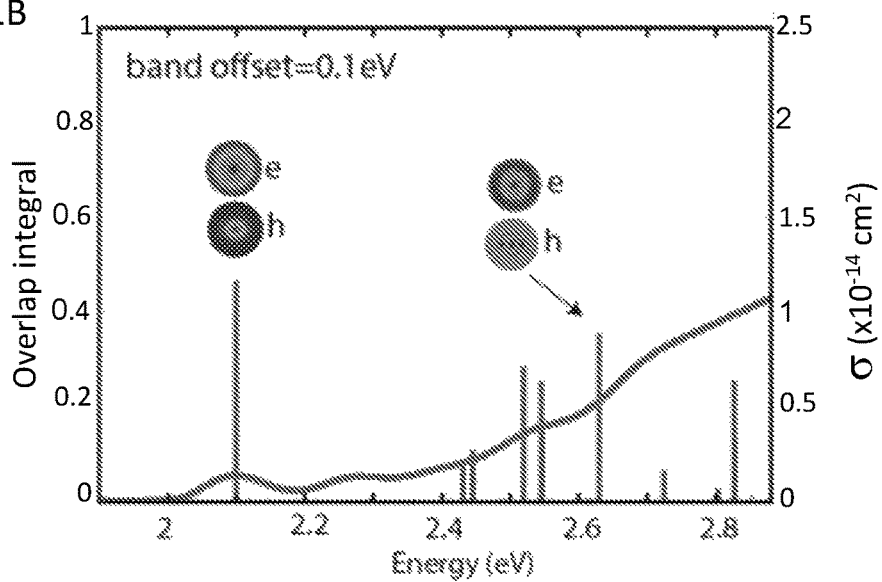
Figure 31C:
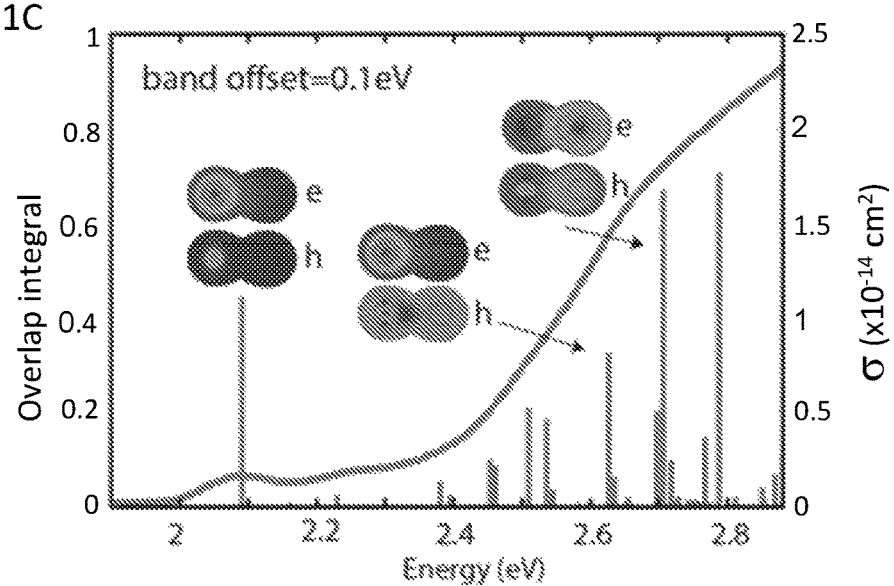

We have calculated the overlap integrals between the electron and hole states. One can see that at higher energies the density of states for the dimer is much higher, and considering the larger density of transitions that are partially allowed for dimers, one can understand the vanishing features in the absorption spectrum (FIGS. 31B-C). At the band edge, the overlap integral of the dimer is slightly lower than the monomer but one should take into account the possibility for the photon to be absorbed in both cores.

Applications:

The unique structure of two fused core-shell nanocrystals opens the way for band structure engineering leading to multiple applications of the coupled nanocrystals structures.

Example 1: Dual Color Emitting Nanocrystals

Heterodimer NC molecules with dual emission: Heterodimers, composed of two types of core/shell NCs with different core sizes (FIG. 32) offer a dual emission system. CdSe/CdS coupled core/shells with cores of different sizes provide an unlimiting example. Since the electron barrier is small, the electron delocalizes. Dual red-green emission related to branching of the relaxation between the hole states in either coupled NC is generated upon excitation above the gap of the smaller dot, which is anti-bunched (termed "green excitation") (FIG. 32A). These structures can be used as a dual-color single photon source. Emission of two colors simultaneously is forbidden since the charge carriers will undergo Auger process (FIG. 32B). Upon sufficiently short excitation (termed red excitation), only the larger dot of the dimer is excited and only red emission emerges. Tuning the excitation intensity offers a viable mechanism for switching of emission. Strong red excitation can be used to bring the small NC into the multi-exciton regime. This will attenuate the red emission on account of enhanced Auger relaxation rate. Using green excitation can then provide only green emission. This scheme is applicable for use of these particles in a super-resolution microscopy as a marker for the STED (stimulated emission depletion) technique. The scheme utilizes intense green excitation in bagel shaped mode, and intense to suppress all emission from the outer region. Both green and red emission to be suppressed by the multiexciton occupation (FIG. 32C). And a TM00 spot of red excitation at its center to excite and yield exclusively well-defined super resolved small red emission spot. The obvious virtues of QDs as bio-taggants are well expressed in this case offering highly stable chromophores.

Example 2: Electric Field Controlled Fluorescence

A coupled nanocrystal molecule with dual color emission controlled by electric field is a unique application demonstrated by these particles. Dual-color emitting nanocrystals sensitive to applied electric field can be engineered by carefully choosing the materials of the cores and the shells of the two nanocrystals. As an un-limiting example, FIG. 33A presents a schematic of two fused core-shell nanocrystals with type I band alignment. An unlimiting example is offered by coupling two CdSe/CdS core/shell nanocrystals with suitably tuned core and shell sizes. Under no applied electric field this particle is expected to emit photons at the individual core/shell band-gap energy. However, upon applying electric field which bends the potential energy, the most likely transition is the indirect transition from one of the cores to the other. This transition is red-shifted compared to the transition under no electric field.

FIG. 33B presents a different scenario of a system with two type II interfaces with two different materials in the cores. An un-limiting example is offered by CdTe/CdS coupled to ZnSe/CdS core/shells. Under no electric field two color emission emerges from the two type II transitions between the conduction band of the shell material to the top valence band states of the different cores. Under electric field the bending of the potential selects only one of the type II transitions, the one in which there is better overlap between the electron and the hole.

These structures can serve in multiple applications where electric field controlled emission can be of relevance: First, as an emitter in light emitting diode (LED) devices or liquid crystal display (LCD) screens where an electric field applied by a voltage can tune the color which is emitted from the device. Second, as a multi-color single photon emitter benefitting from both the single photon purity and the multi-color of these nanocrystals, that can be controlled by the electric field. Furthermore, these nanostructures can serve as electric field sensors which change their color when exposed to electric field. These include their integration as bio-labels in Neuroscience for example.

Example 3: Quantum Information and Computation

Another field in which coupled colloidal core-shell semiconductor QDs can play a major role is quantum information processing. Prerequisites for quantum computing are a scalable physical system of qubits, the ability to initialize the state of the qubits, decoherence time much longer than the gate-operation time, a universal set of quantum gates and a specific qubit measurement capability.

Example 3A: Entangled States in Coupled NC Homodimers

In case of CdSe/CdS coupled homodimers with small core of 1.3 nm radius as unlimiting example, and a CdS shell of 1.3 nm thickness, strong hybridization of the coupled dots levels is taking place yielding bonding-antibonding combinations for the lowest lying electron state and similarly for the top hole states (although both barrier height and effective mass for the hole in this system are significantly larger compared to the electron). This offers an entangled levels scheme for a Qubit.

In this scheme, the qubit $|0>$ and $|1>$ represents the location of the charge carrier (electron or hole) either in core 1 or core 2. The coherent evolution of the location of the charge carrier is electric field dependent. When the electric field is turned off, the quantum mechanical tunneling leads to the superposition of two QD states. The quantum gate is built when two different particles, an electron and a hole, are created optically. Under electric field, the particles are localized on opposite dots. After switching off the electric field, the interaction between the two particles should lead to the formation of entangled states. The states can be disentangled at a later time by preventing the tunneling by an electric field.

Example 3B: Coupled NC Heterodimers for Quantum CNOT Gate

Figure 34:
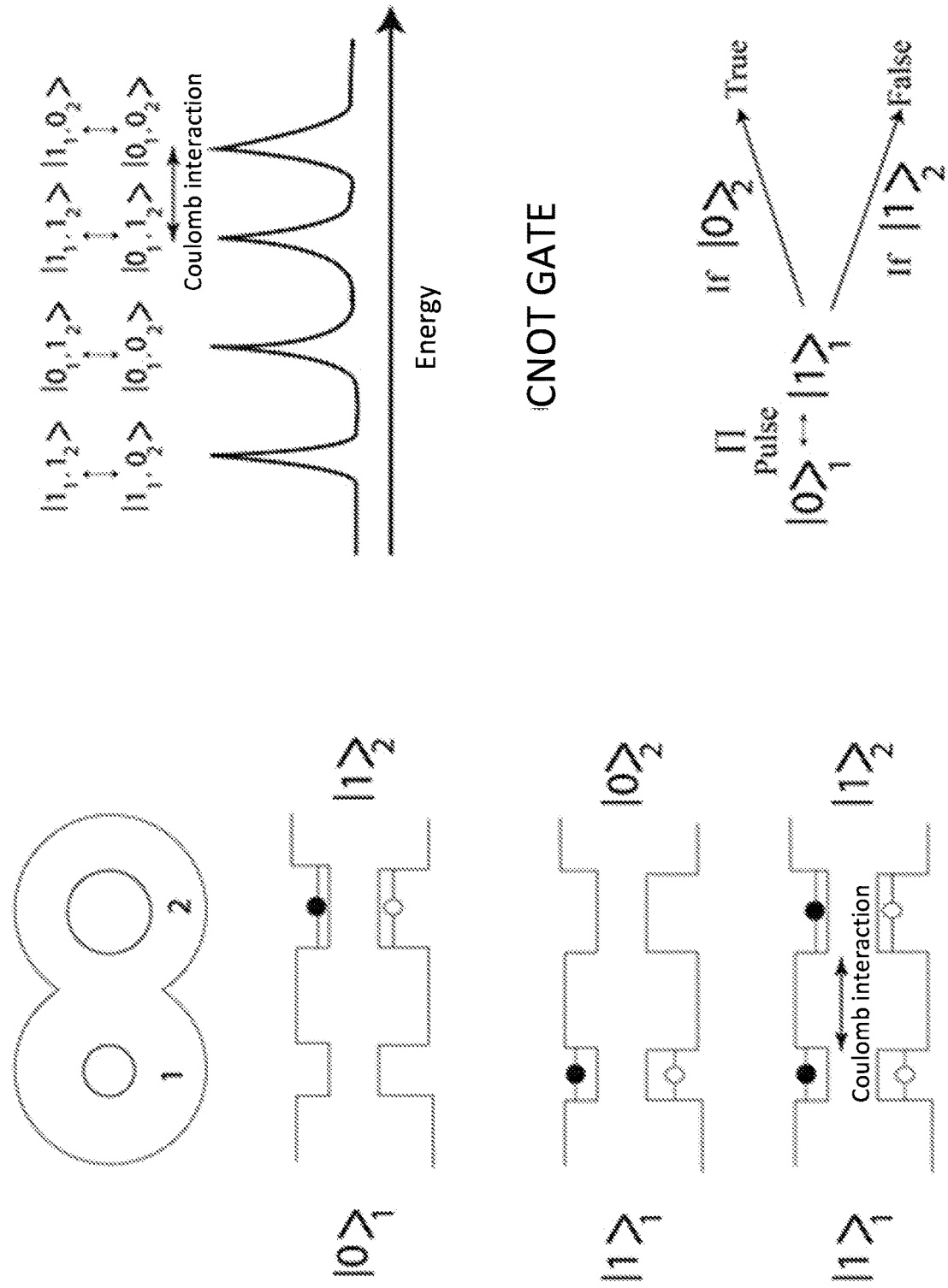
FIG. 34 presents QD molecule as a CNOT quantum gate. This structure is using an electron—hole pair localized in a QD as elementary excitation representing logical binary: existence (nonexistence) of exciton in the QD corresponds to logical one (zero). The qubit can be manipulated by resonant coherent electromagnetic radiation to pursue quantum manipulation. QD molecule hosting an exciton in each of the dots will manifest different energy levels because of the Coulomb interaction between the excitons. This can be used to facilitate CNOT quantum gate, where 7E pulse with energy matching to the energy of only one exciton in the QD molecule will change the state from 10> to 11> while no operation will be executed if the QD molecule is hosting an exciton in each of the dots.

In the case of coupled colloidal core-shell semiconductor QDs (CdSe/CdS core/shells as unlimiting example) with different core sizes the existence and nonexistence of electron—hole pair localized in each one of the cores serve as a qubit ($|1_1>$ represent existence of exciton and $|0_1>$ represent nonexistence of exciton in core 1) as illustrated in FIG. 34. Each of the qubits can be driven by coherent electromagnetic radiation with different wavelengths to address each one of the cores, allowing many operations within the exciton lifetime. In the absence of the radiation, the QD system is in the ground state since the typical energy gap is much larger than the thermal energy. This allows initializing the state of the qubits. The scale-up of the number of quantum bits can be achieved by making a chain of coupled colloidal core-shell semiconductor QDs. The readout of this system is by detecting the spontaneous emission which gives us information on the population of the qubits. The read-out may also be done before the spontaneous decays by probe pulses.

The implementation of any universal quantum computations is known to be decomposed into a series of one-bit rotation gates and two-bit control not (CNOT) gates. The rotation gate essentially results in the qubit population flopping corresponding to the $\pi$-pulse according to Rabi oscillation induced by external gate radiation. The CNOT gate rotates one qubit (target bit) only when the other bit (control bit) is in the state $|0>$. QD molecule hosting an exciton in each of the dots will manifest different energy levels because of the Coulomb interaction between the excitons. This can be used to facilitate CNOT quantum gate, where $\pi$ pulse with energy matching to the energy of only one exciton in the QD molecule will change the state from $|0>$ to $|1>$ while no operation will be executed if the QD molecule is hosting an exciton in each of the dots.

Figure 35:
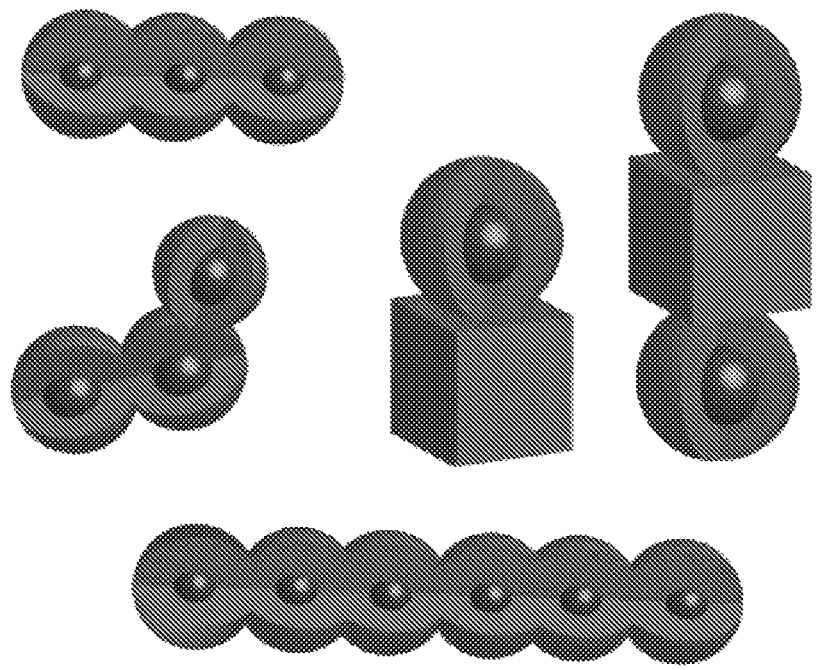
FIG. 35 provides different types of coupled trimer or other coupled chain nanostructures.
Figure 36:
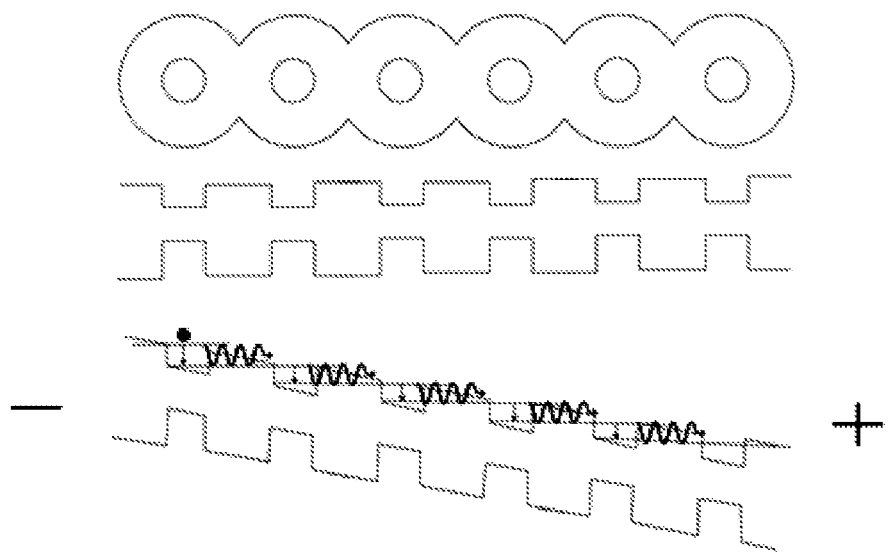
FIG. 36 demonstrates the QD molecule as a building block for superlattices of QDs. These superlattices can be used to create Quantum Cascade Lasers, in which under electric field one electron in the conduction band can undergo intra-band transitions emitting IR photons then tunnel to the next dot and to repeat this process several times. In this way, several IR photons are emitted from one single electron.

Example 4: Beyond Dimers—Colloidal Quantum Cascade Laser Effect in Coupled NC Chain The extension of the system to more than two coupled colloidal core-shell semiconductor QDs to a chain of QDs separated by a barrier or to any other structure presented in FIGS. 35-36 opens the way to a band structure engineering of a super-lattice. This kind of engineered super-lattice can serve as quantum cascade laser (QCL). In this structure an excited electron under electric field can tunnel from core to core and to decay within the conduction band while emitting an IR photon in a cascade process. The band structure of QCLs should be carefully designed to allow the tunneling between the cores. The colloidal rich chemistry allows the synthesis of different materials and to carefully tune the sizes of the building blocks of the super-lattice.

Photocatalytic Applications

The capacity to couple two or more nanocrystals, can open the path for the production of new heterostructures, with intrinsic charge separation, which will allow better charge transfer to electrodes or for molecular species in solution. These coupled nanocrystals could be used as photocatalysts for wide range of applications in various forms (e.g. dispersed in solution, bound to a substrate or an electrode or embedded in a matrix). Non limiting examples, are the couples being used as photocatalysts for solar to fuel conversion (e.g. hydrogen generation, water splitting, and $CO_2$ reduction), applications based on reactive species formation (e.g. components in sensors and biochemical kits, agents for phototherapy and antifouling activity, water purification and waste consumption), redox transformation of organic species, and as photoinitiators for adhesives, photocuring of surface, 2D & 3D printing.

Methods:

CdSe core growth: Briefly, 60 mg CdO, 280 mg octadecylphosphonic acid (ODPA) and 3 g trioctylphosphine oxide (TOPO) were added to a 50 mL flask. The mixture was heated to 150° C. and degassed under vacuum for 1 hour. Under argon flow, the reaction mixture was heated to 320° C. to form a colorless clear solution. After adding 1.0 mL trioctylphosphine (TOP) to the solution, the temperature was brought up to 350° C., at which point Se/TOP (60 mg Se in 0.5 mL TOP) solution was swiftly injected into the flask. The reaction was kept for 60 s then finished by removing the heat. The resulting CdSe particles were precipitated by adding acetone and dispersed in 3 mL hexane as a stock solution.

CdSe—CdS core-shell NPs synthesis: For the shell growth reaction, a hexane solution containing 200 nmol of CdSe QDs was loaded in a mixture of 1-octadecene (ODE, 6 mL) and oleylamine (OAm, 6 mL). The reaction solution was degassed under vacuum at room temperature for 30 min and 90° C. for 30 min to completely remove the hexane, water, and oxygen inside the reaction solution. After that the reaction solution was heated up to 310° C. under argon flow and magnetic stirring. During the heating, when the temperature reached 240° C., a desired amount of cadmium (II) oleate (Cd-oleate, diluted in 6 mL ODE) and octanethiol (1.2 equivalent amounts refer to Cd-oleate, diluted in 6 mL ODE) began to be injected dropwise into the growth solution at a rate of 3 mL/h using a syringe pump. After finishing precursor infusion, 2 mL oleic acid was quickly injected and the solution was further annealed at 310° C. for 30 min. The resulting CdSe/CdS core/shell QDs were precipitated by adding ethanol, and then redispersed in hexane. The particles were further purified by precipitation-redispersion for two more rounds and finally suspended in ~2 ml hexane.

The synthesis of Silica NPs: In briefly, 120 µL (3-mercaptopropyl)trimethoxysilane (MPTMS) precursor was mixed with 30 mL ammonia aqueous solution (1%) under strong stirring. After stirring for 1 min, the solution was store for overnight. The $SiO_2$ NPs were collected by centrifugation and dispersed in ethanol.

The synthesis of $SiO_2$@CdSe—CdS NPs: In brief, $SiO_2$ NPs (0.0079 nmol) dispersed in 1 mL of hexane and mixed with 0.5 nmol CdSe—CdS NPs under vortex for 20 min then 5 mL of ethanol was added in the vails to precipitate and wash for 3 times to remove the unattached NPs. Finally, the $SiO_2$@CdSe—CdS NPs were dispersed in 5 mL of ethanol.

The synthesis of $SiO_2$@ CdSe—CdS@ $SiO_2$ NPs: The fabrication of the second $SiO_2$ layer was necessary and decisive for the dimer structure. In brief, the $SiO_2$@CdSe—CdS was dispersed in 5 mL of ethanol. Then 330 µL of ammonia solvent (28.5% wt %) was added in the system with stirring for 5 min. Thereafter, 50 µL of TEOS was dropwise in the system. After stirring for 10 h, the resulting solvent was centrifuged with 6000 rpm for 5 min and dispersed in 5 mL of THF.

The synthesis of $SiO_2$@Dimer-CdSe—CdS NCs: Before the synthesis of $SiO_2$@Dimer-CdSe—CdS NCs, the tetrathiol linker pentaerythritol-tetrakis (3-mercapto-propionate) (200 µL) was used for the ligands exchange progress to remove OAm and OA of the hemisphere and promote the conjunction with the second CdSe—CdS NCs. Then 0.6 nmol of CdSe—CdS NCs were added in the vials with oil bath at 60° C. for overnight. Finally, the samples were cleaned by centrifugation with 6000 rpm for 5 min and dispersed in vials with 10 mL of THF for storage.

The release of Dimer-CdSe—CdS NCs: Briefly, 1 mL of $SiO_2$@Dimer-CdSe—CdS NCs was taken out of the vials and centrifugation with 5000 rpm for 5 min. Then 2 mL of mixed solvent of HF/NMF (10%) was added in the plastic bottle with stirring for 10 h. After the etching procedure, the color of the samples changed to light yellow, which reveals the remove of the $SiO_2$. Thereafter, the samples were precipitated by centrifugation with 6000 rpm for 10 min and washed for 2 times. Finally, the samples were dispersed in 2 mL of ethanol.

The synthesis of fused Dimer-CdSe—CdS NCs: In brief, Dimer-CdSe—CdS NCs (in 2 mL of ethanol) mixed with 2 mL of ODE, 50 µL of $Cd(OA)_2$ (0.2 M), and 100 µL of OAm. The reaction solution was degassed under vacuum at room temperature for 30 min and 90° C. for 30 min. Then, the reaction mixture was heated to 180° C. for 20 h under argon flow. The resulting fused particles were precipitated by adding ethanol and dispersed in 2 mL toluene as a stock solution.

Characterization:

Absorption spectra were measured using a Jasco V-570 UV-Vis-NIR spectrophotometer. Fluorescence spectra and ensemble lifetimes were measured with a fluorescence spectrophotometer (Edinburgh instruments, FL920). Transmission electron microscopy (TEM) was performed using a Tecnai $G^2$ Spirit Twin T12 microscope (Thermo Fisher Scientific) operated at 120 kV. High-resolution TEM (HR-TEM) measurements were done using a Tecnai F20 $G^2$ microscope (Thermo Fisher Scientific) with an accelerating voltage of 200 kV. High-resolution STEM imaging and elemental mapping was done with Themis Z aberration-corrected STEM (Thermo Fisher Scientific) operated at 300 kV and equipped with HAADF detector for STEM and Super-X EDS detector for high collection efficiency elemental analysis. CQDs atomic structure model were built by the VESTA software. Scanning electron microscopy imaging (SEM) was done with HR SEM Sirion (Thermo Fisher Scientific) operated at 5 kV.

The invention claimed is:

1. A fused nanocrystal molecule comprising two or more semiconductor core/shell structures, the fused nanocrystal molecule comprising two or more core structures and a continuous outermost shell extending the circumference of the two or more core structures, the outermost shell comprising a material identical to a shell material of any of said two or more semiconductor core/shell structures or an alloy material of the shell materials of the two or more semiconductor core/shell structures, wherein each two core/shell structures of the two or more fused semiconductor core/shell structures having a fusion region of a thickness between 0.1 and 5 nm.

2. The fused nanocrystal molecule according to claim 1, consisting of a plurality of semiconductor core/shell structures.

3. The fused nanocrystal molecule according to claim 1, wherein each two fused core/shell structures having a fusion region therebetween, wherein the size, structure, and shape of said fusion region is selected to provide control of at least one electronic property of the fused nanocrystal molecules, the property being carrier wavefunctions, carrier separations, emission characteristics, absorption characteristics or catalytic activity.

4. The fused nanocrystal molecule according to claim 1, wherein the fused nanocrystal molecule comprises a plurality of identical or different core/shell structures.

5. The fused nanocrystal molecule according to claim 1, further comprising one or more quantum dots (QD).

6. The fused nanocrystal molecule according to claim 1, having a fusion region thickness between 0.1 and 0.6 nm.

7. The fused nanocrystal molecule according to claim 1, wherein the core/shell structure is a core/multishell structure.

8. The fused nanocrystal molecule according to claim 1, wherein at least two semiconductor core/shell structures are fused to each other and to at least one other nanocrystal.

9. The fused nanocrystal molecule according to claim 1, wherein each of the core/shell structures having a shape selected from spherical and polygonal structures.

10. The fused nanocrystal molecule according to claim 1, being a semiconductor heterostructure with a type I, reverse type I, quasi-type II or type II band-alignment between a core and a fusion region semiconductor materials or between the two core semiconductor materials.

11. The fused nanocrystal molecule according to claim 1, wherein the semiconductor material of the core and/or shell is selected from elements of Group I-VII, Group II-VI, Group III-V, Group IV-VI, Group III-VI, Group I-VI, Group V-VI, Group II-V, Group I-III-$VI_2$, Group IV, ternary or quaternary semiconductors and alloys or combinations thereof.

12. The fused nanocrystal molecule according to claim 1, being a molecule selected amongst those listed in the table below:

| Nano-assembly | Nano-crystal 1 | Nano-crystal 2 | Nano-crystal 3 | Nano-crystal 4 | Material of the Fusion Region |
|---|---|---|---|---|---|
| 1 | CdSe/CdS | CdSe/CdS | — | — | CdS |
| 2 | CdSe/CdS | CdSe/CdS/ZnS | — | — | ZnS-CdS or CdS-ZnS-CdS |
| 3 | CdSe/CdS/ZnS | CdSe/CdS/ZnS | — | — | ZnS or CdS-ZnS-CdS |
| 4 | CdSe/CdS | InP/ZnS | — | — | ZnS-CdS |
| 5 | InP/ZnS | InP/ZnS | — | — | ZnS |
| 6 | CdTe/CdS | ZnSe/CdS | — | — | CdS |
| 7 | InP/ZnS | CdSe/CdS/ZnS | — | — | ZnS or ZnS-CdS |
| 8 | ZnSe/ZnS | ZnSe/ZnS | — | — | ZnS |
| 9 | InAs/CdSe/ZnSe | InAs/CdSe/ZnSe | — | — | ZnSe or CdSe-ZnSe-CdSe |
| 10 | InAs/InP/ZnS | InAs/InP/ZnS | — | — | ZnS or InP-ZnS-InP |
| 11 | InAs/CdSe/CdS | InAs/CdSe/CdS | — | — | CdS or CdSe-CdS-CdSe |
| 12 | CdSe/CdS/HgS | CdSe/CdS/HgS | — | — | HgS or CdS-HgS-CdS |
| 13 | InAs/GaAs | InAs/GaAs | — | — | GaAs |
| 14 | GaP/ZnS | ZnO/ZnS | — | — | ZnS |
| 15 | ZnO/ZnS | ZnSe/ZnS | — | — | ZnS |
| 16 | ZnSe/ZnS | ZnO/ZnS | — | — | ZnS |
| 17 | InGaP/ZnS | InGaP/ZnS | — | — | ZnS |
| 18 | InGaP/ZnSe | InGaP/ZnSe | — | — | ZnSe |
| 19 | InP/ZnSe | InP/ZnSe | — | — | ZnSe |
| 20 | InAs/ZnSe | InAs/ZnSe | — | — | ZnSe |
| 21 | InAs/ZnS | InAs/ZnS | — | — | ZnS |
| 22 | CdSe/CdS | CdSe/CdS | CdSe/CdS | — | CdS |
| 23 | CdSe/CdS | CdSe/CdS | CdSe/CdS | CdSe/CdS | CdS |
| 24 | CdSe/CdS/ZnS | CdSe/CdS/ZnS | CdSe/CdS/ZnS | — | ZnS or CdS-ZnS-CdS |
| 25 | CdSe/CdS/ZnS | CdSe/CdS/ZnS | CdSe/CdS/ZnS | CdSe/CdS/ZnS | ZnS or CdS-ZnS-CdS |
| 26 | CdTe/CdS | ZnSe/CdS | CdTe/CdS | ZnSe/CdS | CdS (barrier for holes) |
| 27 | CdTe/CdS | CdTe/CdS | CdTe/CdS | CdTe/CdS | CdS (barrier for holes) |
| 28 | ZnSe/CdS | ZnSe/CdS | ZnSe/CdS | ZnSe/CdS | CdS (barrier for holes) |
| 29 | CdTe/CdS | ZnTe/CdS | — | — | CdS (barrier for holes only) |
| 30 | CdTe/CdS | ZnTe/CdS | CdTe/CdS | ZnTe/CdS | CdS (barrier for holes) |
| 31 | ZnSe/CdS | ZnSe/CdS | — | — | CdS (barrier for holes only) |
| 32 | ZnSe/CdS | ZnSe/CdS | ZnSe/CdS | ZnSe/CdS | CdS (barrier for holes) |
| 33 | ZnTe/CdS | ZnTe/CdS | ZnTe/CdS | ZnTe/CdS | CdS (barrier for holes) |
| 34 | ZnSe/ZnTe | ZnSe/ZnTe | — | — | ZnTe (barrier for electrons) |
| 35 | ZnSe/ZnTe | ZnSe/ZnTe | ZnSe/ZnTe | ZnSe/ZnTe | ZnTe (barrier for electrons) |
| 36 | CdTe/ZnTe | CdTe/ZnTe | — | — | ZnTe (barrier for electrons) |
| 37 | CdTe/ZnTe | CdTe/ZnTe | CdTe/ZnTe | CdTe/ZnTe | CdTe (barrier for holes) |
| 38 | ZnSe/ZnS | ZnSe/ZnS | ZnSe/ZnS | ZnSe/ZnS | ZnS |
| 39 | InP/CdS | InP/CdS | — | — | CdS |
| 40 | InP/CdS | InP/ZnS | — | — | CdS-ZnS |
| 41 | InP/CdS | InP/CdS | InP/CdS | — | CdS |
| 42 | InP/CdS | InP/CdS | InP/CdS | InP/CdS | CdS |
| 43 | PbSe/CdS | CdSe/CdS | — | — | CdS |
| 44 | PbSe/CdS | PbSe/CdS | PbSe/CdS | PbSe/CdS | CdS |
| 45 | InAs/CdS | CdSe/CdS | — | — | CdS |
| 46 | InAs/CdS | ZnSe/CdS | — | — | CdS |
| 47 | InAs/CdS | InAs/CdS | InAs/CdS | InAs/CdS | CdS |
| 48 | PbSe/CdS | InAs/CdS | — | — | CdS |
| 49 | InP/ZnS | InP/ZnS | InP/ZnS | — | ZnS |
| 50 | InP/ZnS | InP/ZnS | InP/ZnS | InP/ZnS | ZnS |
| 51 | PbSe/ZnS | CdSe/ZnS | — | — | ZnS |
| 52 | PbSe/ZnS | PbSe/ZnS | PbSe/ZnS | PbSe/ZnS | ZnS |
| 53 | InAs/ZnS | CdSe/ZnS | — | — | ZnS |
| 54 | InAs/ZnS | InAs/ZnS | InAs/ZnS | InAs/ZnS | ZnS |
| 55 | PbSe/ZnS | InAs/ZnS | — | — | ZnS |
| 56 | ZnO/CdS | ZnSe/CdS | — | — | CdS, Type II |
| 57 | ZnO/CdS | CdTe/CdS | — | — | CdS, Type II |
| 58 | ZnO/CdS | ZnTe/CdS | — | — | CdS, Type II |
| 59 | InP/ZnSe | InP/ZnSe | InP/ZnSe | — | ZnSe |
| 60 | InP/ZnSe | InP/ZnSe | InP/ZnSe | InP/ZnSe | ZnSe |
| 61 | ZnSe/ZnS | ZnSe/ZnS | — | — | ZnS |
| 62 | ZnSe/ZnS | ZnSe/ZnS | ZnSe/ZnS | ZnSe/ZnS | ZnS |
| 63 | ZnSe/ZnS | CdSe/ZnS | — | — | ZnS |
| 64 | InAs/CdS | InAs/CdS | — | — | CdS |
| 65 | InAs/CdS | InAs/CdS | InAs/CdS | InAs/CdS | CdS |
| 66 | InAs/CdTe | InAs/CdTe | — | — | CdS |
| 67 | InAs/CdTe | InAs/CdTe | InAs/CdTe | InAs/CdTe | CdTe |
| 68 | GaAs/ZnS | GaAs/ZnS | — | — | ZnS |
| 69 | GaAs/ZnS | GaAs/ZnS | GaAs/ZnS | GaAs/ZnS | ZnS |
| 70 | GaAs/CdS | GaAs/CdS | — | — | CdS |
| 71 | GaAs/CdS | GaAs/CdS | GaAs/CdS | GaAs/CdS | CdS |
| 72 | GaAs/ZnSe | GaAs/ZnSe | — | — | ZnSe |
| 73 | GaAs/ZnSe | GaAs/ZnSe | GaAs/ZnSe | GaAs/ZnSe | ZnSe |

-continued

| Nano-assembly | Nano-crystal 1 | Nano-crystal 2 | Nano-crystal 3 | Nano-crystal 4 | Material of the Fusion Region |
|---|---|---|---|---|---|
| 74 | GaAs/GaP | GaAs/GaP | — | — | GaP |
| 75 | GaAs/GaP | GaAs/GaP | GaAs/GaP | GaAs/GaP | GaP |
| 76 | CdSe/CdS | CdSe | CdSe/CdS | — | CdS |
| 77 | CdSe/ZnS | CdSe | CdSe/ZnS | — | ZnS |
| 78 | ZnSe/ZnS | ZnSe | ZnSe/ZnS | — | ZnS |
| 79 | InP/ZnSe | InP | InP/ZnSe | — | ZnSe |
| 80 | Au/ZnO | ZnS/ZnO | — | — | ZnO |
| 81 | Ag/ZnO | Ag/ZnO | — | — | ZnO |
| 82 | Au/ZnS | ZnSe/ZnS | — | — | ZnS |
| 83 | Ag/ZnS | ZnSe/ZnS | — | — | ZnS |
| 84 | Au/ZnS | Au/ZnS | — | — | ZnS |
| 85 | Ag/ZnO | Ag/ZnO | — | — | ZnO |
| 86 | Au/ZnS | Au/ZnS | Au/ZnS | — | ZnS |
| 87 | Ag/ZnO | Au/ZnO | Ag/ZnO | Au/ZnO | ZnO |
| 88 | Cu/CdS | CdSe/CdS | — | — | CdS |
| 89 | Au/ZnS | InP/ZnS | — | — | ZnS |
| 90 | Cu$_2$ZnSnS$_4$/ZnS | Cu$_2$ZnSnS$_4$/ZnS | — | — | ZnS |
| 91 | ZnS(P-doped)/ZnO | ZnS(N-doped)/ZnO | — | — | ZnO |
| 92 | ZnS(P-doped)/ZnSe | ZnS(N-doped)/ZnSe | — | — | ZnSe |
| 93 | Pd/Ag$_2$S | Pt/Ag$_2$S | — | — | Ag$_2$S |
| 94 | InP(N-doped)/ZnS | InP(P-doped)/ZnS | — | — | ZnS |
| 95 | InAs(N-doped)/ZnSe | InAs(P-doped)/ZnSe | — | — | ZnSe. |

13. The fused nanocrystal molecule according to claim 11, wherein the material is doped.

14. A fused nanocrystal molecule according to claim 1 exhibiting emission from multicarrier configurations beyond excitonic emission.

* * * * *